United States Patent
Saito et al.

(10) Patent No.: US 11,948,626 B2
(45) Date of Patent: Apr. 2, 2024

(54) SEMICONDUCTOR DEVICE COMPRISING TRANSISTORS WITH SILICON AND METAL OXIDE CHANNELS

(71) Applicant: Semiconductor Energy Laboratory Co., Ltd., Atsugi (JP)

(72) Inventors: Seiya Saito, Atsugi (JP); Yuto Yakubo, Atsugi (JP); Tatsuya Onuki, Atsugi (JP); Shuhei Nagatsuka, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 248 days.

(21) Appl. No.: 17/439,876

(22) PCT Filed: Mar. 16, 2020

(86) PCT No.: PCT/IB2020/052357
§ 371 (c)(1),
(2) Date: Sep. 16, 2021

(87) PCT Pub. No.: WO2020/201865
PCT Pub. Date: Oct. 8, 2020

(65) Prior Publication Data
US 2022/0180920 A1     Jun. 9, 2022

(30) Foreign Application Priority Data

Mar. 29, 2019  (JP) ................. 2019-065473
Mar. 29, 2019  (JP) ................. 2019-065475
(Continued)

(51) Int. Cl.
*G11C 11/40*  (2006.01)
*G11C 11/4091*  (2006.01)
(Continued)

(52) U.S. Cl.
CPC ...... *G11C 11/4097* (2013.01); *G11C 11/4091* (2013.01); *H01L 29/7869* (2013.01); *H10B 12/30* (2023.02); *H10B 12/50* (2023.02)

(58) Field of Classification Search
CPC . G11C 11/4097; G11C 11/4091; H10B 12/30; H10B 12/50; H01L 29/7869
See application file for complete search history.

(56) References Cited

U.S. PATENT DOCUMENTS

| | | | |
|---|---|---|---|
| 5,117,113 A | 5/1992 | Thomson et al. |
| 5,300,839 A | 4/1994 | Kawahara et al. |

(Continued)

FOREIGN PATENT DOCUMENTS

| | | |
|---|---|---|
| JP | 05-047179 A | 2/1993 |
| JP | 11-134855 A | 5/1999 |

(Continued)

OTHER PUBLICATIONS

International Search Report (Application No. PCT/IB2020/052357) dated Jun. 30, 2020.

(Continued)

*Primary Examiner* — Tuan T Nguyen
(74) *Attorney, Agent, or Firm* — Eric J. Robinson; Robinson Intellectual Property Law Office, P.C.

(57) ABSTRACT

A novel semiconductor device is provided. The semiconductor device includes a driver circuit including a plurality of transistors using a silicon substrate for channels, and a first transistor layer and a second transistor layer including a plurality of transistors using a metal oxide for channels. The first transistor layer and the second transistor layer are provided over the silicon substrate layer. The first transistor layer includes a first memory cell including a first transistor and a first capacitor. The first transistor is electrically connected to a first local bit line. The second transistor layer (Continued)

includes a second transistor whose gate is electrically connected to the first local bit line and a first correction circuit electrically connected to the second transistor. The first correction circuit is electrically connected to a first global bit line. The first correction circuit has a function of holding a voltage corresponding to a threshold voltage of the second transistor in the gate of the second transistor.

18 Claims, 32 Drawing Sheets

(30) Foreign Application Priority Data

Apr. 9, 2019 (JP) ................................ 2019-073992
May 31, 2019 (JP) ................................ 2019-102753

(51) Int. Cl.
*G11C 11/4097* (2006.01)
*H01L 29/786* (2006.01)
*H10B 12/00* (2023.01)

(56) References Cited

U.S. PATENT DOCUMENTS

| | | | |
|---|---|---|---|
| 5,973,973 | A | 10/1999 | Utsugi |
| 6,088,286 | A | 7/2000 | Yamauchi et al. |
| 6,859,386 | B2 | 2/2005 | Izutsu |
| 8,072,828 | B2 | 12/2011 | Kajigaya |
| 9,514,792 | B2 | 12/2016 | Kajigaya |
| 9,653,611 | B2 | 5/2017 | Atsumi et al. |
| 9,935,143 | B2 | 4/2018 | Ohmaru et al. |
| 10,217,752 | B2 | 2/2019 | Atsumi et al. |
| 10,446,226 | B2 | 10/2019 | Tortorelli et al. |
| 10,593,683 | B2 | 3/2020 | Atsumi et al. |
| 11,074,962 | B2 | 7/2021 | Onuki et al. |
| 11,114,449 | B2 | 9/2021 | Atsumi et al. |
| 11,205,461 | B2 | 12/2021 | Onuki et al. |
| 11,482,280 | B2 | 10/2022 | Tortorelli et al. |
| 11,699,465 | B2 | 7/2023 | Onuki et al. |
| 2012/0063208 | A1 | 3/2012 | Koyama et al. |
| 2013/0070506 | A1 | 3/2013 | Kajigaya |
| 2015/0255139 | A1 | 9/2015 | Atsumi et al. |
| 2017/0302271 | A1* | 10/2017 | Kato .................... H01L 27/1225 |
| 2018/0090498 | A1* | 3/2018 | Onuki .................... G11C 5/025 |
| 2022/0236785 | A1* | 7/2022 | Yamazaki ............. G06F 1/3296 |
| 2022/0359523 | A1* | 11/2022 | Sato .................. H01L 21/02274 |
| 2022/0366974 | A1 | 11/2022 | Tortorelli et al. |
| 2023/0176818 | A1* | 6/2023 | Ito ....................... H01L 27/0688 708/190 |
| 2023/0307012 | A1 | 9/2023 | Onuki et al. |

FOREIGN PATENT DOCUMENTS

| | | |
|---|---|---|
| JP | 2010-055730 A | 3/2010 |
| JP | 2013-065638 A | 4/2013 |
| JP | 2015-041388 A | 3/2015 |
| JP | 2015-181159 A | 10/2015 |
| KR | 1999-0037443 A | 5/1999 |
| KR | 10-0236875 | 1/2000 |
| TW | I244653 | 12/2005 |
| TW | 201805947 | 2/2018 |
| WO | WO-2017/055967 | 4/2017 |
| WO | WO-2018/031217 | 2/2018 |
| WO | WO-2019/003045 | 1/2019 |
| WO | WO-2019/048967 | 3/2019 |

OTHER PUBLICATIONS

Written Opinion (Application No. PCT/IB2020/052357) dated Jun. 30, 2020.

Amano.S et al., "Low Power LC Display Using In-Ga-Zn-Oxide TFTs Based on Variable Frame Frequency", SID Digest '10 : SID International Symposium Digest of Technical Papers, May 23, 2010, vol. 41, No. 1, pp. 626-629.

Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics) , 2012, vol. 51, pp. 021201-1-021201-7.

Yamazaki.S et al., "Properties of crystalline In-Ga-Zn-oxide semiconductor and its transistor characteristics", Jpn. J. Appl. Phys. (Japanese Journal of Applied Physics) , Mar. 31, 2014, vol. 53, No. 4S, pp. 04ED18-1-04ED18-10.

Ishizu.T et al., "Embedded Oxide Semiconductor Memories: A Key Enabler for Low-Power ULSI", ECS Transactions, May 21, 2017, vol. 79, No. 1, pp. 149-156, The Electrochemical Society.

Taiwanese Office Action (Application No. 109108242) dated Sep. 7, 2023.

* cited by examiner

FIG. 15A  FIG. 15B
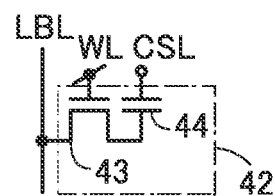
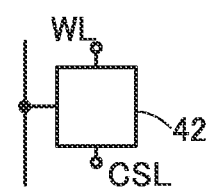
FIG. 15C
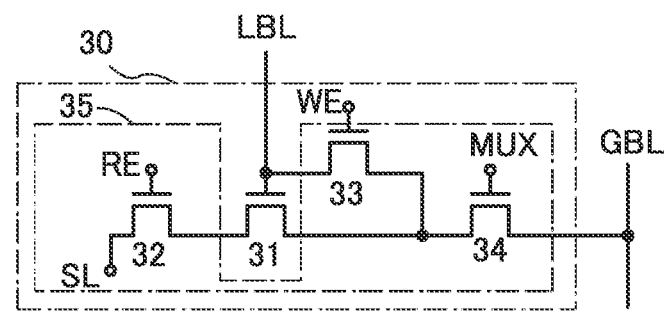
FIG. 15D
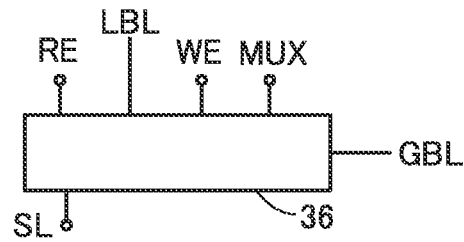

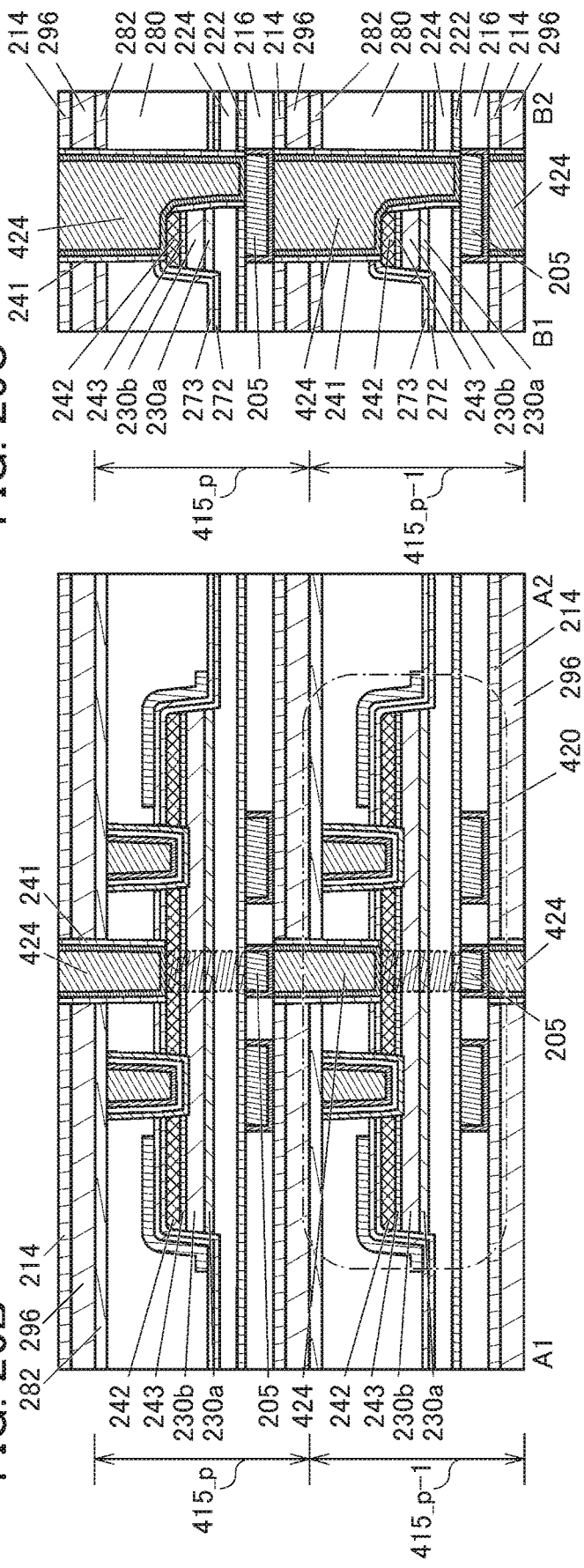

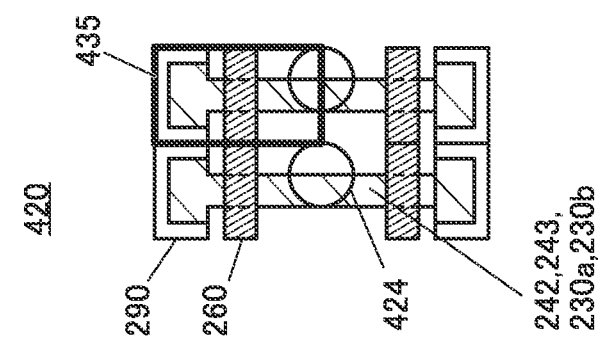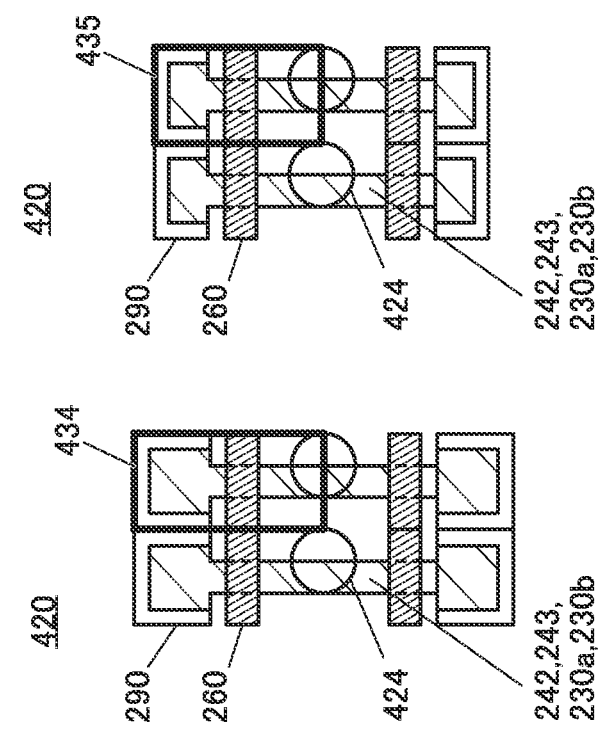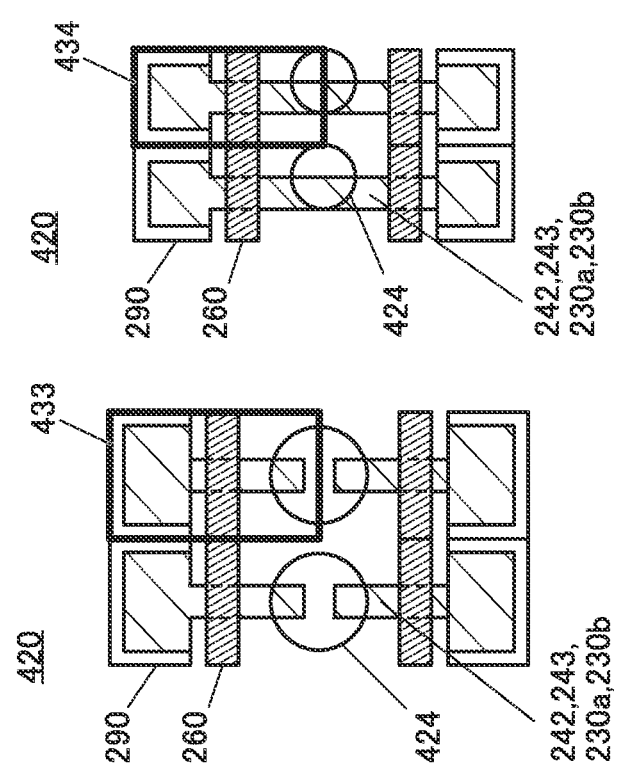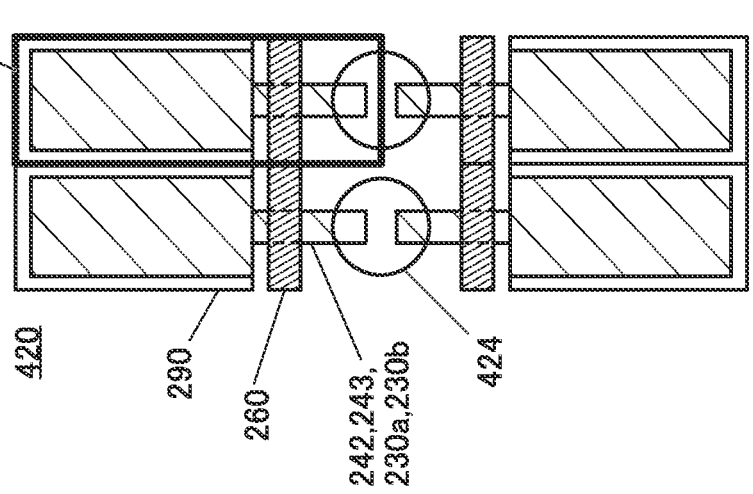

FIG. 28A
| Amorphous | Crystalline | Crystal |
|---|---|---|
| completely amorphous | •CAAC<br>•nc<br>•CAC | •single crystal<br>•poly crystal |
FIG. 28B
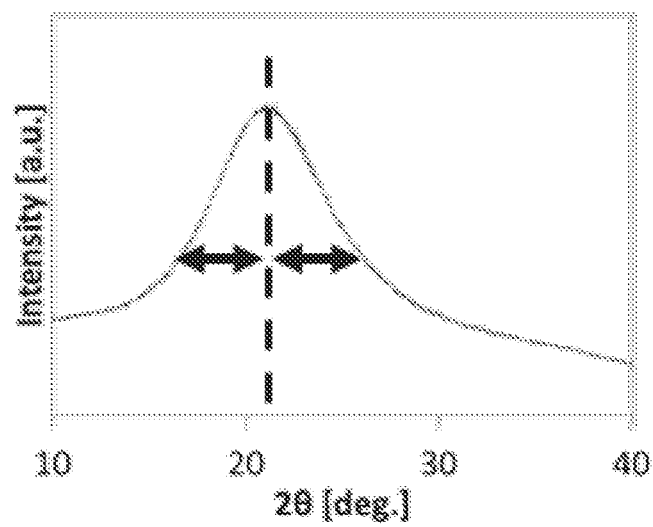
FIG. 28C
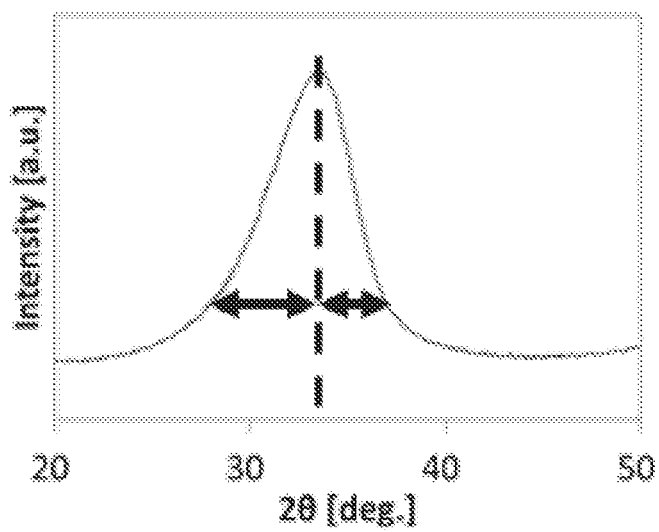

SEMICONDUCTOR DEVICE COMPRISING TRANSISTORS WITH SILICON AND METAL OXIDE CHANNELS

TECHNICAL FIELD

In this specification, a semiconductor device and the like are described.

In this specification, a semiconductor device refers to a device that utilizes semiconductor characteristics, and means a circuit including a semiconductor element (a transistor, a diode, a photodiode, and the like), a device including the circuit, and the like. The semiconductor device also means all devices that can function by utilizing semiconductor characteristics. For example, an integrated circuit, a chip including an integrated circuit, and an electronic component including a chip in a package are examples of the semiconductor device. Moreover, a memory device, a display device, a light-emitting device, a lighting device, an electronic device, and the like themselves might be semiconductor devices, or might include semiconductor devices.

BACKGROUND ART

As a semiconductor that can be used in a transistor, a metal oxide has been attracting attention. An In—Ga—Zn oxide called "IGZO" and the like is a typical multi-component metal oxide. From the researches on IGZO, a CAAC (c-axis aligned crystalline) structure and an nc (nanocrystalline) structure, which are not single crystal nor amorphous, have been found (e.g., Non-Patent Document 1).

It has been reported that a transistor including a metal oxide semiconductor in a channel formation region (hereinafter, such a transistor may be referred to as an "oxide semiconductor transistor" or an "OS transistor") has an extremely low off-state current (e.g., Non-Patent Documents 1 and 2). A variety of semiconductor devices using OS transistors have been manufactured (e.g., Non-Patent Documents 3 and 4).

The manufacturing process of an OS transistor can be incorporated in a CMOS process with a conventional Si transistor, and an OS transistor can be stacked over a Si transistor. For example, Patent Document 1 discloses a structure in which a plurality of memory cell array layers including OS transistors are stacked over a substrate provided with a Si transistor.

REFERENCE

Patent Document

[Patent Document 1] United States Patent Application Publication No. 2012/0063208

Non-Patent Document

[Non-Patent Document 1] S. Yamazaki et al., "Properties of crystalline In—Ga—Zn-oxide semiconductor and its transistor characteristics", Jpn. J. Appl. Phys., vol. 53, 04ED18 (2014). [Non-Patent Document 2] K. Kato et al., "Evaluation of Off-State Current Characteristics of Transistor Using Oxide Semiconductor Material, Indium-Gallium-Zinc Oxide", Jpn. J. Appl. Phys., vol. 51,021201 (2012).
[Non-Patent Document 3] S. Amano et al., "Low Power LC Display Using In—Ga—Zn-Oxide TFTs Based on Variable Frame Frequency", SID Symp. Dig. Papers, vol. 41, pp. 626-629 (2010). [Non-Patent Document 4] T. Ishizu et al., "Embedded Oxide Semiconductor Memories: A Key Enabler for Low-Power ULSI", ECS Tran., vol. 79, pp. 149-156 (2017).

SUMMARY OF THE INVENTION

Problems to be Solved by the Invention

An object of one embodiment of the present invention is to provide a semiconductor device or the like having a novel structure. Another object of one embodiment of the present invention is to provide a semiconductor device or the like functioning as a memory device that utilizes an extremely low off-state current and having a novel structure that allows a reduction of manufacturing costs. Another object of one embodiment of the present invention is to provide a semiconductor device or the like functioning as a memory device that utilizes an extremely low off-state current and having a novel structure that excels in low power consumption. Another object of one embodiment of the present invention is to provide a semiconductor device or the like functioning as a memory device that utilizes an extremely low off-state current and having a novel structure that allows a reduction in the size of the device. Another object of one embodiment of the present invention is to provide a semiconductor device or the like functioning as a memory device that utilizes an extremely low off-state current and having a novel structure that excels in the reliability of data read out.

The description of a plurality of objects does not disturb the existence of each object. One embodiment of the present invention does not necessarily achieve all the objects described as examples. Furthermore, objects other than those listed are apparent from description of this specification, and such objects can be objects of one embodiment of the present invention.

Means for Solving the Problems

One embodiment of the present invention is a semiconductor device including a driver circuit including a plurality of transistors using a silicon substrate for channels and a first transistor layer and a second transistor layer including a plurality of transistors using a metal oxide for channels, where the first transistor layer and the second transistor layer are provided over the silicon substrate, where the first transistor layer includes a first memory cell including a first transistor and a first capacitor, where the first transistor is electrically connected to a first local bit line, where the second transistor layer includes a second transistor whose gate is electrically connected to the first local bit line and a first correction circuit electrically connected to the second transistor, where the first correction circuit is electrically connected to a first global bit line, and where the first correction circuit has a function of holding a voltage corresponding to a threshold voltage of the second transistor in the gate of the second transistor.

One embodiment of the present invention is a semiconductor device including a driver circuit including a plurality of transistors using a silicon substrate for channels and an element layer provided by stacking a plurality of transistor layers, where the element layer includes a first transistor layer and a second transistor layer including a plurality of transistors using a metal oxide for channels, where the first transistor layer and the second transistor layer are provided over the silicon substrate, where the first transistor layer includes a first memory cell including a first transistor and a first capacitor, where the first transistor is electrically connected to a first local bit line, where the second transistor layer includes a second transistor whose gate is electrically connected to the first local bit line and a first correction circuit electrically connected to the second transistor, where the first correction circuit is electrically connected to a first global bit line, and where the first correction circuit has a function of holding a voltage corresponding to a threshold voltage of the second transistor in the gate of the second transistor.

In one embodiment of the present invention, the semiconductor device is preferable in which the first local bit line is provided in the direction perpendicular to a surface of the silicon substrate or the direction substantially perpendicular to the surface of the silicon substrate.

In one embodiment of the present invention, the semiconductor device is preferable in which the first global bit line has a function of electrically connecting the first correction circuit and the driver circuit.

In one embodiment of the present invention, the semiconductor device is preferable in which the first global bit line is provided in the direction perpendicular to the surface of the silicon substrate or the direction substantially perpendicular to the surface of the silicon substrate.

In one embodiment of the present invention, the semiconductor device is preferable in which the metal oxide contains In, Ga, and Zn.

In one embodiment of the present invention, it is preferable for the semiconductor device that the first correction circuit includes a third transistor to a fifth transistor, that the third transistor has a function of controlling a conduction state between the gate of the second transistor and one of a source and a drain of the second transistor, that the fourth transistor has a function of controlling a conduction state between the other of the source and the drain of the second transistor and a wiring supplied with a potential for making a current flow in the second transistor, and that the fifth transistor has a function of controlling a conduction state between the one of the source and the drain of the second transistor and the first global bit line.

In one embodiment of the present invention, it is preferable for the semiconductor device that the first transistor is set into a non-conduction state during a period in which correction operation is performed.

In one embodiment of the present invention, it is preferable the semiconductor device to include a second memory cell, a second local bit line, a second correction circuit, a second global bit line, a fifth transistor, a sixth transistor, and a seventh transistor, and is preferable that the driver circuit includes a sense amplifier electrically connected to a first bit line and a second bit line functioning as a bit line pair, that the second memory cell is electrically connected to the second local bit line, that the second local bit line is electrically connected to the second correction circuit, that the second correction circuit is electrically connected to the second global bit line, that the fifth transistor has a function of controlling a conduction state between the first bit line and the first global bit line, that the sixth transistor has a function of controlling a conduction state between the second bit line and the second global bit line, and that the seventh transistor has a function of controlling a conduction state between the first global bit line and the second global bit line.

In one embodiment of the present invention, it is preferable for the semiconductor device that the fifth transistor to the seventh transistor are each a transistor using a metal oxide in a channel.

Note that other embodiments of the present invention will be shown in the description of the following embodiments and the drawings.

Effect of the Invention

With one embodiment of the present invention, a semiconductor device or the like having a novel structure can be provided. With another embodiment of the present invention, a semiconductor device or the like functioning as a memory device that utilizes an extremely low off-state current and having a novel structure that allows a reduction of manufacturing costs can be provided. With another embodiment of the present invention, a semiconductor device or the like functioning as a memory device that utilizes an extremely low off-state current and having a novel structure that excels in low power consumption can be provided. With another embodiment of the present invention, a semiconductor device or the like functioning as a memory device that utilizes an extremely low off-state current and having a novel structure that allows a reduction in the size of the device can be provided. With another embodiment of the present invention, a semiconductor device or the like functioning as a memory device that utilizes an extremely low off-state current and having a novel structure that excels in the reliability of data read out can be provided.

The description of a plurality of effects does not disturb the existence of other effects. One embodiment of the present invention does not necessarily achieve all the effects described as examples. In one embodiment of the present invention, other objects, effects, and novel features will be apparent from the description of the specification and the drawings.

BRIEF DESCRIPTION OF THE DRAWINGS

FIG. 15A, FIG. 15B, FIG. 15C, and FIG. 15D are circuit diagrams illustrating structure examples of a semiconductor device.

FIG. 26A, FIG. 26B, and FIG. 26C are a top view and schematic cross-sectional views illustrating a structure example of a semiconductor device.

FIG. 27A, FIG. 27B, and FIG. 27C, and FIG. 27D are top views each illustrating a structure example of a semiconductor device.

FIG. 28A, FIG. 28B, and FIG. 28C are a drawing describing classification of IGZO crystal structures, a drawing describing an XRD spectrum of quartz glass, and a drawing describing an XRD spectrum of crystalline IGZO.

MODE FOR CARRYING OUT THE INVENTION

Figure 1:
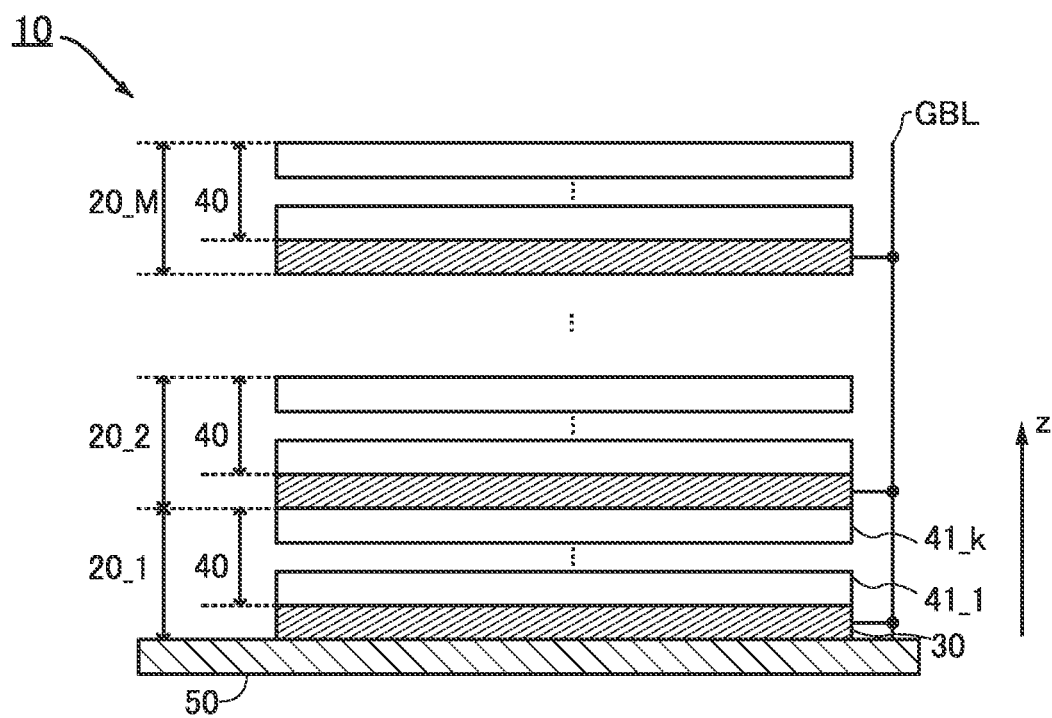
FIG. 1 is a block diagram illustrating a structure example of a semiconductor device.

Embodiments of the present invention will be described below. Note that one embodiment of the present invention is not limited to the following description, and it will be readily appreciated by those skilled in the art that modes and details of the present invention can be modified in various ways without departing from the spirit and scope of the present invention. One embodiment of the present invention therefore should not be construed as being limited to the following description of the embodiments.

Note that ordinal numbers such as "first", "second", and "third" in this specification and the like are used in order to avoid confusion among components. Thus, the terms do not limit the number of components. In addition, the terms do not limit the order of components. Furthermore, in this specification and the like, for example, a "first" component in one embodiment can be referred to as a "second" component in other embodiments or claims. Furthermore, in this specification and the like, for example, a "first" component in one embodiment can be omitted in other embodiments or claims.

The same components, components having similar functions, components made of the same material, components formed at the same time, and the like in the drawings are denoted by the same reference numerals, and repetitive description thereof is skipped in some cases.

In this specification, a power supply potential VDD may be abbreviated to a potential VDD, VDD, or the like, for example. The same applies to other components (e.g., a signal, a voltage, a circuit, an element, an electrode, a wiring, and the like).

Moreover, when a plurality of components are denoted by the same reference numerals, and, in particular, need to be distinguished from each other, an identification sign such as "_1", "_2", "[n]", or "[m,n]" is sometimes added to the reference numerals. For example, the second wiring GL is referred to as a wiring GL[2].

Embodiment 1

Structure examples of a semiconductor device of one embodiment of the present invention will be described with reference to FIG. 1 to FIG. 18.

Note that a semiconductor device refers to a device that utilizes semiconductor characteristics, and means a circuit including a semiconductor element (a transistor, a diode, a photodiode, and the like) and a device including the circuit. The semiconductor device described in this embodiment can function as a memory device that utilizes a transistor with an extremely low off-state current.

FIG. 1 shows a block diagram for describing a schematic of a semiconductor device 10.

The semiconductor device 10 includes a plurality of element layers 20_1 to 20_M (M is a natural number) over a silicon substrate 50. The element layers 20_1 to 20_M each include a transistor layer 30 and a transistor layer 40. The transistor layer 40 includes a plurality of transistor layers 41_1 to 41_k (k is a natural number greater than or equal to 2).

To describe the arrangement of the components, the z-axis direction is defined in the schematic diagram shown in FIG. 1. The z-axis direction refers to a direction perpendicular to a plane of the silicon substrate 50 or a direction substantially perpendicular to the plane of the silicon substrate 50. Note that "substantially perpendicular" refers to a state where an arrangement angle is greater than or equal to 85° and less than or equal to 95°. Note that for easy understanding, the z-axis direction is sometimes referred to as the perpendicular direction. The plane of the silicon substrate 50 corresponds to a plane formed by an x-axis and a y-axis that are defined as the direction perpendicular to the z-axis direction or the direction substantially perpendicular to the z-axis direction. For easy understanding, the x-axis direction and the y-axis direction are sometimes referred to as the depth direction and the horizontal direction, respectively.

The transistor layer 40 including the plurality of transistor layers 41_1 to 41_k includes a plurality of memory cells (not illustrated) in each transistor layer. The memory cells each include a transistor and a capacitor. Note that the capacitor is sometimes referred to as a capacitive element. The element layer refers to a layer in which elements such as a capacitor and a transistor are provided and is a layer including members such as a conductor, a semiconductor, an insulator, and the like.

The memory cells included in the transistor layers 41_1 to 41_k can each be referred to as a DOSRAM (Dynamic Oxide Semiconductor Random Access Memory) using a transistor including an oxide semiconductor in a channel formation region (hereinafter, referred to as an OS transistor) for a memory. The memory cell can be formed using one transistor and one capacitor, so that a high-density memory can be achieved. With use of an OS transistor, a data retention period can be extended.

In the structure of one embodiment of the present invention, use of a memory cell including an OS transistor enables charge corresponding to a desired voltage to be retained in the capacitor located at the other of a source and a drain by utilizing characteristics of an extremely low leakage current flowing between the source and the drain in an off state (hereinafter, an off-state current). In other words, data written once can be retained for a long time in the memory cell. This can reduce the data refresh rate, leading to low power consumption.

In addition, the memory cell using an OS transistor can rewrite and read data by charging or discharging of charge; thus, a substantially unlimited number of times of data writing and data reading are possible. Unlike a magnetic memory, a resistive random access memory, or the like, the memory cell using an OS transistor has no change in the structure at the atomic level and thus exhibits high rewrite endurance. Furthermore, unlike a flash memory, the memory cell using an OS transistor does not show instability due to an increase of electron trap centers even when a rewriting operation is repeated.

The memory cell using an OS transistor can be freely placed, for example, over a silicon substrate including a transistor including silicon in a channel formation region (hereinafter, a Si transistor), so that integration can be easily performed. Furthermore, an OS transistor can be manufactured with a manufacturing apparatus similar to that for a Si transistor and thus can be manufactured at low cost.

In addition, when an OS transistor has a back gate electrode in addition to a gate electrode, a source electrode, and a drain electrode, the OS transistor can be a four-terminal semiconductor element. An electric network where input and output of signals flowing between a source and a drain can be independently controlled in accordance with a voltage applied to a gate electrode or a back gate electrode can be constituted. Thus, circuit design with the same ideas as those of an LSI is possible. Furthermore, electrical characteristics of the OS transistor are better than those of a Si transistor in a high-temperature environment. Specifically, the ratio between an on-state current and an off-state current is large even at a high temperature higher than or equal to 125° C. and lower than or equal to 150° C.; thus, favorable switching operation can be performed.

The transistor layer 30 has a function of being capable of writing and reading data to/from one of the plurality of memory cells included in the transistor layer 40.

The transistor layer 30 includes a read transistor for reading data and a correction circuit having a function of writing and reading data and correcting read-out data. A gate of the read transistor is connected to a local bit line connected to one of the plurality of memory cells. With this structure, the read transistor can amplify a slight difference in the potential of the local bit line in data reading, so that the potential can be output to a global bit line GBL. The correction circuit has a structure which makes the gate of the read transistor hold a potential corresponding to the threshold voltage of the transistor. With such a structure, the read transistor enables a variation in data read out from the memory cell to be reduced.

Note that the local bit line is a bit line directly connected to the memory cell. The global bit line GBL is a bit line electrically connected to the memory cell through the correction circuit by selecting any one of a plurality of local bit lines. A data signal supplied to the global bit line GBL or the local bit line corresponds to a signal written to the memory cell or a signal read from the memory cell. The data signal is described as a binary signal having a high-level or low-level potential corresponding to data 1 or data 0. The data signal may be a multilevel signal higher than or equal to a ternary signal.

As illustrated in FIG. 1, the transistor layer 40 is stacked with the transistor layer 30 in the z-axis direction. The transistor layer 40 included in each of the element layers 20_1 to 20_M is selected by the correction circuit included in the transistor layer 30. The correction circuit included in the transistor layer 30 has a function of converting a data signal written to the memory cell, by utilizing a difference occurring in the amount of current flowing in the read transistor included in the transistor layer 30, into a change in the potential of the global bit line GBL and outputting the potential to the driver circuit included in the silicon substrate 50. The transistor layer 30 has a function of supplying, to a local bit line selected by the correction circuit, a data signal output from the driver circuit included in the silicon substrate 50.

The silicon substrate 50 includes the driver circuit for performing data writing or data reading on a memory cell selected by the transistor layer 30 through the global bit line GBL and the local bit line. The driver circuit includes a plurality of Si transistors using the silicon substrate 50 for their channels.

One embodiment of the present invention uses an OS transistor with an extremely low off-state current as a transistor provided in each element layer. Accordingly, the refresh rate of data retained in the memory cell can be reduced, so that a semiconductor device with reduced power consumption can be obtained. Note that OS transistors can be stacked and can be fabricated in the perpendicular direction by employing the same manufacturing process repeatedly, which can reduce the manufacturing cost. Moreover, in one embodiment of the present invention, the memory density can be increased by arranging the transistors included in the memory cell in not the plane direction but the perpendicular direction, so that the device can be downsized. Furthermore, since an OS transistor has a smaller variation in electrical characteristics than a Si transistor even in a high-temperature environment, the semiconductor device can function as a highly reliable memory device. Moreover, in one embodiment of the present invention, with the structure in which the threshold voltage of the transistor for reading data is corrected, the semiconductor device can function as a memory device that excels in the reliability of read-out data.

Figure 2A:
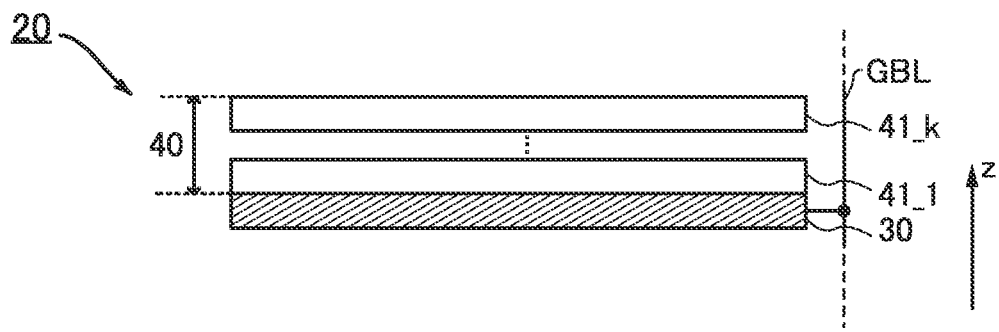
FIG. 2A and FIG. 2B are a block diagram and a circuit diagram illustrating a structure example of a semiconductor device.

Next, FIG. 2A shows a block diagram of the element layer 20 corresponding to any one of the element layers 20_1 to 20_M in FIG. 1.

As also illustrated in FIG. 1, the element layer 20 of one embodiment of the present invention has a structure in which the plurality of transistor layers 40 including the memory cells are provided over the transistor layer 30 in the z-axis direction. With such a structure, the distance between the transistor layer 30 and the transistor layer 40 can be made small. When the local bit line is shortened, parasitic capacitance can be reduced. The plurality of transistor layers 41_1 to 41_k are fabricated in the perpendicular direction by employing the same manufacturing process repeatedly, which can reduce the manufacturing cost.

Figure 2B:
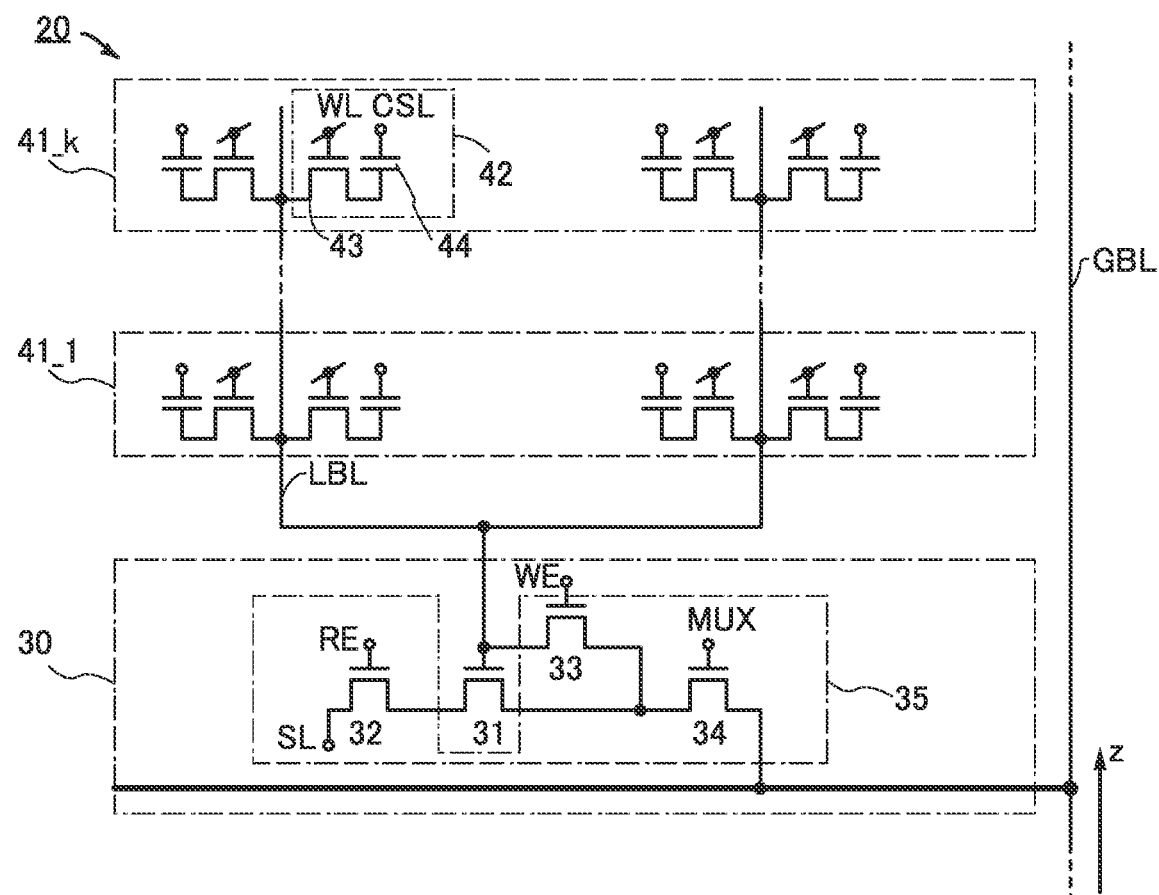

FIG. 2B is a drawing that illustrates the components of the element layer 20 illustrated in FIG. 2A using circuit symbols.

The transistor layer 30 includes a read transistor 31 and a correction circuit 35. The correction circuit 35 includes a transistor 32, a transistor 33, and a transistor 34. Each of the transistor layers 41_1 to 41_k includes a plurality of memory cells 42. Each of the memory cells 42 includes a transistor 43 and a capacitor 44. The transistor 43 functions as a switch that switches a conducting state (on) or a non-conducting state (off) between a local bit line LBL and the capacitor 44 in accordance with the control of a word line WL connected to a gate of the transistor 43. The local bit line LBL is connected to a gate of the transistor 31. The word line WL switches an on state or off state of the transistor 43 in accordance with a word signal (referred to as a signal WL in some cases) supplied to the word line WL. The capacitor 44 is connected to a wiring CSL to which a fixed potential is supplied.

The connection between the transistors included in the correction circuit 35 is shown in FIG. 2B. Specifically, one of a source and a drain of the transistor 33 is connected to the gate of the transistor 31. The other of the source and the drain of the transistor 33 is connected to one of a source and a drain of the transistor 34 and one of a source and a drain of the transistor 31. The one of the source and the drain of the transistor 33 is connected to the other of the source and the drain of the transistor 31. The other of the source and the drain of the transistor 32 is connected to a wiring SL. The other of the source and the drain of the transistor 34 is connected to the global bit line GBL. The transistors 32, 33, and 34 each function as a switch that switches a conducting state or a non-conducting state between the source and the drain in accordance with the control of signals RE, WE, and MUX connected to the respective gates. The signals RE, WE, and MUX are signals switching an on state or an off state of the transistor functioning as a switch. For example, the signal at H level makes the transistor to be turned on, and the signal at L level makes the transistor to be turned off.

The transistor 43 is an OS transistor described above. The capacitor 44 has a structure in which an insulator is sandwiched between conductors serving as electrodes. As the conductor forming the electrode, a semiconductor layer to which conductivity is imparted or the like can be used besides metal. Although the details of the location of the capacitor 44 will be described later, in addition to the structure in which the capacitor 44 is located in a position overlapping with the upper side or lower side of the transistor 43, part of the semiconductor layer, electrode, or the like included in the transistor 43 can be used as one electrode of the capacitor 44.

The transistor 31 has a function of supplying the current between the source and the drain of the transistor 31 depending on the potential of the local bit line LBL. When the potential of the gate of the transistor 31 exceeds the threshold voltage of the transistor 31, current flows between the source and the drain.

The correction circuit 35 has a function of controlling whether the current flowing between the source and the drain of the transistor 31 is made to flow between the wiring SL and the global bit line GBL or a function of transmitting the potential of the global bit line GBL to the local bit line LBL. Alternatively, the correction circuit 35 has a function of discharging the potential of the gate of the transistor 31 to the wiring SL through a path between the source and the drain of the transistor 31.

Like the transistor 43, the transistors 31 to 34 included in the transistor layer 30 are preferably OS transistors. The transistor layers 30 and 40 included in the element layer 20 using OS transistors can be stacked and located over the silicon substrate including Si transistors, which facilitates integration.

Figure 3A:
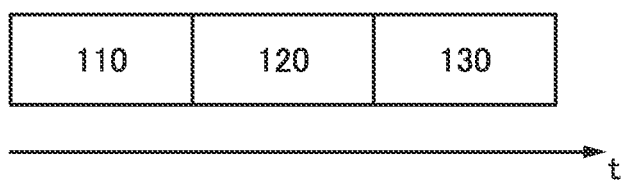
FIG. 3A, FIG. 3B, and FIG. 3C are diagrams illustrating operation of a semiconductor device.

FIG. 3A is a diagram for describing the operation of the semiconductor device 10. As illustrated in FIG. 3A, the operation of the semiconductor device 10 can be roughly divided into a period 110 in which the operation of writing data into the memory cell is performed, a period 120 in which the correction operation for reading data is performed, and a period 130 in which the operation of reading data is performed.

Figure 3B:
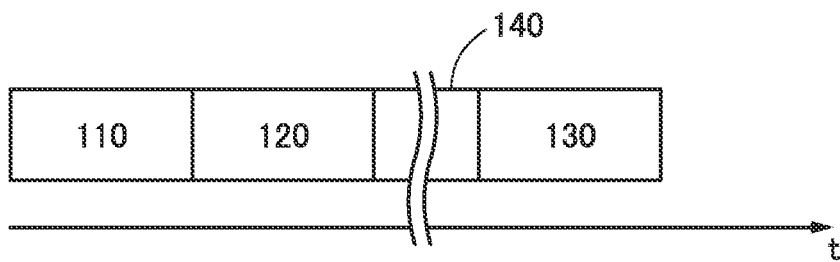
Figure 3C:
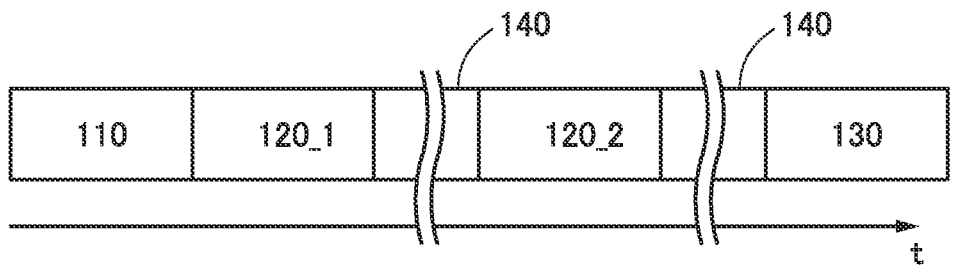

Note that the operation of the semiconductor device 10 is not limited to the order illustrated in FIG. 3A. In one embodiment of the present invention, by bringing each transistor in the correction circuit 35 to the off state, the potential held in the gate of the transistor 31, for example, a potential corresponding to the threshold voltage of the transistor 31, can be maintained. Accordingly, a period 140 in which the operation is stopped while the threshold voltage being holding can be provided between the period 120 and the period 130, for example, as shown in FIG. 3B. Alternatively, for example, when the period 120 has a plurality of periods such as a period 120_1 and a period 120_2, and operation of a set of the period 120 and the period 140 is repeatedly performed as shown in FIG. 3C, the refresh operation of the potential held in the gate of the transistor 31, for example, the potential corresponding to the threshold voltage of the transistor 31, can be conducted.

Figure 4A:
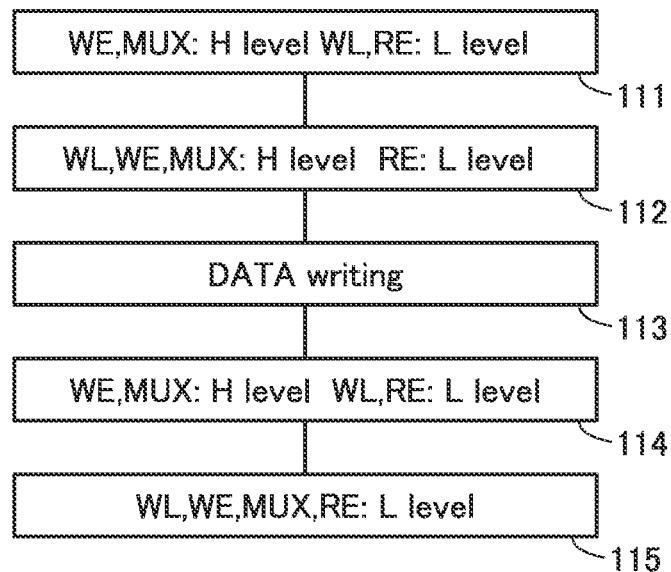
FIG. 4A and FIG. 4B are a flow chart and a circuit diagram illustrating a structure example of a semiconductor device.
Figure 4B:
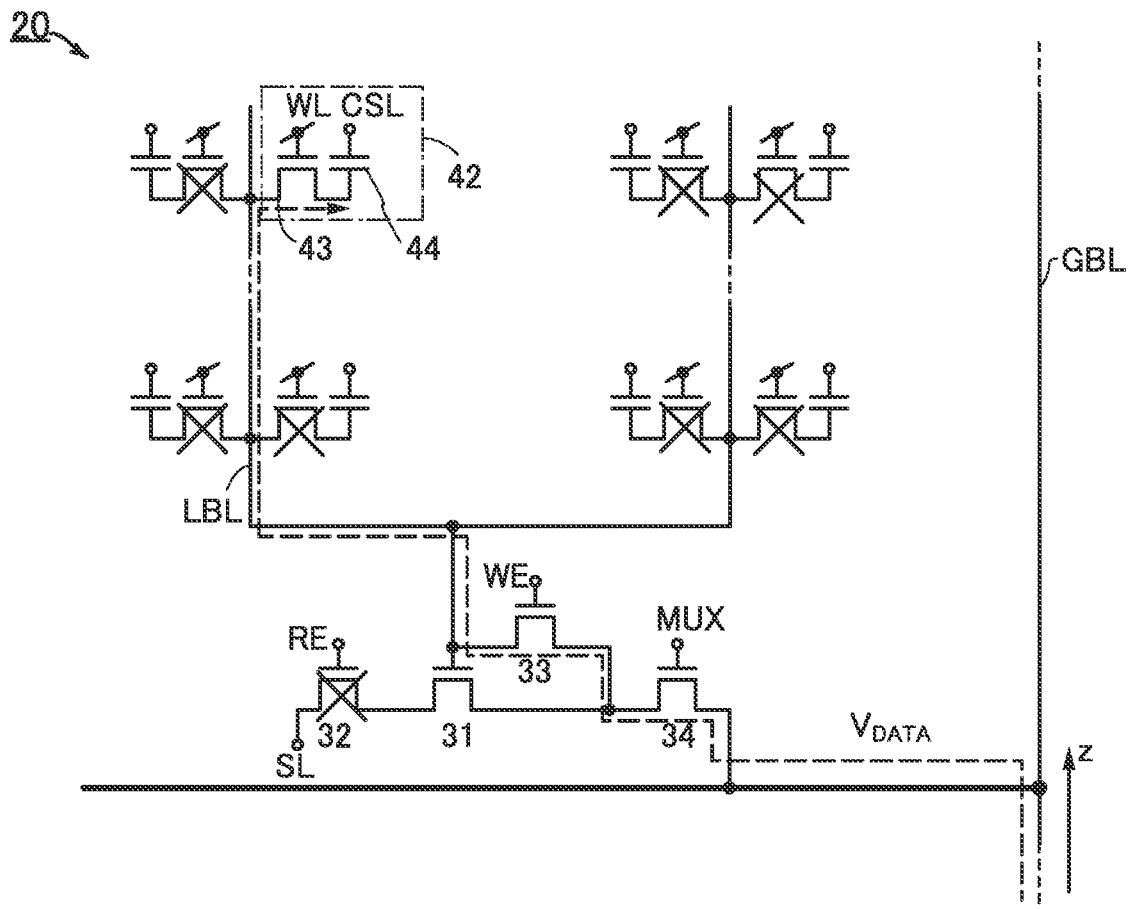

FIG. 4A and FIG. 4B show a flow chart and a circuit diagram for describing the period 110, i.e., the data writing operation.

In the data writing operation, first, the signal WE and the signal MUX are set to H level, and the signal WL and the signal RE are set to L level (operation 111), as illustrated in FIG. 4A. The local bit line LBL is brought to a state electrically connected to the global bit line GBL. The local bit line LBL is charged by the global bit line GBL. The global bit line GBL is set to have a voltage corresponding to data to be written to the memory cell 42.

Next, as illustrated in FIG. 4A, the signal WL, signal WE, and the signal MUX are set to H level, and the signal RE is set to L level (operation 112). The local bit line LBL is brought to a state electrically connected to the capacitor 44. The capacitor 44 is charged by the local bit line LBL. The local bit line LBL is set to have a voltage corresponding to data to be written to the memory cell 42. Then, the data is written to the memory cell 42 (operation 113). FIG. 4B shows a schematic operation of the operation 113. In FIG. 4B, the dashed-line arrow represents a voltage $V_{DATA}$ corresponding to data to be written to the memory cell 42. Furthermore, in FIG. 4B, the transistor marked with a cross represents being in an off state, and the transistor without a cross represents being in an on state.

Next, as illustrated in FIG. 4A, the signal WE and the signal MUX are set to H level, and the signal WL and the signal RE are set to L level (operation 114). The voltage $V_{DATA}$ is held in the capacitor 44 of the memory cell 42. Next, as illustrated in FIG. 4A, the signal WE, the signal MUX, the signal WL, and the signal RE are set to L level (operation 115), whereby the data writing operation is completed. Note that the operation 115 can be skipped in the case where the operation moves into the correction operation.

FIG. 5A, FIG. 5B, FIG. 6A, FIG. 6B, and FIG. 7 show flow charts and circuit diagrams for describing the period 120, i.e., the correction operation.

Figure 5A:
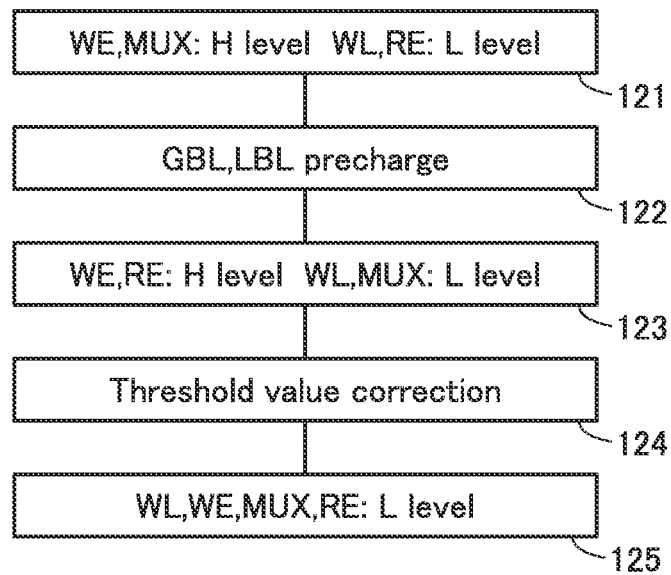
FIG. 5A and FIG. 5B are a flow chart and a circuit diagram illustrating a structure example of a semiconductor device.
Figure 5B:
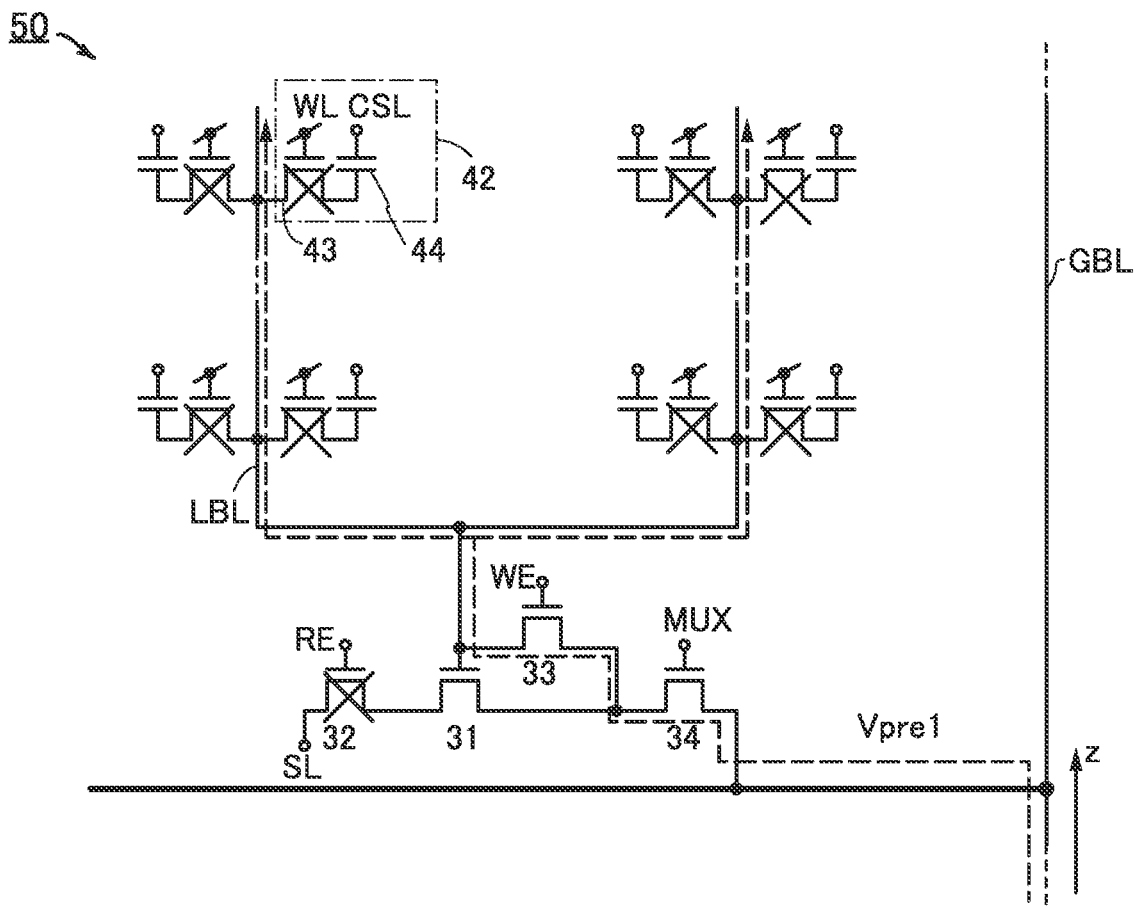

In the correction operation, first, the signal WE and the signal MUX are set to H level, and the signal WL and the signal RE are set to L level (operation 121), as illustrated in FIG. 5A. The local bit line LBL is brought to a state electrically connected to the global bit line GBL. The local bit line LBL is charged by the global bit line GBL. The global bit line GBL is set to have a precharge voltage Vpre1 of the local bit line LBL. Then, the global bit line GBL and the local bit line LBL are precharged (operation 122: operation of precharging GBL and LBL). A schematic operation of the operation 122 is illustrated in FIG. 5B. In FIG. 5B, the dashed-line arrow represents the precharge voltage Vpre1 written to the global bit line GBL and the local bit line LBL. Furthermore, in FIG. 5B, the transistor marked with a cross represents being in an off state, and the transistor without a cross represents being in an on state.

Figure 6A:
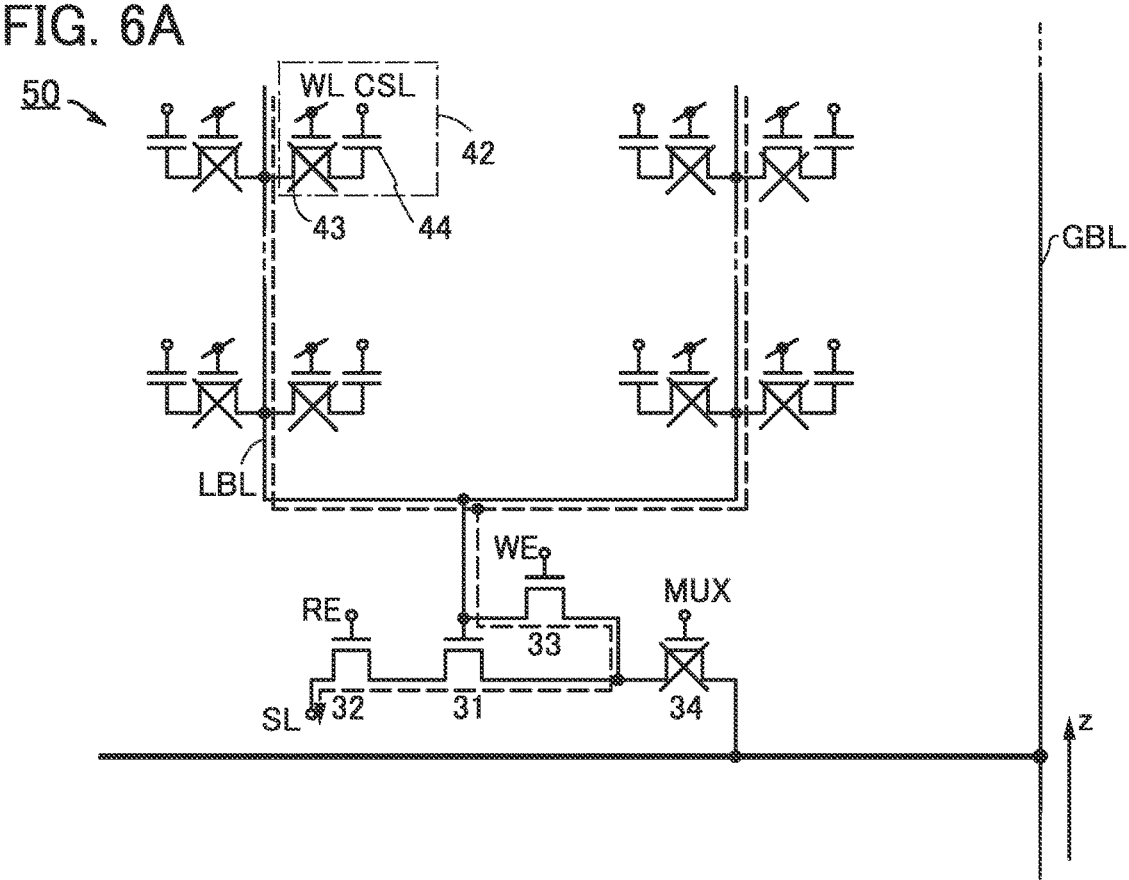
FIG. 6A and FIG. 6B are circuit diagrams illustrating structure examples of a semiconductor device.

Next, as illustrated in FIG. 5A, the signal WE and the signal RE are set to H level, and the signal WL and the signal MUX are set to L level (operation 123). The local bit line LBL is brought to a state electrically connected to the wiring SL through the transistor 33, the transistor 31, and the transistor 32. Electric charge corresponding to the precharge voltage Vpre1 is discharged from the local bit line LBL through the transistor 33, the transistor 31, and the transistor 32. When the potential of the local bit line LBL is equivalent to the threshold voltage (Vth) of the transistor 31, discharging is stopped, and the threshold voltage Vth is retained by the gate of the transistor 31 (operation 124: threshold correction). The preferable potential of the wiring SL is a potential which the local bit line LBL can discharge. A schematic operation of the operation 124 is illustrated in FIG. 6A. In FIG. 6A, the broken dashed line represents current flowing from the local bit line LBL toward the wiring SL. Furthermore, in FIG. 6A, the transistor marked with a cross represents being in an off state, and the transistor without a cross represents being in an on state.

Figure 6B:
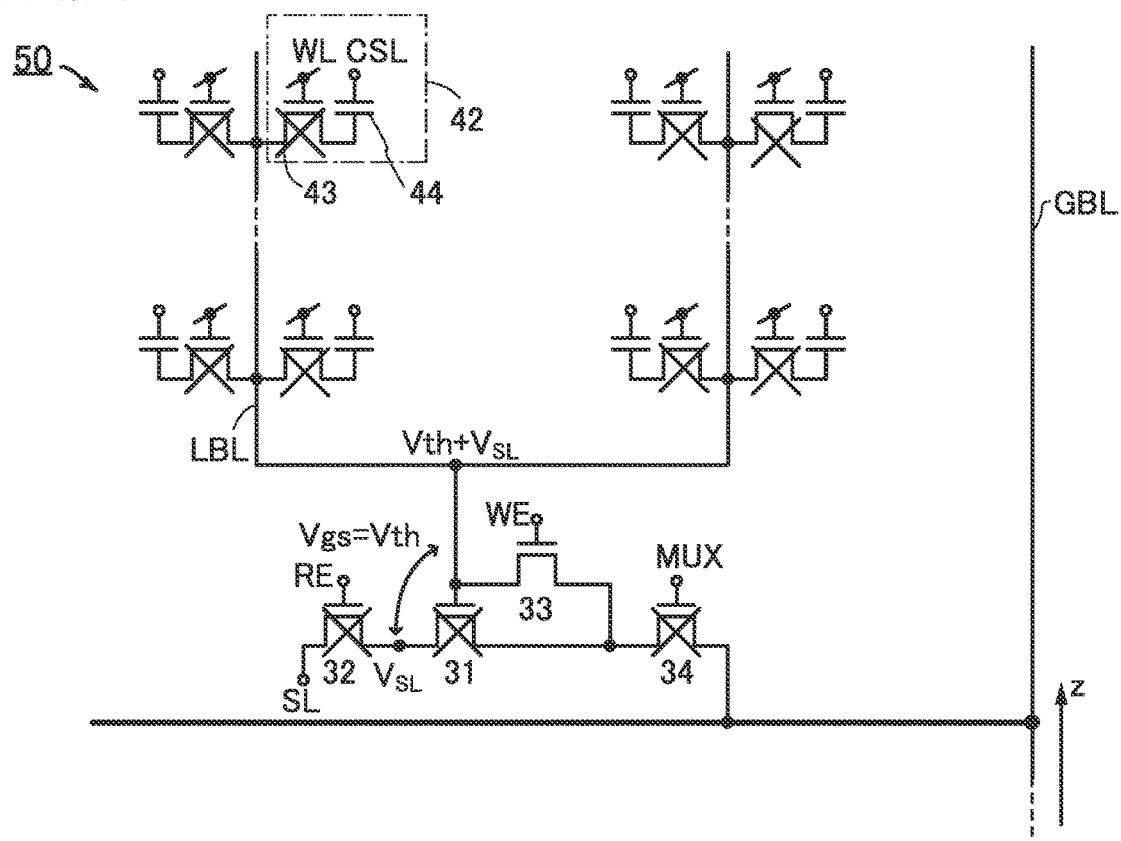

Next, as illustrated in FIG. 5A, the signal WE, the signal RE, the signal WL, and the signal MUX are set to L level (operation 125). Assuming that the potential of the wiring SL is $V_{SL}$ and the threshold voltage of the transistor 31 is Vth, the local bit line LBL is brought to a state where the voltage between a gate and a source Vgs is equivalent to Vth (Vgs=Vth), i.e., a state where (Vth+$V_{SL}$) is held. A schematic operation of the operation 125 is illustrated in FIG. 6B. In FIG. 6B, the transistor marked with a cross represents being in an off state, and the transistor without a cross represents being in an on state.

Figure 7:
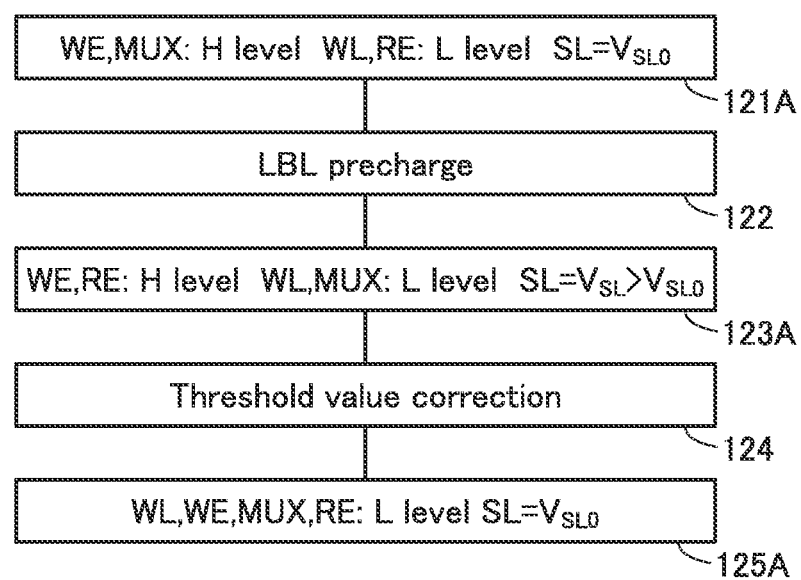
FIG. 7 is a flow chart illustrating a structure example of a semiconductor device.

Note that the operation flow chart illustrated in FIG. 5A can have another structure. For example, operation illustrated in FIG. 7 can be made. The flow illustrated in FIG. 7 is different from that in FIG. 5A in that the potential of the wiring SL is switched per operation. Specifically, the wiring SL is set to a potential $V_{SL0}$ in operation 121A corresponding to the operation 121 and operation 125A corresponding to the operation 125. In operation 123A corresponding to the operation 123, the wiring SL is set to have a potential $V_{SL}$ higher than the potential $V_{SL0}$. With this structure, current can flow to the wiring SL even when the potential of the local bit line LBL is low.

Figure 8A:
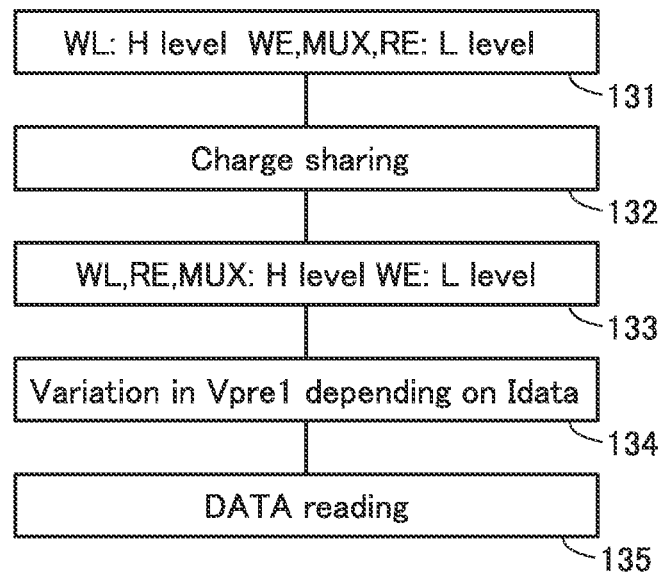
FIG. 8A and FIG. 8B are a flow chart and a circuit diagram illustrating a structure example of a semiconductor device.
Figure 8B:
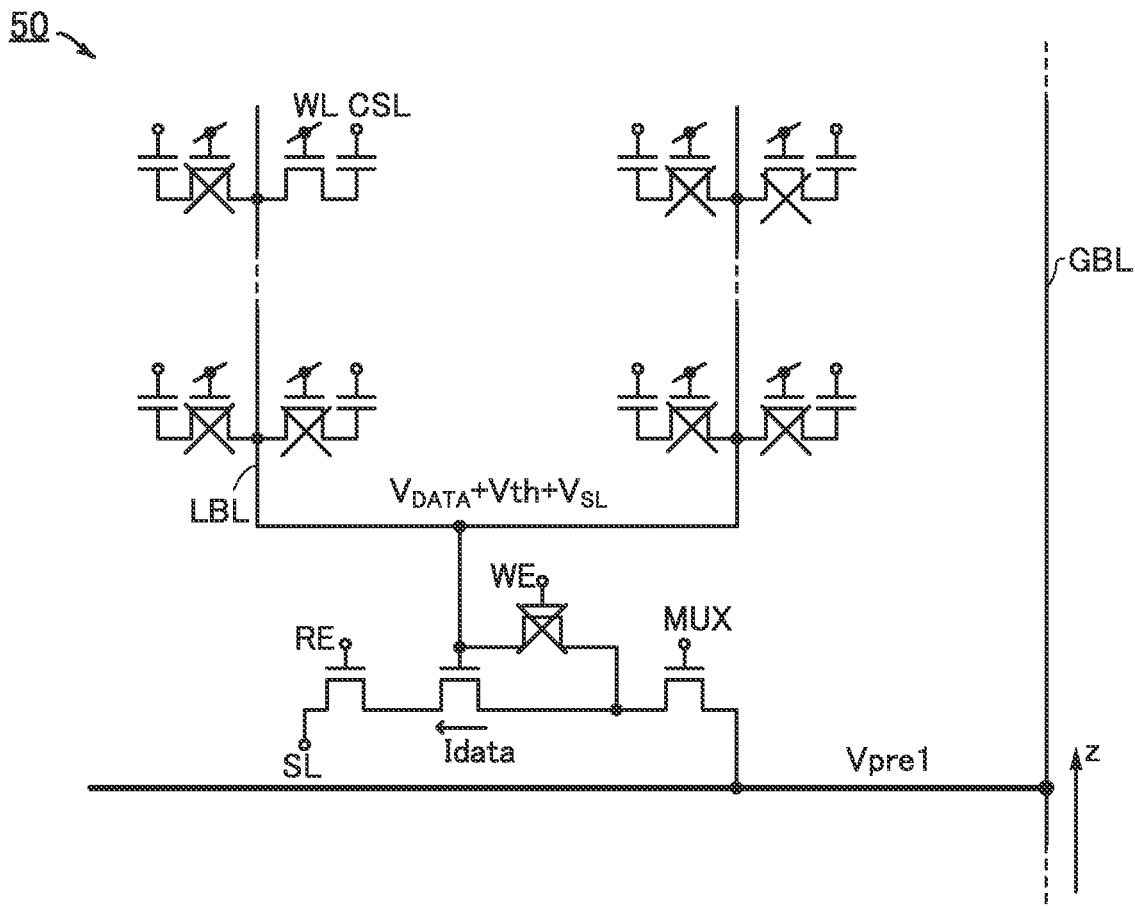

FIG. 8A and FIG. 8B are a flow chart describing the period 130, that is, data reading operation, and a circuit diagram thereof.

In the reading operation, first, the signal WL is set to H level, and the signal WE, the signal MUX, and the signal RE are set to L level (operation 131) as illustrated in FIG. 8A. By this operation, the local bit line LBL is brought to a state causing charge sharing of $V_{SL}$+Vth, which is the voltage of the local bit line LBL, and $V_{DATA}$, which is the voltage of the capacitor (operation 132), i.e., to have a potential corresponding to summed up charge ($V_{DATA}$+Vth+$V_{SL}$).

Next, as illustrated in FIG. 8A, the signal WL, the signal RE, and the signal MUX are set to H level, and the signal WE is set to L level (operation 133). The transistor 31 is brought to a state where current (Idata) flows in accordance with the potential of the gate ($V_{DATA}$+Vth+$V_{SL}$). The global bit line GBL is supplied with the precharge voltage Vpre1 and set to an electrically floating state (floating). The potential of the global bit line GBL varies from Vpre1 depending on the current Idata flowing in the transistor 31 (operation 134). The varied voltage is read out as a read voltage Vread by the driver circuit (operation 135). A schematic operation of the operation 134 is illustrated in FIG. 8B. In FIG. 8B, the transistor marked with a cross represents being in an off state, and the transistor without a cross represents being in an on state.

Figure 9A:
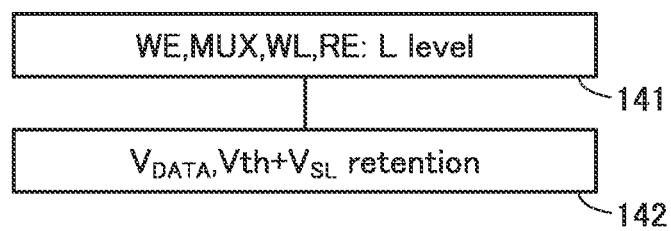
FIG. 9A and FIG. 9B are a flow chart and a circuit diagram illustrating a structure example of a semiconductor device
Figure 9B:
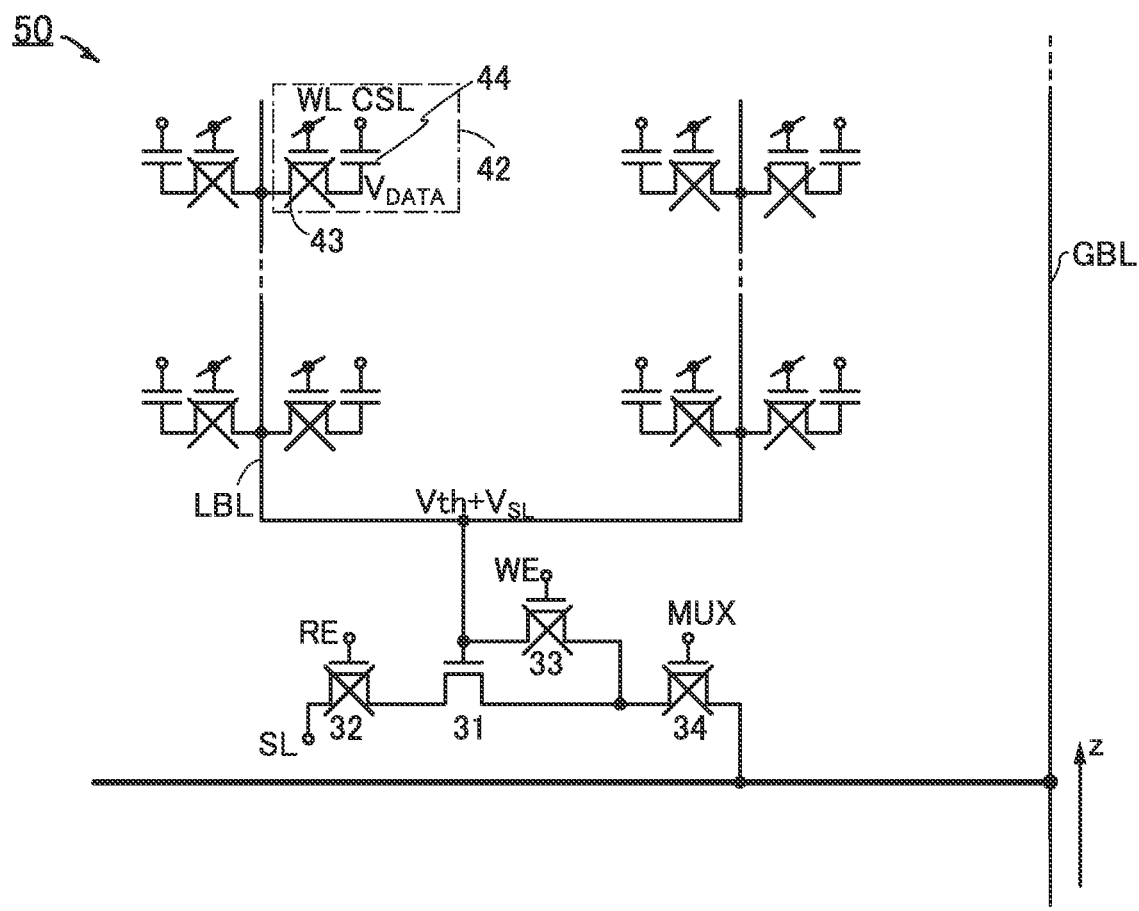

FIG. 9A and FIG. 9B are a flow chart describing the period 140, that is, stopping operation, and a circuit diagram thereof.

In the stopping operation, first, the signal WL, the signal WE, the signal MUX, and the signal RE are set to L level (operation 141), as illustrated in FIG. 9A. By the operation, the voltage of the local bit line LBL ($V_{SL}$+Vth) and the voltage of the capacitor 44 $V_{DATA}$ are retained (operation 142). A schematic operation of the operation 142 is illustrated in FIG. 9B. In FIG. 9B, the transistor marked with a cross represents being in an off state, and the transistor without a cross represents being in an on state.

Figure 10A:
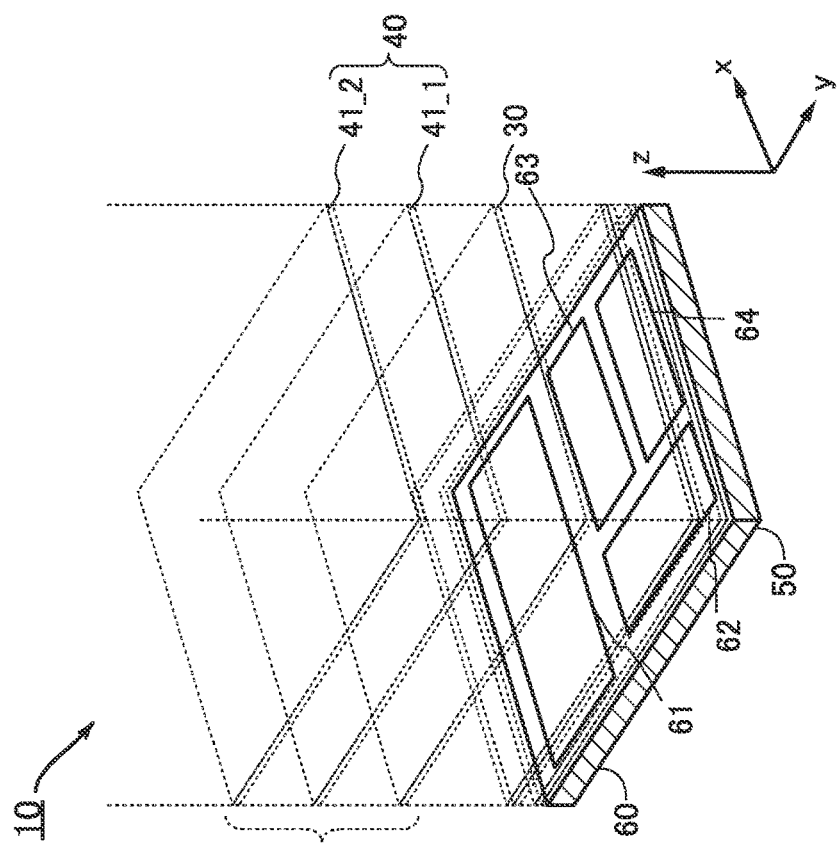
FIG. 10A and FIG. 10B are schematic diagrams illustrating a structure example of a semiconductor device.

FIG. 10A shows a perspective view of the semiconductor device 10 illustrated in FIG. 1 in which the element layers 20_1 to 20_M are placed over the silicon substrate 50. FIG. 10A illustrates the depth direction (x-axis direction) and the horizontal direction (y-axis direction) in addition to the perpendicular direction (z-axis direction).

In FIG. 10A, the memory cells 42 included in the transistor layers 41_1 and 41_2 are indicated with dotted lines.

As illustrated in FIG. 10A, in the semiconductor device 10 of one embodiment of the present invention, the transistor layers 30 and 40 including OS transistors are stacked. Therefore, the transistor layers can be fabricated in the perpendicular direction by employing the same manufacturing process repeatedly, which can reduce the manufacturing cost. Moreover, in the semiconductor device 10 of one embodiment of the present invention, the memory density can be increased by arranging the transistor layers 40 including the memory cells 42 in not the plane direction but the perpendicular direction, so that the device can be downsized.

Figure 10B:
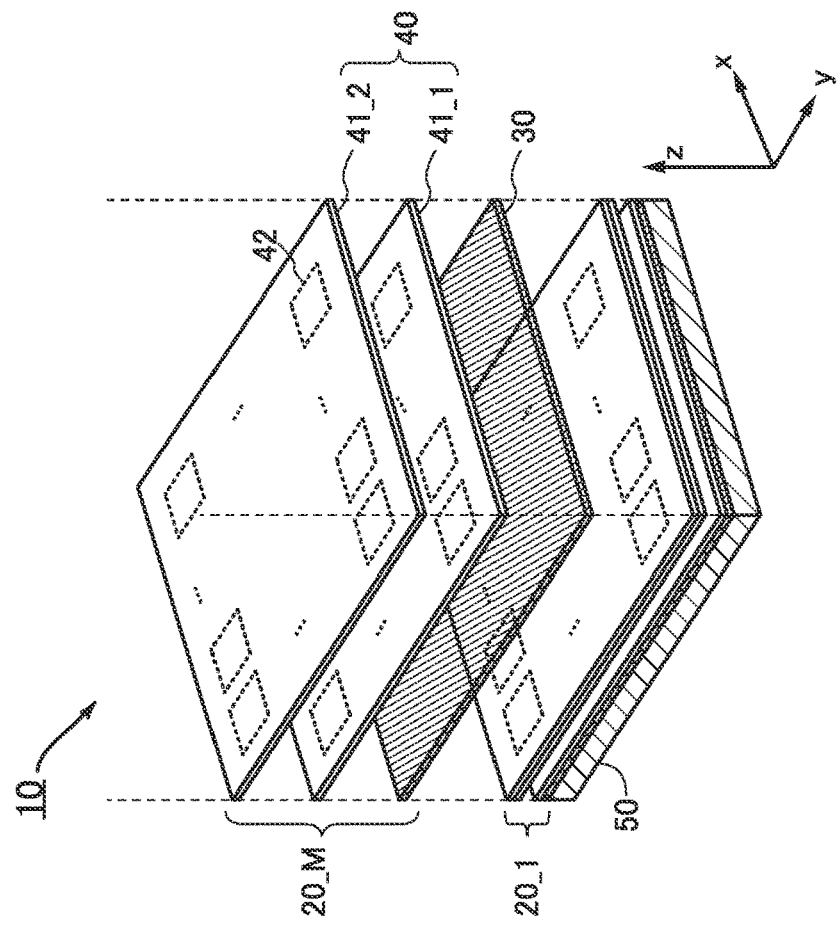

FIG. 10B is a drawing illustrating circuits provided for the silicon substrate 50 while the components included in the element layers 20_1 to 20_M illustrated in FIG. 10A are omitted. FIG. 10B illustrates a control logic circuit 61, a row driver circuit 62, a column driver circuit 63, and an output circuit 64 formed using Si transistors on the silicon substrate 50. The control logic circuit 61, the row driver circuit 62, the column driver circuit 63, and the output circuit 64 will be described in detail in Embodiment 4.

Figure 11:
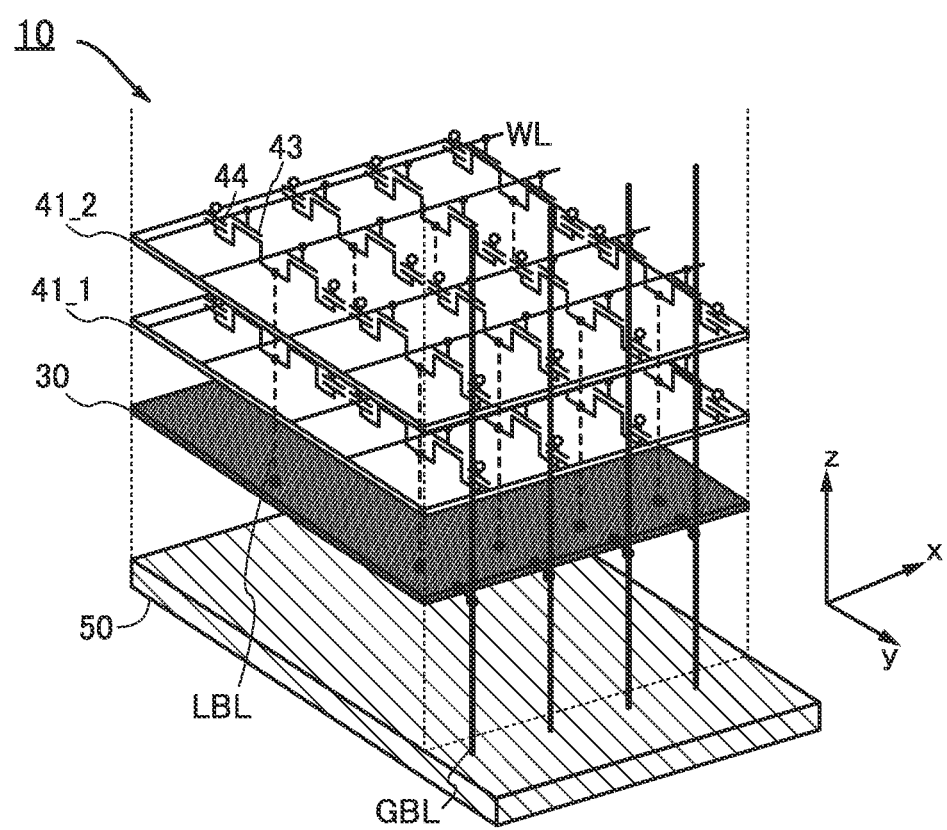
FIG. 11 is a schematic diagram illustrating a structure example of a semiconductor device.

FIG. 11 corresponds to a drawing illustrating the transistor layers 30, 41_1, and 41_2 extracted from the semiconductor device 10 illustrated in FIG. 10A. FIG. 11 illustrates the transistor 43, the capacitor 44, the local bit line LBL, and the word line WL included in the memory cells of the transistor layers 41_1 and 41_2. To increase visibility, the local bit line LBL is indicated by a dashed line in FIG. 11. FIG. 11 illustrates the global bit line GBL provided to penetrate the transistor layers in the z-axis direction. To increase visibility as described above, the global bit line GBL is indicated by a line bolder than other lines.

As illustrated in FIG. 11, in the semiconductor device 10, the local bit line LBL connected to the transistor 43 included in the memory cell and the global bit line GBL connected to the correction circuit in the transistor layer 30 and the silicon substrate 50 are provided in the z-axis direction, i.e., the direction perpendicular to the silicon substrate 50. With such a structure, the local bit line LBL connected to each memory cell can be shortened. Thus, the parasitic capacitance of the local bit line LBL can be reduced significantly, so that a potential can be read even when the memory cell retains a multilevel data signal. Furthermore, one embodiment of the present invention can read data retained in the memory cell as current; thus, multilevel data can be easily read.

Figure 12A:
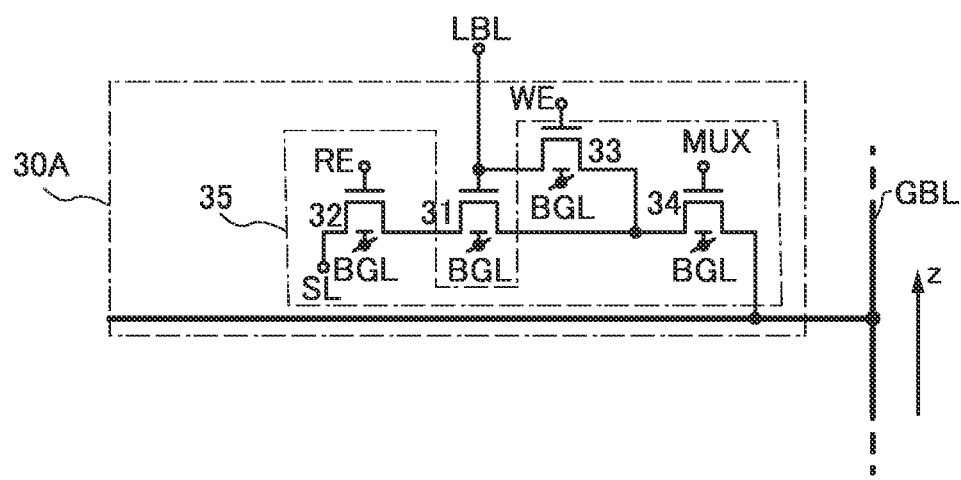
FIG. 12A and FIG. 12B are circuit diagrams illustrating structure examples of a semiconductor device.
Figure 12B:
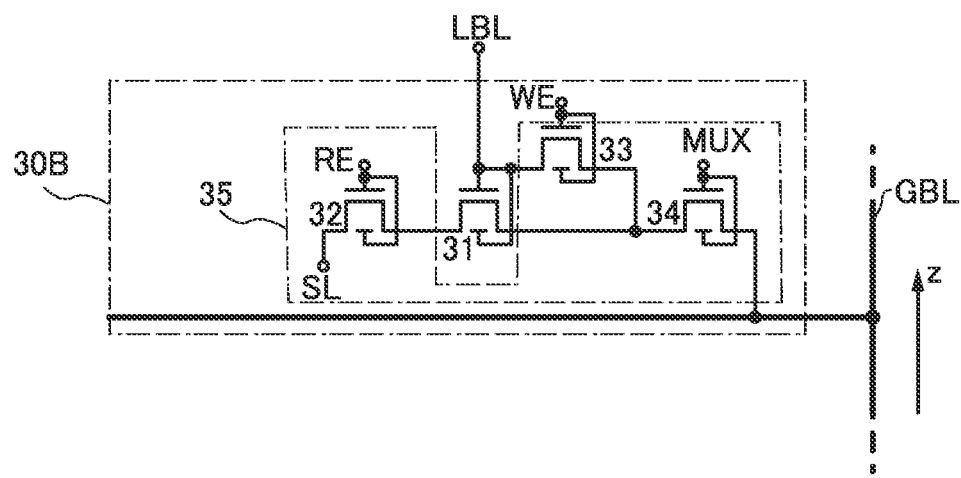

FIG. 12A and FIG. 12B shows circuit diagram describing modification example of the transistor 31 and the correction circuit 35 illustrated in FIG. 2B. In FIG. 2B, each transistor is illustrated as a transistor having a top-gate structure or a bottom-gate structure without a back gate electrode; however, the structures of the transistors are not limited thereto. For example, as illustrated in FIG. 12A, a transistor layer 30A in which each transistor has a back gate electrode connected to a back gate electrode line BGL may be used. With the structure of FIG. 12A, electrical characteristics such as the threshold voltages of the transistors can be easily controlled from the outside.

Alternatively, as illustrated in FIG. 12B, a transistor layer 30B in which each transistor has a back gate electrode connected to a gate electrode may be used. With the structure of FIG. 12B, the amount of current flowing through the transistors can be increased.

Figure 13A:
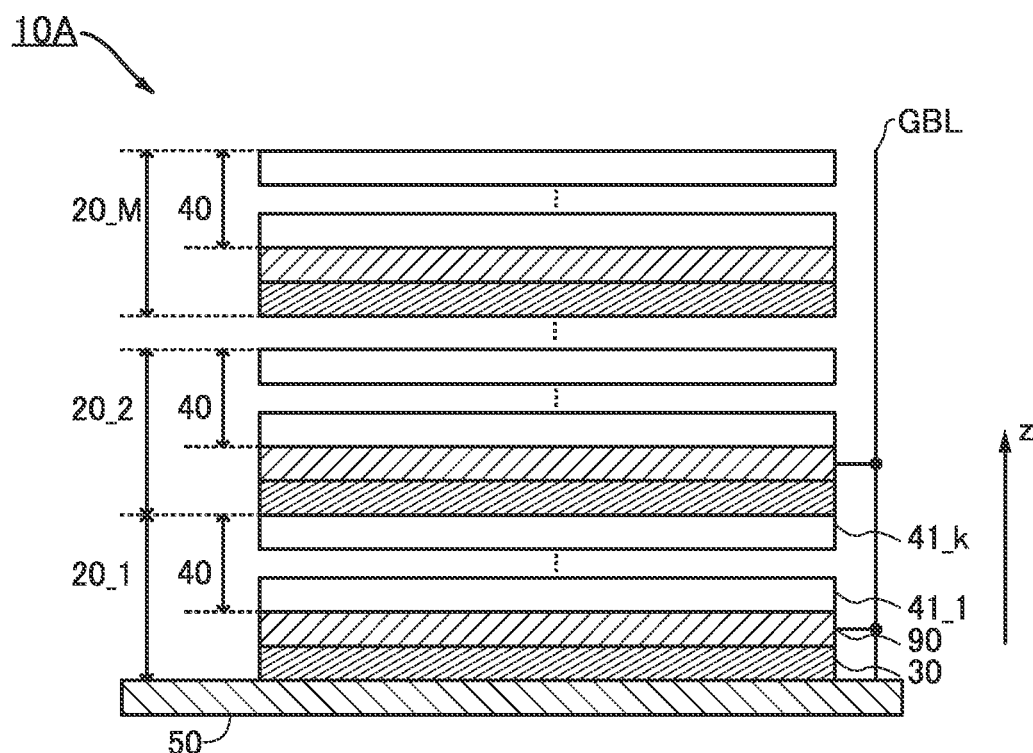
FIG. 13A and FIG. 13B are a block diagram and a circuit diagram illustrating a structure example of a semiconductor device.

Although the semiconductor device 10 in FIG. 1 is described as a semiconductor device including one kind of memory cell, two or more kinds of memory cells may be included. FIG. 13A shows a block diagram of a semiconductor device 10A corresponding to a modification example of the semiconductor device 10.

The semiconductor device 10A is different from the semiconductor device 10 in that a transistor layer 90 which include a memory cell having different circuit structures is provided between the transistor layer 20 and the transistor layer 30.

Figure 13B:
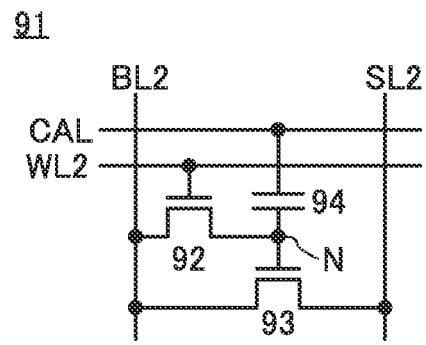

FIG. 13B is a circuit diagram showing a structure example of the memory cell included in the transistor layer 90. A memory cell 91 includes a transistor 92, a transistor 93, and a capacitor 94.

One of a source and a drain of the transistor 92 is connected to a gate of the transistor 93. The gate of the transistor 93 is connected to one electrode of the capacitor 94. The other of the source and the drain of the transistor 92 and one of a source and a drain of the transistor 92 are connected to a wiring BL2. The other of the source and the drain of the transistor 93 is connected to a wiring SL2. The other electrode of the capacitor 94 is electrically connected to a wiring CAL. Here, a node which is connected to the one of the source and the drain of the transistor 92, the gate of the transistor 93, and the one electrode of the capacitor 94 is referred to as a node N.

The wiring CAL has a function of a wiring for applying a predetermined potential to the other electrode of the capacitor 94. The potential of the wiring CAL in reading data from the memory cell 91 is made different from the potential of the wiring CAL in writing data to the memory cell 91 and at the time of retaining the data in the memory cell 91. Accordingly, the apparent threshold voltage of the transistor 93 in reading data from the memory cell 91 can be made different from the apparent threshold voltage of the transistor 93 in writing data to the memory cell 91 and at the time of retaining the data in the memory cell 91.

In the case where the memory cell 91 has the structure illustrated in FIG. 13B, current does not flow between the wiring SL2 and the wiring BL2 in writing data to the memory cell 91 and at the time of retaining the data in the memory cell 91, regardless of data written to the memory cell 91. In contrast, in reading data from the memory cell 91, current corresponding to the data retained in the memory cell 91 flows between the wiring SL2 and the wiring BL2.

The transistors 92 and 93 are preferably OS transistors. As described above, an OS transistor has an extremely low off-state current. Accordingly, charge corresponding to data written to the memory cell 91 can be retained at the node N for a long time. In other words, data written once can be retained for a long time in the memory cell 91. This can reduce the data refresh rate, leading to low power consumption of the semiconductor device of one embodiment of the present invention.

The memory cell 91 having the structure illustrated in FIG. 13B can be referred to as a NOSRAM (Nonvolatile Oxide Semiconductor RAM) using an OS transistor for a memory. The NOSRAM is characterized by being capable of non-destructive read. Meanwhile, the above-described DOSRAM performs destructive read for reading retained data.

The semiconductor device 10A including the memory cell 91 can transfer frequently-read data from a DOSRAM to a NOSRAM. Since the NOSRAM is capable of non-destructive read as described above, the data refresh rate can be reduced. Therefore, the semiconductor device of one embodiment of the present invention can have reduced power consumption. Note that although the transistor 92 and the transistor 93 illustrated in FIG. 13B each include one gate, the transistor is not limited thereto. For example, one or both of the transistors 92 and the transistor 93 may be a transistor including two gates (a front gate and a back gate facing the front gate).

Figure 14A:
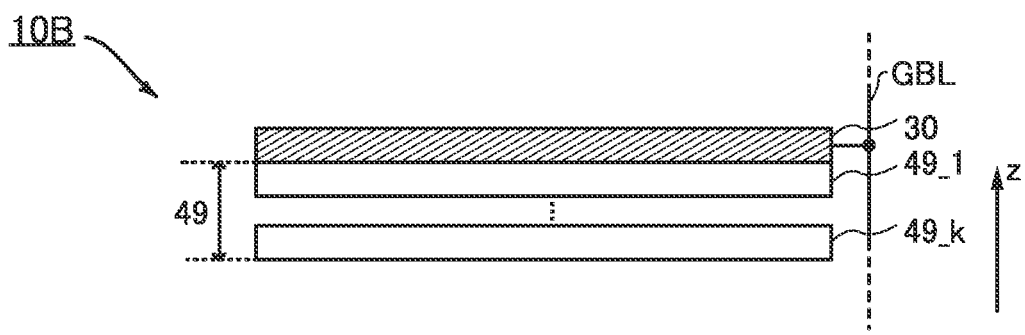
FIG. 14A and FIG. 14B are block diagrams illustrating structure examples of a semiconductor device.
Figure 14B:
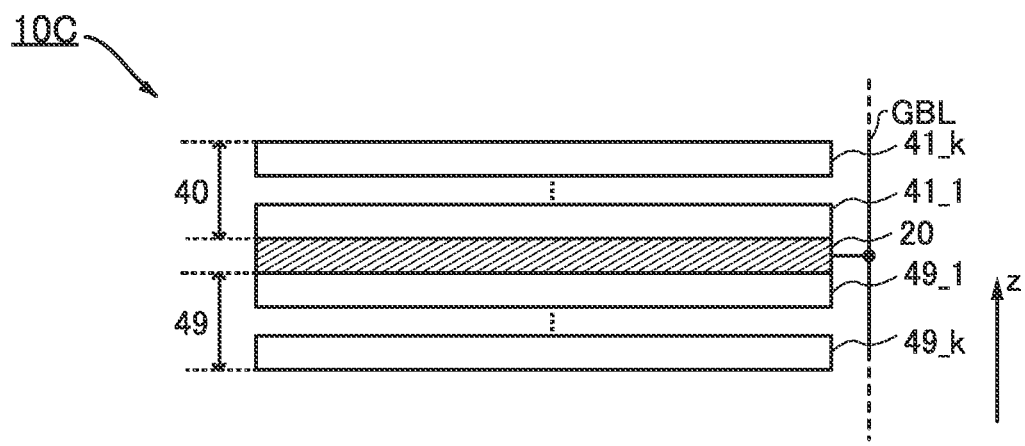

FIG. 14A and FIG. 14B show schematic diagrams for describing modification examples of the semiconductor device 10 illustrated in FIG. 1.

FIG. 14A illustrates a semiconductor device 10B in which the transistor layer 40 is positioned below the transistor layer 30 in each of the element layers 20_1 to 20_M in the semiconductor device 10 illustrated in FIG. 1. The semiconductor device 10B illustrated in FIG. 14A includes a transistor layer 49 including transistor layers 49_1 to 49_k below the transistor layer 30. This structure also enables the threshold voltage of the read transistor to be corrected.

FIG. 14B illustrates a semiconductor device 10C in which the transistor layer 49 illustrated in FIG. 14A is provided in each of the element layers 20_1 to 20_M in the semiconductor device 10 illustrated in FIG. 1, in addition to the transistor layer 40. This structure also enables the threshold voltage of the read transistor to be corrected.

FIG. 15A and FIG. 15B show a circuit diagram corresponding to the memory cell 42 illustrated in FIG. 2B or the like and a drawing of a circuit block corresponding to the circuit diagram. As illustrated in FIG. 15A and FIG. 15B, the memory cell 42 is expressed as a block in the drawing and the like in some cases.

FIG. 15C and FIG. 15D show a circuit diagram corresponding to the transistor layer 30 including the transistor 31 and the correction circuit 35 illustrated in FIG. 2B or the like and a drawing of a circuit block corresponding to the circuit diagram. As illustrated in FIG. 15C and FIG. 15D, the transistor layer 30 including the transistor 31 and the correction circuit 35 is expressed as a block of a circuit 36 in the drawing and the like in some cases.

Figure 16A:
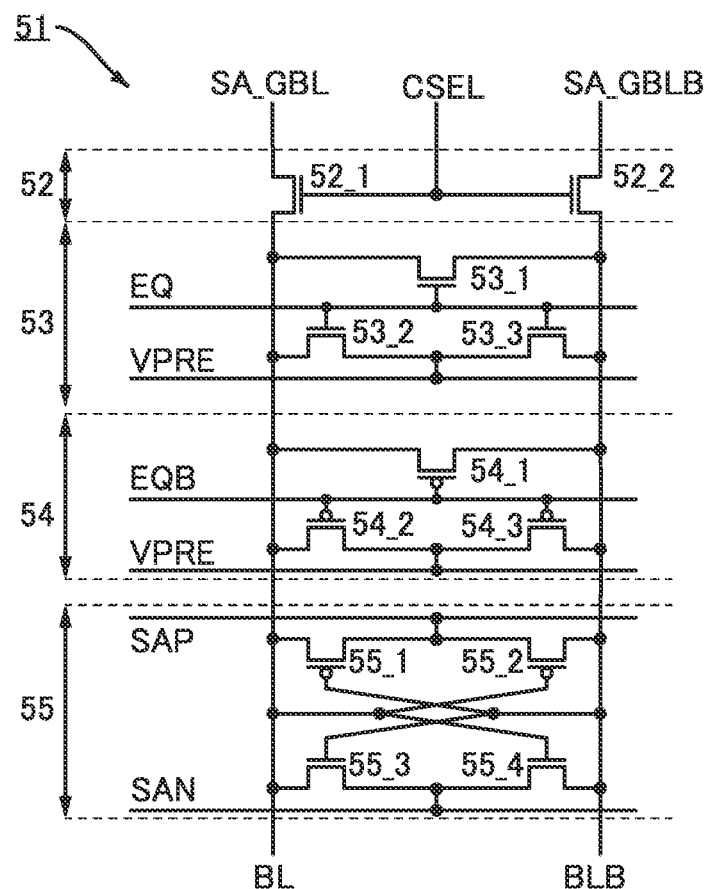
FIG. 16A and FIG. 16B are a circuit diagrams illustrating a structure example of a semiconductor device.

FIG. 16A shows a circuit structure example of a control circuit 51 for controlling data writing and reading to/from the memory cell, which is formed using the Si transistors on the silicon substrate 50. The control circuit 51 includes a switch circuit 52, a precharge circuit 53, a precharge circuit 54, and a sense amplifier 55. A global bit line SA_GBL, a global bit line SA_GBLB, and bit lines BL and BLB, which are connected to the control circuit 51, are illustrated.

The switch circuit 52 includes, for example, an n-channel transistors 52_1 and 52_2, as illustrated in FIG. 16A. The transistors 52_1 and 52_2 switch a conducting state between a wiring pair of the global bit line SA_GBL and the global bit line SA_GBLB and a conducting state of a wiring pair of the bit lines BL and BLB.

The precharge circuit 53 includes n-channel transistors 53_1 to 53_3 as illustrated in FIG. 16A. The precharge circuit 53 is a circuit to be precharged at an intermediate potential VPRE corresponding to half of the potential VDD between the bit line BL and the bit line BLB in accordance with a signal EQ.

The precharge circuit 54 includes p-channel transistors 54_1 to 54_3 as illustrated in FIG. 16A. The precharge circuit 54 is a circuit to be precharged at the intermediate potential VPRE corresponding to half of the potential VDD between the bit line BL and the nit line BLB in accordance with a signal EQB.

The sense amplifier 55 includes p-channel transistors 55_1 and 55_2 and n-channel transistors 55_3 and 55_4, which are connected to a wiring SAP or a wiring SAN, as illustrated in FIG. 16A. The wiring SAP or the wiring SAN is a wiring having a function of supplying VDD or VSS. The transistors 55_1 to 55_4 are transistors that form an inverter loop.

Figure 16B:
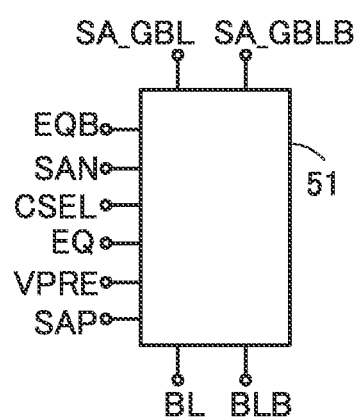

FIG. 16B illustrates a circuit block corresponding to the control circuit 51 illustrated in FIG. 16A or the like. As illustrated in FIG. 16B, the control circuit 51 in some cases is expressed as a block in the drawing and the like.

Figure 17:
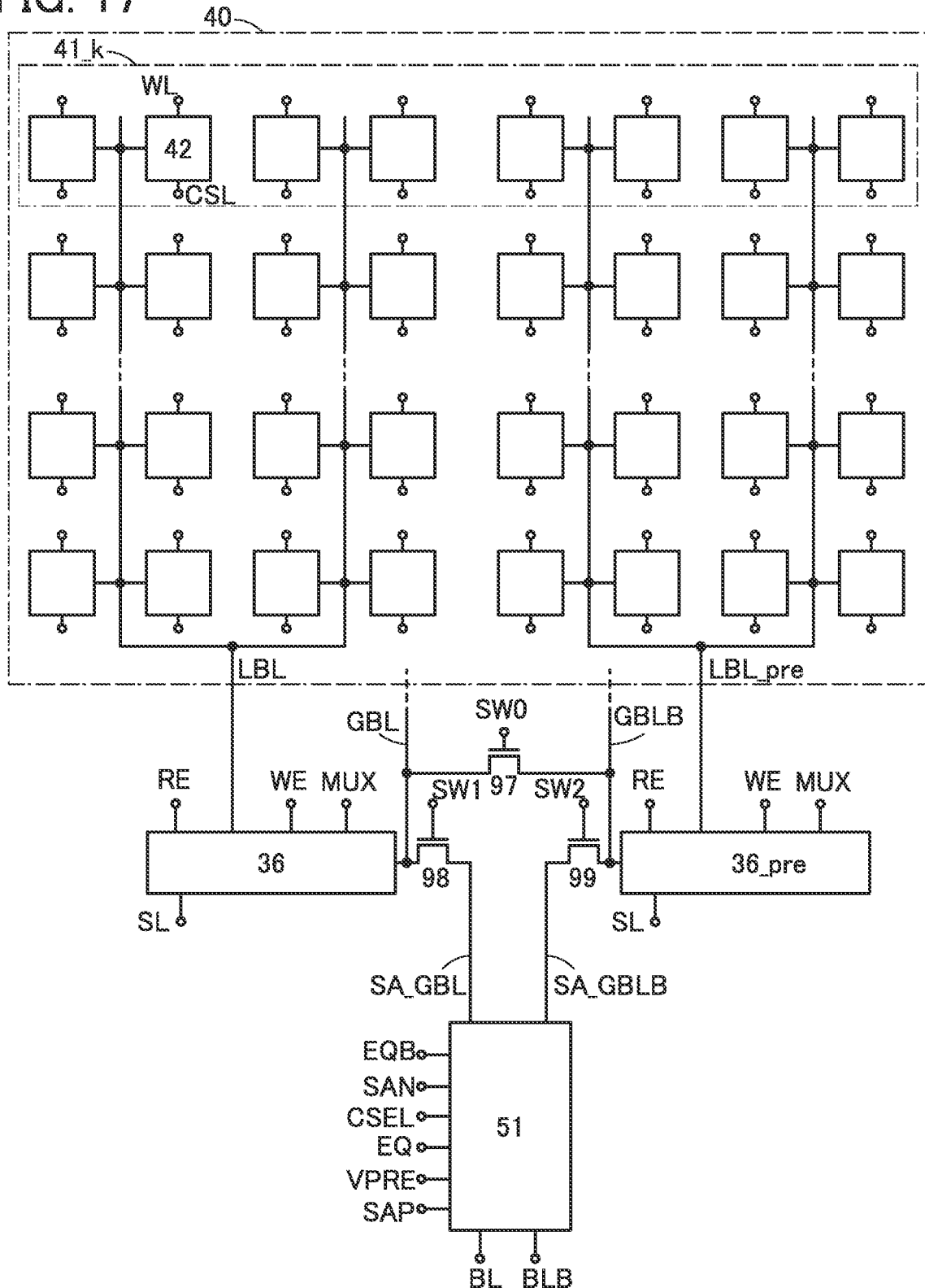
FIG. 17 is a circuit diagram illustrating a structure example of a semiconductor device.

FIG. 17 is a circuit diagram illustrating an operation example of the semiconductor device 10 in FIG. 1. In FIG. 17, the circuit blocks illustrated in FIG. 15A to 15D, FIG. 16A, and FIG. 16B are used.

The transistor layer 40 including the transistor layer 41_k includes a plurality of memory cells 42 as illustrated in FIG. 17. The memory cells are connected to either of a pair of the local bit line LBL or a local bit line LBL_pre. The memory cell 42 connected to the local bit line LBL is a memory cell into/from which data is written or read. The local bit line LBL_pre is a local bit line to be precharged, and the memory cell connected to the local bit line LBL_pre retains data.

The local bit line LBL is electrically connected to the global bit line GBL through the circuit 36. The local bit line LBL_pre is electrically connected to the global bit line GBLB through a circuit 36_pre.

A transistor 97 functions as a switch for switching a conducting state between the global bit line GBL and the global bit line GBLB. The on/off state of the transistor 97 is switched by a signal SW0.

A transistor 98 functions as a switch for switching a conducting state between the global bit line GBL and the global bit line SA_GBL positioned on the control circuit 51 side. The on/off state of the transistor 98 is switched by a signal SW1.

A transistor 99 functions as a switch for switching a conducting state between the global bit line GBLB and the global bit line SA_GBLB positioned on the control circuit 51 side. The on/off state of the transistor 99 is switched by a signal SW2.

Figure 18:
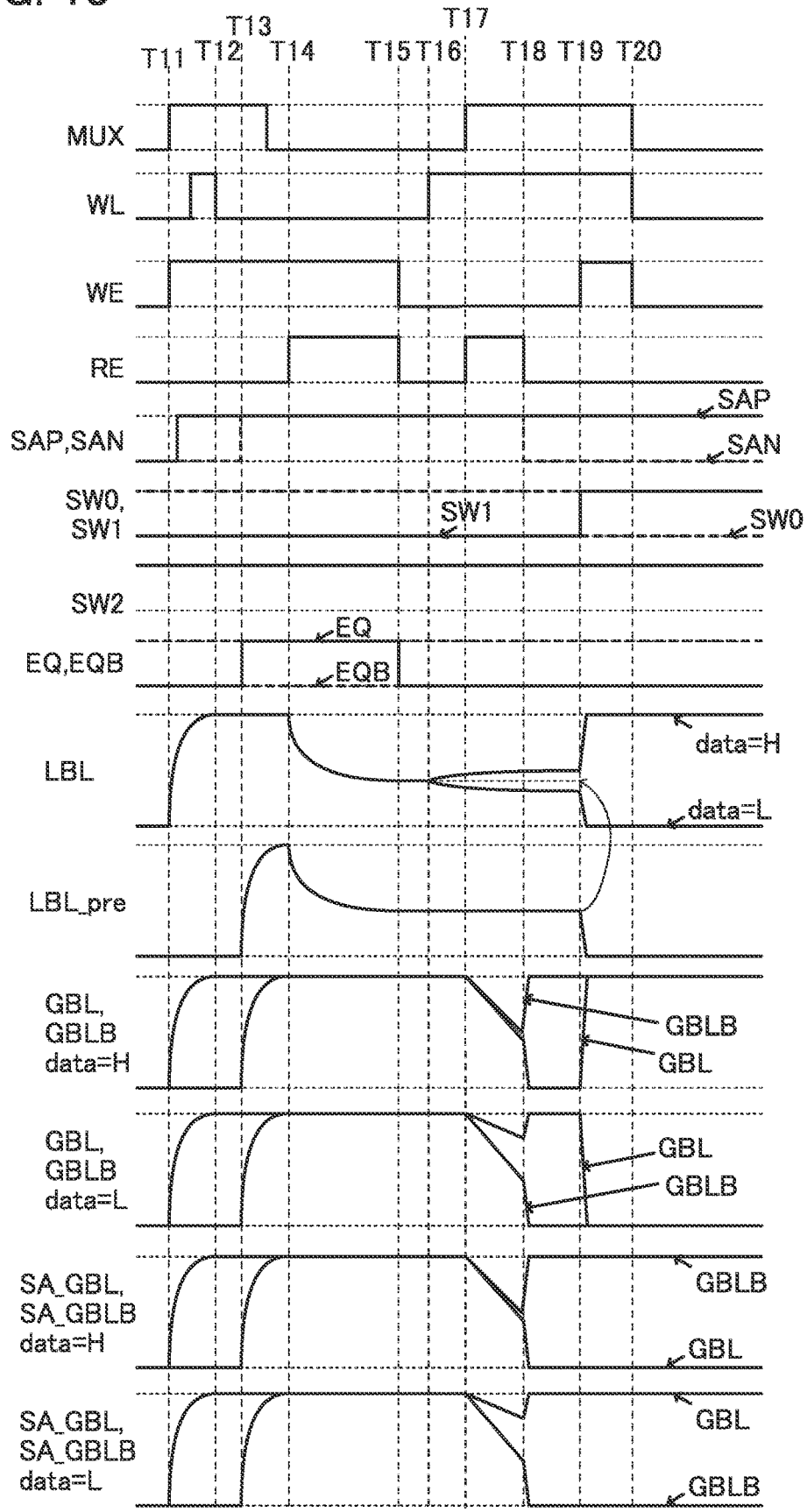
FIG. 18 is a timing chart illustrating a structure example of a semiconductor device.

FIG. 18 shows a timing chart for describing the operation of the circuit diagram illustrated in FIG. 17. Note that the timing chart in FIG. 18 illustrates a case where data is at H level (data=H) and a case where data is at L level (data=L), separately, for the wiring pair of the global bit line SA_GBL and the global bit line SA_GBLB and the wiring pair of the global bit line GBL and the global bit line GBLB.

In the timing chart in FIG. 18, Time T11 to Time T13 correspond to a period for data writing. In other words, the period corresponds to a period in which the operation described with reference to FIG. 4A is performed. Time T13 to Time T16 correspond to a correction period. In other words, the period corresponds to a period in which the operation described with reference to FIG. 5A is performed. Time T16 to Time T18 correspond to a period for data reading. In other words, the period corresponds to a period in which the operation described with reference to FIG. 8A is performed. Note that a signal CSEL is set to H level from Time T11 to T20.

In Time 11, the signal MUX and the signal WE are set to H level. The signals SW1 and SW2 are set to H level, and the signal SW0 is set to L level. Then, the power supply voltage (VDD, VSS) is supplied to the wirings SAP and SAN, whereby one of the wiring pair of the global bit line SA_GBL and the global bit line SA_GBLB or one of the wiring pair of the global bit line GBL and the global bit line GBLB is charged. The potential of local bit line LBL increases. While the potential of the word line WL is at H level, the potential supplied to the local bit line LBL (H level in the case of FIG. 18) is written to the memory cell 42.

In Time T12, the potential of the word line WL is set to L level. Data is retained in the memory cell 42.

In Time T13, the wirings SAP and SAN are set to have VDD, and the signals EQ and EQB are inverted, whereby both the wiring pair of the global bit line SA_GBL and the global bit line SA_GBLB and the wiring pair of the global bit line GBL and the global bit line GBLB are set to have H level. The local bit line LBL_pre is precharged to have a potential at H level. After that, the potential of the signal MUX is set at L level. The signal WE may be also set to low level.

In Time T14, the signal RE and the signal WE are set to H level. The potential of the local bit line LBL and the potential of the local bit line LBL_pre decrease by discharge through the transistor 31. This discharge is stopped at the time when the voltage between the gate and the source of the transistor 31 becomes equivalent to the threshold voltage of the transistor 31.

In Time T15, both the signal WE and the signal RE are set to L level. A potential corresponding to the threshold voltage of the transistor 31 is held in the local bit line LBL and the local bit line LBL_pre. The signals EQ and EQB are inverted again, and precharge is stopped. In other words, the wiring pair of the global bit line SA_GBL and the global bit line SA_GBLB and the wiring pair of the global bit line GBL and the global bit line GBLB are brought to an electrically floating state.

In Time T16, the word line WL is set to H level to perform charge sharing. The potential of the local bit line LBL varies depending on the data written to the memory cell 42. When H-level data is written to the memory cell 42, the potential of the local bit line LBL increases, and when L-level data is written to the memory cell 42, the potential of the local bit line LBL decreases. In contrast, the potential of the local bit line LBL_pre does not vary because the charge sharing by the operation of the word line WL is not performed.

In Time T17, the signal RE and the signal MUX are set to H level, whereby current flows through the transistor 31 included in the circuit 36 and the transistor 31 included in the circuit 36_pre in accordance with the potentials of the local bit line LBL and the local bit line LBL_pre. Since the potentials of the local bit line LBL and the local bit line LBL_pre differ, a difference is generated in the current flowing through the transistor 31 included in the circuit 36 and the current flowing through the transistor 31 included in the circuit 36_pre. The difference in the current corresponds to the potential of the local bit line LBL varying depending on the charge sharing, i.e., data read out from the memory cell 42. Thus, the data of the memory cell 42 can be converted into the amount of changes in the potentials of the wiring pair of the global bit line SA_GBL and the global bit line SA_GBLB and the wiring pair of the global bit line GBL and the global bit line GBLB, as shown in FIG. 18.

In Time T18, the signal RE is set to L level. Then, the power supply voltage (VDD, VSS) is supplied to the wirings SAP and SAN, whereby the sense amplifier 55 operates. When the sense amplifier 55 operates, the potentials of the wiring pair of the global bit line SA_GBL and the global bit line SA_GBLB and the potentials of the wiring pair of the global bit line GBL and the global bit line GBLB are determined.

In Time T19, the signal SW0 is set to L level, and the signal SW1 is set to H level, so that the potentials of the wiring pair of the global bit line GBL and the global bit line GBLB are switched in accordance with the read data. Specifically, when the data is at H level, the potentials of the wiring pair of the global bit line GBL and the global bit line GBLB are switched to H level. When the data is at L level, the potentials of the wiring pair of the global bit line GBL and the global bit line GBLB are switched to L level. By setting the word line WL to H level in this state, the voltage corresponding to the logic of read data can be restored to the memory cell 42.

In Time T20, the signal MUX, the signal WL, and the signal WE are set to L level. In the memory cell 42, data corresponding to the logic of read data can be refreshed.

Note that in the semiconductor device 10 of one embodiment of the present invention, the transistor layers 41_1 to 41_k each including the memory cell 42 are stacked. The structure enables reductions in the length of local bit line LBL and the capacitance of the capacitor 44 of the memory cell 42. Meanwhile, there is a possibility in the memory cell 42 that a variation in potential is caused due to parasitic capacitance between the gate and the source or drain of the transistor 43.

Figure 19A:
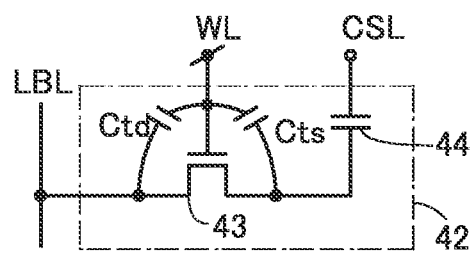
FIG. 19A, FIG. 19B, and FIG. 19C are a circuit diagram illustrating a structure example of a semiconductor device and timing charts.

FIG. 19A shows a circuit diagram in which the transistor 43, the capacitor 44, and the local bit line LBL included in the memory cell 42 are extracted. In FIG. 19A, parasitic capacitance between the gate and the source or drain of the transistor 43 is denoted by capacitance Ctd or Cts.

In accordance with the variation in the potential of the word line WL, the potential of the local bit line LBL in an electrically floating state varies depending on capacitive coupling of the capacitance Ctd or Cts. Such a variation in potential depending on the capacitive coupling becomes large particularly when the local bit line LBL is shortened and the capacitance of the capacitor 44 of the memory cell 42 is reduced.

Figure 19B:
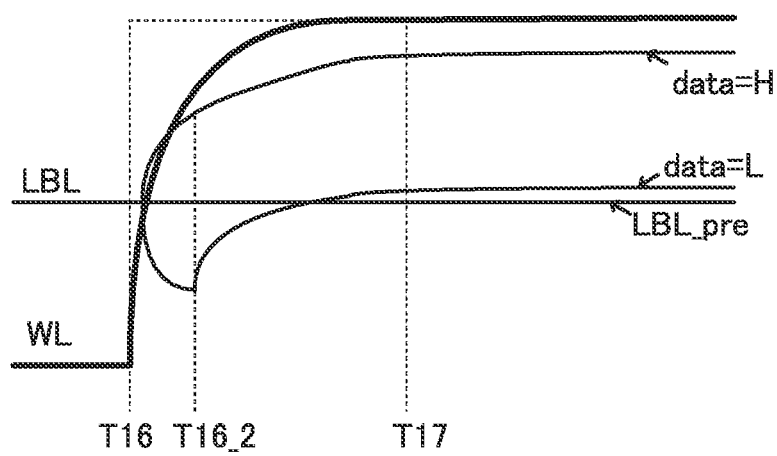

FIG. 19B shows a schematic diagram of waveforms for describing a variation in potential depending on the capacitive coupling. FIG. 19B shows variations in the potential of the local bit line LBL and the potential of the local bit line LBL_pre depending on a variation in the word line WL during a period from Time T16 to T17 in the timing chart illustrated in FIG. 18. As the change in the potential of the local bit line LBL, the case where H-level data is written to the memory cell 42 (data=H) and the case where the L-level data is written (data=L) are separately illustrated.

According to one embodiment of the present invention, reductions in the length of the local bit line LBL and the capacitance of the capacitor 44 of the memory cell 42 are possible as mentioned above; thus, the parasitic capacitance of the local bit line LBL and the capacitance of the capacitor 44 can be reduced. Therefore, the variation in the potential of the local bit line LBL is steeper than that of the potential of the word line WL. Specifically, the potential change of the local bit line LBL by charge sharing in Time T16 is steeper than that of the word line WL (Time T16_2). During the charge sharing, both the local bit line LBL and the capacitor 44 are in an electrically floating state; thus, the potential of the local bit line LBL increases in both cases of H-level data and L-level data, in accordance with an increase of the potential of the word line WL. In contrast, no change occurs in the potential of the local bit line LBL_pre on the side where the word line WL has no change in the potential.

An increase in potential of the local bit line LBL in accordance with an increase in the potential of the word line WL causes such a defect that the potential magnitude relationship between the local bit line LBL and the local bit line LBL_pre is reversed, that is, that in reading the L-level potential of the local bit line LBL, the potential exceeds the potential of the local bit line LBL_pre.

Figure 19C:
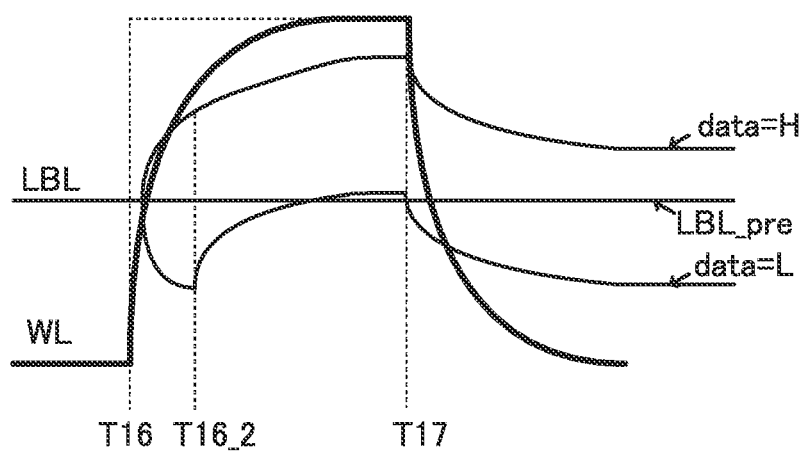

Therefore, it is preferable that the word line WL be switched from H level to L level in Time T17. In other words, the transistor 43 is preferably set in a non-conducting state during a period when the transistor 34 is brought to a conducting state to read data due to current flowing in the transistor 31. FIG. 19C shows a schematic diagram of waveforms for describing a change in potential of the local bit line LBL when the potential of the word line WL is switched from H level to L level in Time T17.

FIG. 19C shows that the potential variations of the word line WL, the local bit line LBL, and the local bit line LBL_pre after Time T16 to T16_2 are similar to those in FIG. 19B. In Time T17, the potential of the word line WL is switched from H level to L level. Since both the local bit line LBL and the capacitor 44 are in an electrically floating state in Time T17, the potentials of the local bit line LBL in both cases of H-level data and L-level data decrease in accordance with a decrease in the potential of the word line WL. In contrast, no change occurs in the potential of the local bit line LBL_pre on the side where the word line WL has no change in potential. The potential of the word line WL is inverted in Time T17 in this manner, whereby the potential magnitude relation between the local bit line LBL and the local bit line LBL_pre can be prevented from being reversed.

Figure 20:
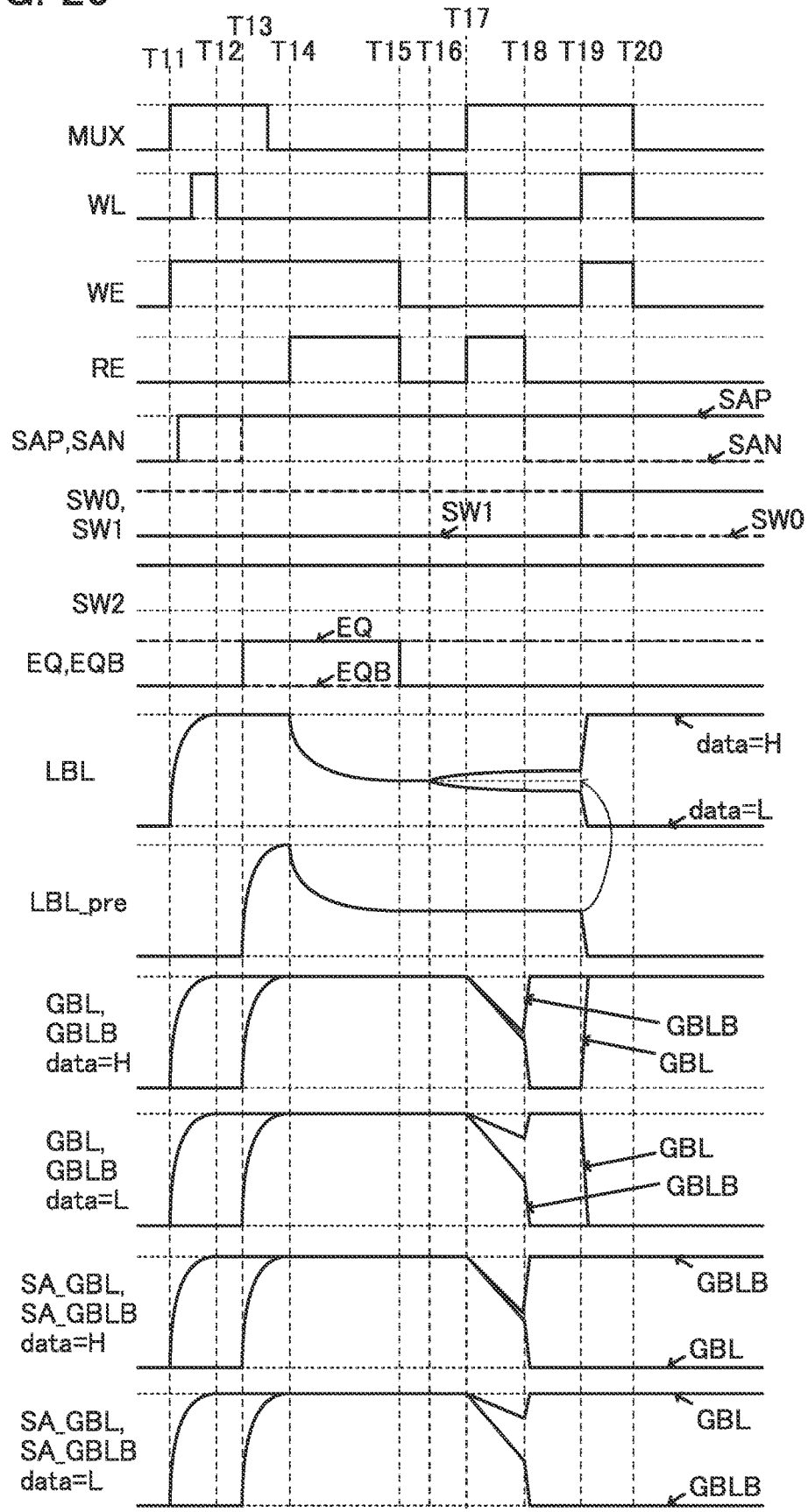
FIG. 20 is a timing chart illustrating a structure example of a semiconductor device.

The operation of the word line WL illustrated in FIG. 19C is applied to FIG. 18, whereby the operation of the timing chart shown in FIG. 20 can be conducted.

In the transistor layer including the memory cell and the correction circuit according to one embodiment of the present invention, the threshold voltage of the transistor for reading data can be read as a corrected signal. With this structure, the reliability of data read out from the memory cell to the driver circuit can be improved. Furthermore, a plurality of switches are arranged between a pair of global bit lines in the semiconductor device of one embodiment of the present invention, whereby data can be restored to the memory cell with the logic of data read out from the memory cell.

Embodiment 2

An example of a semiconductor device functioning as the memory device of one embodiment of the present invention will be described below.

Figure 21:
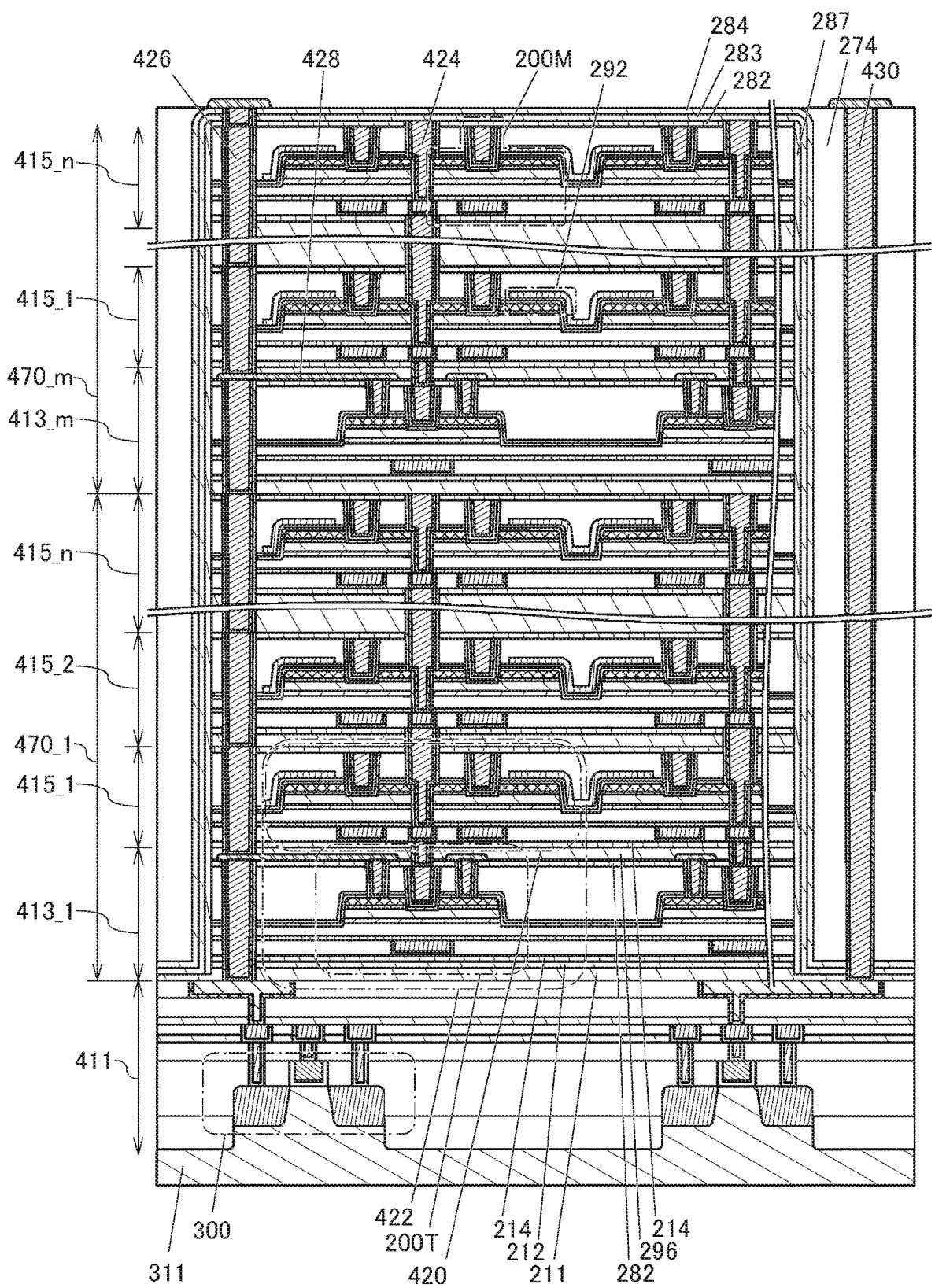
FIG. 21 is a schematic cross-sectional view illustrating a structure example of a semiconductor device.

FIG. 21 is a drawing showing an example of a semiconductor device in which memory units 470 (a memory unit 470_1 to a memory unit 470_m: m is a natural number greater than or equal to 2) are stacked over an element layer 411 including a circuit provided on a semiconductor substrate 311. FIG. 21 shows an example in which the element layer 411 and a plurality of memory units 470 over the element layer 411 are stacked; the plurality of memory units 470 are each provided with a corresponding transistor layer 413 (a transistor layer 413_1 to a transistor layer 413_m) and a plurality of memory device layers 415 (a memory device layer 415_1 to a memory device layer 415_n: n is a natural number greater than or equal to 2) over each transistor layer 413. Although the example in which the memory device layers 415 are provided over the transistor layer 413 in each of the memory units 470 is shown, this embodiment is not limited thereto. The transistor layer 413 may be provided over the plurality of memory device layers 415, or the memory device layers 415 may be provided over and below the transistor layer 413.

The element layer 411 includes a transistor 300 provided on the semiconductor substrate 311 and can function as a circuit (referred to as a peripheral circuit in some cases) of the semiconductor device. Examples of the circuit are a column driver, a row driver, a column decoder, a row decoder, a sense amplifier, a precharge circuit, an amplifier circuit, a word line driver circuit, an output circuit, and a control logic circuit.

Each transistor layer 413 includes a transistor 200T and can function as a circuit for controlling each of the memory units 470. Each memory device layer 415 includes a memory device 420. The memory device 420 described in this embodiment includes a transistor 200M and a capacitive element 292.

Although not particularly limited, m described above is greater than or equal to 2 and less than or equal to 100, preferably greater than or equal to 2 and less than or equal to 50, further preferably greater than or equal to 2 and less than or equal to 10. Although not particularly limited, n described above is greater than or equal to 2 and less than or equal to 100, preferably greater than or equal to 2 and less than or equal to 50, further preferably greater than or equal to 2 and less than or equal to 10. The product of m and n described above is greater than or equal to 4 and less than or equal to 256, preferably greater than or equal to 4 and less than or equal to 128, further preferably greater than or equal to 4 and less than or equal to 64.

FIG. 21 shows a cross-sectional view in the channel length direction of the transistor 200T and the transistor 200M included in the memory unit.

As illustrated in FIG. 21, the transistor 300 is provided on the semiconductor substrate 311, the transistor layer 413 and the memory device layer 415 included in the memory unit 470 are provided over the transistor 300, and in one memory unit 470, the transistor 200T included in the transistor layer 413 and the memory device 420 included in the memory device layer 415 are electrically connected via a plurality of conductors 424. The transistor 300 and the transistor 200T included in the transistor layer 413 in each memory unit 470 are electrically connected via a conductor 426. It is preferable that the conductor 426 be electrically connected to the transistor 200T via a conductor 428 electrically connected to any one of a source, a drain, and a gate of the transistor 200T. It is preferable that the conductor 424 be provided in each memory device layer 415. Furthermore, it is preferable that the conductor 426 be provided in each transistor layer 413 and each memory device layer 415.

Although details are described later, it is preferable to provide an insulator that inhibits the passage of oxygen or impurities such as water or hydrogen on side surfaces of the conductor 424 and the conductor 426. As such insulators, silicon nitride, aluminum oxide, or silicon nitride oxide may be used.

The memory device 420 includes the transistor 200M and the capacitive element 292, and the transistor 200M can have a structure similar to that of the transistor 200T included in the transistor layer 413. The transistor 200T and the transistor 200M are collectively referred to as transistors 200 in some cases.

Here, in the transistor 200, a metal oxide functioning as an oxide semiconductor (hereinafter also referred to as an oxide semiconductor) is preferably used for a semiconductor which includes a region where a channel is formed (hereinafter also referred to as a channel formation region).

As the oxide semiconductor, for example, a metal oxide such as an In-M-Zn oxide (the element M is one or more of aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. As the oxide semiconductor, an indium oxide, an In-Ga oxide or an In—Zn oxide may be used. Note that when an oxide semiconductor having high proportion of indium is used, the on-state current, the field-effect mobility, or the like of the transistor can be increased.

The transistor 200 including an oxide semiconductor in its channel formation region has an extremely low leakage current in an off state; thus, a semiconductor device with low power consumption can be provided. An oxide semiconductor can be deposited by a sputtering method or the like and thus can be used in the transistor 200 included in a highly integrated semiconductor device.

In contrast, a transistor including an oxide semiconductor easily has normally-on characteristics (characteristics such that a channel exists without voltage application to a gate electrode and current flows in a transistor) owing to an impurity and an oxygen vacancy (Vo) in the oxide semiconductor that change the electrical characteristics.

In view of this, an oxide semiconductor with a reduced impurity concentration and a reduced density of defect states is preferably used. Note that in this specification and the like, a state with a low impurity concentration and a low density of defect states is referred to as a highly purified intrinsic or substantially highly purified intrinsic state.

Accordingly, the impurity concentration in the oxide semiconductor is preferably reduced as much as possible. Examples of impurities contained in the oxide semiconductor include hydrogen, nitrogen, alkali metal, alkaline earth metal, iron, nickel, and silicon.

Specifically, hydrogen as an impurity which is contained in the oxide semiconductor might form an oxygen vacancy in the oxide semiconductor. In some cases, a defect that is an oxygen vacancy into which hydrogen enters (hereinafter sometimes referred to as VoH) generates an electron serving as a carrier. In other cases, reaction between part of hydrogen and oxygen bonded to a metal atom generates an electron serving as a carrier.

Thus, a transistor including an oxide semiconductor that contains a large amount of hydrogen is likely to have normally-on characteristics. Moreover, hydrogen in an oxide semiconductor is easily transferred by a stress such as heat or an electric field; thus, a large amount of hydrogen in an oxide semiconductor might reduce the reliability of the transistor.

Therefore, the transistor 200 preferably uses a highly purified intrinsic oxide semiconductor in which oxygen vacancies and impurities such as hydrogen are reduced.

<Sealing Structure>

In view of the above, the transistor 200 is preferably sealed using a material that inhibits diffusion of impurities (hereinafter also referred to as an impurity barrier material) in order to inhibit entry of impurities from the outside.

A barrier property in this specification means a function of inhibiting diffusion of a targeted substance (also referred to as having lower permeability). Alternatively, a barrier property in this specification means a function of trapping or fixing (also referred to as gettering) a targeted substance.

Examples of a material that has a function of inhibiting diffusion of hydrogen and oxygen include aluminum oxide, hafnium oxide, gallium oxide, indium gallium zinc oxide, silicon nitride, and silicon nitride oxide. It is particularly preferable to use silicon nitride or silicon nitride oxide as a sealing material because of their high barrier properties against hydrogen.

Examples of a material having a function of trapping and fixing hydrogen include metal oxides such as aluminum oxide, hafnium oxide, gallium oxide, and indium gallium zinc oxide.

As layers having a barrier property, an insulator 211, an insulator 212, and an insulator 214 are preferably provided between the transistor 300 and the transistor 200. A material that inhibits the diffusion or passage of impurities such as hydrogen is used for at least one of the insulator 211, the insulator 212, and the insulator 214, whereby impurities such as hydrogen or water included in the semiconductor substrate 311, the transistor 300, or the like can be inhibited from being diffused into the transistor 200. Furthermore, a material that inhibits the passage of oxygen is used for at least one of the insulator 211, the insulator 212, and the insulator 214, whereby oxygen included in the channel of the transistor 200 or the transistor layer 413 can be inhibited from being diffused into the element layer 411. For example, it is preferable to use a material that inhibits the passage of impurities such as hydrogen or water for the insulator 211 and the insulator 212 and to use a material that inhibits the passage of oxygen for the insulator 214. Furthermore, it is further preferable to use a material having a property of extracting and occluding hydrogen for the insulator 214. As the insulator 211 and the insulator 212, a nitride such as silicon nitride or silicon nitride oxide can be used, for example. As the insulator 214, a metal oxide such as aluminum oxide, hafnium oxide, gallium oxide, or indium gallium zinc oxide can be used, for example. In particular, aluminum oxide is preferably used for the insulator 214.

In addition, an insulator 287 is preferably provided on a side surface of each transistor layer 413 and a side surface of each memory device layer 415, that is, a side surface of each memory unit 470, and an insulator 282 is preferably provided on an top surface of the memory unit 470. In this structure, the insulator 282 is preferably in contact with the insulator 287, and the insulator 287 is preferably in contact with at least one of the insulator 211, the insulator 212, and the insulator 214. For the insulator 287 and the insulator 282, a material that can be used for the insulator 214 is preferably used.

An insulator 283 and an insulator 284 are preferably provided to cover the insulator 282 and the insulator 287, and the insulator 283 is preferably in contact with at least one of the insulator 211, the insulator 212, and the insulator 214. Although an example in which the insulator 287 is in contact with a side surface of the insulator 214, a side surface of the insulator 212, and a top surface and a side surface of the insulator 211 and the insulator 283 is in contact with a top surface and a side surface of the insulator 287 and the top surface of the insulator 211 is shown in FIG. 21, this embodiment is not limited thereto. The insulator 287 may be in contact with the side surface of the insulator 214 and a top surface and the side surface of the insulator 212, and the insulator 283 may be in contact with a top surface and the side surface of the insulator 287 and the top surface of the insulator 212. For the insulator 282 and the insulator 287, a material that can be used for the insulator 211 and the insulator 212 is preferably used.

In the above structure, a material that can inhibit the passage of oxygen is preferably used for the insulator 287 and the insulator 282. For the insulator 287 and the insulator 282, it is further preferable to use a material having a property of trapping and fixing hydrogen. When a material having a function of trapping and fixing hydrogen is used on a side closer to the transistor 200, hydrogen in the transistor 200 or the memory unit 470 is trapped and fixed by the insulator 214, the insulator 287, and the insulator 282, whereby the hydrogen concentration in the transistor 200 can be reduced. Furthermore, for the insulator 283 and the insulator 284, a material that inhibits the passage of impurities such as hydrogen or water is preferably used.

With the above structure, the memory unit 470 is surrounded by the insulator 211, the insulator 212, the insulator 214, the insulator 287, the insulator 282, the insulator 283, and the insulator 284. Specifically, the memory unit 470 is surrounded by the insulator 214, the insulator 287, and the insulator 282 (denoted by a first structure body in some cases), the memory unit 470 and the first structure body are surrounded by the insulator 211, the insulator 212, the insulator 283, and the insulator 284 (denoted by a second structure body in some cases). Such a structure in which the memory unit 470 is surrounded by two or more structure bodies is referred to as a nested structure in some cases. Here, a state where the memory unit 470 is surrounded by a plurality of structure bodies is denoted by a state where the memory unit 470 is sealed by a plurality of insulators, in some cases.

The second structure body seals the transistor 200 with the first structure body therebetween. Thus, the second structure body inhibits hydrogen existing outward the second structure body from being diffused into an inside of the second structure body (to the transistor 200 side). That is, the first structure body can efficiently trap and fix hydrogen existing in an internal structure of the second structure body.

In the above structure, specifically, a metal oxide such as aluminum oxide can be used for the first structure body and a nitride such as silicon nitride can be used for the second structure body. More specifically, an aluminum oxide film is preferably provided between the transistor 200 and a silicon nitride film.

Furthermore, by appropriately setting deposition conditions for the material used for the structure bodies, their hydrogen concentrations can be reduced.

In general, a film deposited by a CVD method has more favorable coverage than a film deposited by a sputtering method. On the other hand, many compound gases used for a CVD method contain hydrogen and a film deposited by a CVD method has higher hydrogen content than a film formed by a sputtering method.

Accordingly, it is preferable to use a film with a reduced hydrogen concentration (specifically, a film formed by a sputtering method) as a film which is close to the transistor 200, for example. Meanwhile, in the case where a film that has favorable coverage as well as a relatively high hydrogen concentration (specifically, a film deposited by a CVD method) is used as a film for inhibiting impurity diffusion, it is preferable that a film having a function of trapping and fixing hydrogen and a reduced hydrogen concentration be provided between the transistor 200 and the film that has favorable coverage as well as a relatively high hydrogen concentration.

In other words, a film with a relatively low hydrogen concentration is preferably used as the film which is close to the transistor 200. In contrast, a film with a relatively high hydrogen concentration is preferably provided apart from the transistor 200.

When the above structure is employed and specifically, the transistor 200 is sealed with a silicon nitride film deposited by a CVD method, an aluminum oxide film deposited by a sputtering method is preferably provided between the transistor 200 and the silicon nitride film deposited by a CVD method. It is further preferable that a silicon nitride film deposited by a sputtering method be provided between the silicon nitride film deposited by a CVD method and the aluminum oxide film deposited by a sputtering method.

Note that in the case where a CVD method is employed for deposition, a compound gas containing no hydrogen atom or having a low hydrogen atom content may be used for the deposition to reduce the hydrogen concentration of the deposited film.

Furthermore, the insulator 282 and the insulator 214 are preferably provided also between each transistor layer 413 and the memory device layer 415 or between the memory device layers 415. An insulator 296 is preferably provided between the insulator 282 and the insulator 214. A material similar to those for the insulator 283 and the insulator 284 can be used for the insulator 296. Alternatively, silicon oxide or silicon oxynitride can be used. Alternatively, a known insulating material may be used. Here, the insulator 282, the insulator 296, and the insulator 214 may be elements included in the transistor 200. It is preferable that the insulator 282, the insulator 296, and the insulator 214 also serve as components of the transistor 200 in order to reduce the number of steps for manufacturing the semiconductor device.

It is preferable that the insulator 287 be in contact with the side surfaces of the insulator 282, the insulator 296, and the insulator 214 provided between each transistor layer 413 and the memory device layer 415 or between the memory device layers 415. With such a structure, each transistor layer 413 and each memory device layer 415 are surrounded and sealed by the insulator 282, the insulator 296, the insulator 214, the insulator 287, the insulator 283, and the insulator 284.

Furthermore, an insulator 274 may be provided around the insulator 284. Moreover, a conductor 430 may be provided to be embedded in the insulator 274, the insulator 284, the insulator 283, and the insulator 211. The conductor 430 is electrically connected to the transistor 300, that is, the circuit included in the element layer 411.

Furthermore, since the capacitive element 292 is formed in the same layer as the transistor 200M in the memory device layers 415, the height of the memory device 420 can be approximately equal to that of the transistor 200M; thus, the height of each memory device layer 415 can be prevented from being excessively increased. Thus, the number of memory device layers 415 can be increased relatively easily. For example, the number of stacked structures each including the transistor layer 413 and the memory device layers 415 can be approximately 100.

<Transistor 200>

Figure 22A:
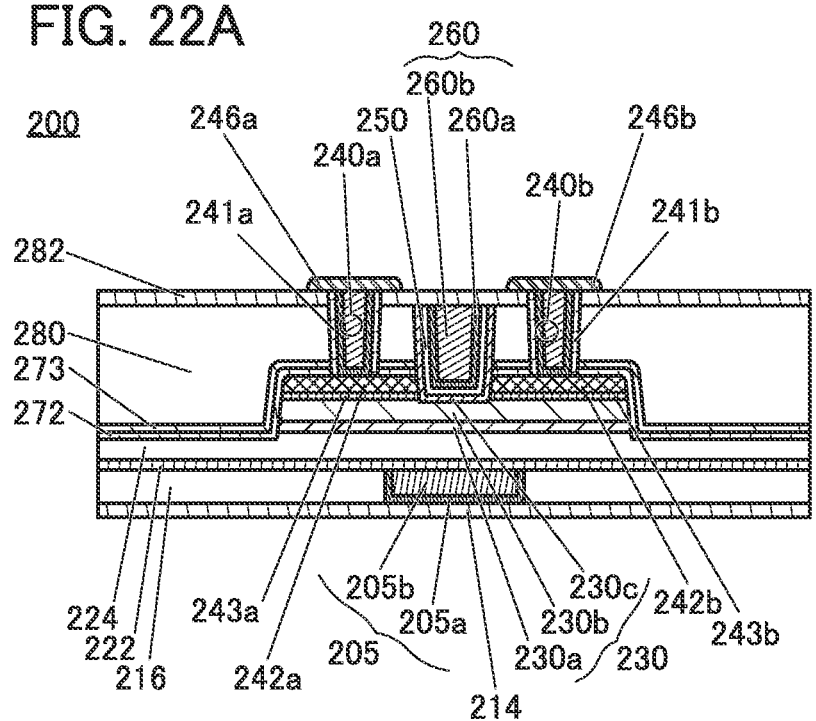
FIG. 22A and FIG. 22B are schematic cross-sectional views illustrating structure examples of semiconductor devices.

With reference to FIG. 22A, will be described the transistor 200 that can be used for the transistor 200T included in the transistor layer 413 and the transistor 200M included in the memory device 420.

As illustrated in FIG. 22A, the transistor 200 includes an insulator 216, a conductor 205 (a conductor 205a and a conductor 205b), an insulator 222, an insulator 224, an oxide 230 (an oxide 230a, an oxide 230b, and an oxide 230c), a conductor 242 (a conductor 242a and a conductor 242b), an oxide 243 (an oxide 243a and an oxide 243b), an insulator 272, an insulator 273, an insulator 250, and a conductor 260 (a conductor 260a and a conductor 260b).

The insulator 216 and the conductor 205 are provided over the insulator 214, and an insulator 280 and the insulator 282 are provided over the insulator 273. The insulator 214, the insulator 280, and the insulator 282 can be regarded as part of the transistor 200.

The semiconductor device of one embodiment of the present invention also includes a conductor 240 (a conductor 240a and a conductor 240b) electrically connected to the transistor 200 and functioning as a plug. Note that an insulator 241 (an insulator 241a and an insulator 241b) is provided in contact with a side surface of the conductor 240 functioning as a plug. A conductor 246 (a conductor 246a and a conductor 246b) electrically connected to the conductor 240 and functioning as a wiring is provided over the insulator 282 and the conductor 240.

The conductor 240a and the conductor 240b are each preferably formed using a conductive material containing tungsten, copper, or aluminum as its main component. The conductor 240a and the conductor 240b may each have a stacked-layer structure.

When the conductor 240 has a stacked-layer structure, it is preferable to use a conductive material having a function of inhibiting penetration of oxygen and impurities such as water or hydrogen. For example, tantalum, tantalum nitride, titanium, titanium nitride, ruthenium, or ruthenium oxide is preferably used. The conductive material having a function of inhibiting penetration of oxygen and impurities such as water or hydrogen may have a single-layer structure or a stacked-layer structure. With use of the conductive material, entry of impurities such as water or hydrogen diffused from the insulator 280 or the like into the oxide 230 through the conductor 240a and the conductor 240b can be further reduced. Furthermore, oxygen added to the insulator 280 can be prevented from being absorbed by the conductor 240a and the conductor 240b.

For the insulator 241 provided in contact with the conductor 240, for example, silicon nitride, aluminum oxide, silicon nitride oxide, or the like can be used. Since the insulator 241 is provided in contact with the insulator 272 and the insulator 273, the insulator 280, and the insulator 282, impurities such as water or hydrogen can be inhibited from being mixed into the oxide 230 through the conductor 240a and the conductor 240b from the insulator 280 or the like. In particular, silicon nitride is suitable because of having a high blocking property against hydrogen. Furthermore, oxygen contained in the insulator 280 can be prevented from being absorbed by the conductor 240a and the conductor 240b.

The conductor 246 is preferably formed using a conductive material containing tungsten, copper, or aluminum as its main component. Furthermore, the conductor may have a stacked-layer structure and may be a stack of titanium or a titanium nitride and any of the above conductive materials, for example. Note that the conductor may be formed to be embedded in an opening provided in an insulator.

In the transistor 200, the conductor 260 functions as a first gate of the transistor and the conductor 205 functions as a second gate of the transistor. The conductor 242a and the conductor 242b serve as a source electrode and a drain electrode.

The oxide 230 functions as a semiconductor including a channel formation region.

The insulator 250 function as a first gate insulator, and the insulator 222 and the insulator 224 function as a second gate insulator.

Here, in the transistor 200 illustrated in FIG. 22A, the conductor 260 is formed in a self-aligned manner in an opening provided in the insulator 280, the insulator 273, the insulator 272, the conductor 242, and the like, with the oxide 230c and the insulator 250 positioned therebetween.

That is, since the conductor 260 is formed to fill the opening provided in the insulator 280 and the like with the oxide 230c and the insulator 250 therebetween, the position alignment of the conductor 260 in a region between the conductor 242a and the conductor 242b is not needed.

The oxide 230c is preferably provided in the opening that is provided in the insulator 280 and the like. Thus, the insulator 250 and the conductor 260 include a region that overlaps with a stacked-layer structure of the oxide 230b and the oxide 230a with the oxide 230c therebetween. When this structure is employed, the oxide 230c and the insulator 250 can be sequentially formed and thus, the interface between the oxide 230 and the insulator 250 can be kept clean. Accordingly, the influence of interface scattering on carrier conduction is small, and the transistor 200 can have a high on-state current and high frequency characteristics.

In the transistor 200 illustrated in FIG. 22A, a bottom surface and a side surface of the conductor 260 are in contact with the insulator 250. Furthermore, a bottom surface and a side surface of the insulator 250 are in contact with the oxide 230c.

In addition, the insulator 282 and the oxide 230c are in direct contact with each other in the transistor 200 as illustrated in FIG. 22A. Owing to this structure, diffusion of oxygen contained in the insulator 280 to the conductor 260 can be inhibited.

Therefore, oxygen contained in the insulator 280 can be efficiently supplied to the oxide 230a and the oxide 230b through the oxide 230c, which can reduce oxygen vacancies in the oxide 230a and the oxide 230b and improve the electrical characteristics and reliability of the transistor 200.

The structure of the semiconductor device including the transistor 200 of one embodiment of the present invention is described in detail below.

In the transistor 200, a metal oxide functioning as an oxide semiconductor (hereinafter also referred to as an oxide semiconductor) is preferably used for the oxide 230 (the oxide 230a, the oxide 230b, and the oxide 230c), which includes a channel formation region.

For example, the metal oxide functioning as an oxide semiconductor preferably has an energy gap of 2 eV or more, further preferably 2.5 eV or more. With use of a metal oxide having a wide energy gap, leakage current in a non-conduction state (off-state current) of the transistor 200 can be extremely small. With use of such a transistor, a semiconductor device with low power consumption can be provided.

Specifically, as the oxide 230, a metal oxide such as an In-M-Zn oxide (the element M is one or more of aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, aluminum, gallium, yttrium, or tin is preferably used as the element M. Alternatively, an In-M oxide, an In—Zn oxide, or an M-Zn oxide may be used as the oxide 230.

As illustrated in FIG. 22A, the oxide 230 preferably includes the oxide 230a over the insulator 224, the oxide 230b over the oxide 230a, and the oxide 230c that is over the oxide 230b and at least part of which is in contact with the top surface of the oxide 230b. Note that the side surface of the oxide 230c is preferably in contact with the oxide 243a, the oxide 243b, the conductor 242a, the conductor 242b, the insulator 272, the insulator 273, and the insulator 280.

That is, the oxide 230 includes the oxide 230a, the oxide 230b over the oxide 230a, and the oxide 230c over the oxide 230b. Including the oxide 230a below the oxide 230b makes it possible to inhibit diffusion of impurities into the oxide 230b from the components formed below the oxide 230a. Moreover, the oxide 230c included over the oxide 230b can inhibit diffusion of impurities into the oxide 230b from the components formed above the oxide 230c.

The transistor 200 has a structure in which the three layers of the oxide 230a, the oxide 230b, and the oxide 230c are stacked in a channel formation region and its vicinity; however, the present invention is not limited to this structure. For example, the transistor 200 may include a single layer of the oxide 230b, a two-layer stack of the oxide 230b and the oxide 230a, a two-layer stack of the oxide 230b and the oxide 230c, or a four or more-layer stack. For example, the transistor 200 may include a four-layer stack including the oxide 230c with a two-layer structure.

The oxide 230 preferably has a stacked-layer structure of oxide layers which differ in the atomic ratio of metal atoms. Specifically, the atomic ratio of the element M to constituent elements in the metal oxide used as the oxide 230a is preferably greater than that in the metal oxide used as the oxide 230b. Moreover, the atomic ratio of the element M to In in the metal oxide used as the oxide 230a is preferably greater than the atomic ratio of the element M to In in the metal oxide used as the oxide 230b. Furthermore, the atomic ratio of In to the element M in the metal oxide used as the oxide 230b is preferably greater than the atomic ratio of In to the element M in the metal oxide used as the oxide 230a. The oxide 230c can be formed using a metal oxide which can be used as the oxide 230a or the oxide 230b.

Specifically, as the oxide 230a, a metal oxide having In:Ga:Zn=1:3:4 [atomic ratio] or a composition in the vicinity thereof, or 1:1:0.5 [atomic ratio] or a composition in the vicinity thereof is used.

As the oxide 230b, a metal oxide having In:Ga:Zn=4:2:3 [atomic ratio] or a composition in the vicinity thereof, or 1:1:1 [atomic ratio] or a composition in the vicinity thereof is used. As the oxide 230b, a metal oxide having In:Ga:Zn=5:1:3 [atomic ratio] or a composition in the vicinity thereof, or In:Ga:Zn=10:1:3 or a composition in the vicinity thereof may be used. As the oxide 230b, an In—Zn oxide (having In:Zn=2:1 [atomic ratio] or a composition in the vicinity thereof, In:Zn=5:1 [atomic ratio] or a composition in the vicinity thereof, or In:Zn=10:1 [atomic ratio] or a composition in the vicinity thereof, for example) may be used. As the oxide 230b, an In oxide may be used.

As the oxide 230c, a metal oxide having In:Ga:Zn=1:3:4 [atomic ratio or a composition in the vicinity thereof], Ga:Zn=2:1 [atomic ratio] or a composition in the vicinity thereof, or Ga:Zn=2:5 [atomic ratio] or a composition in the vicinity thereof is used. A single layer or stacked layers of the material that can be used for the oxide 230b may be used for the oxide 230c. Specific examples of the oxide 230c having a stacked-layer structure include a stacked-layer structure of In:Ga:Zn=4:2:3 [atomic ratio] or a composition in the vicinity thereof and In:Ga:Zn=1:3:4 [atomic ratio] or a composition in the vicinity thereof, a stacked-layer structure of Ga:Zn=2:1 [atomic ratio] or a composition in the vicinity thereof and In:Ga:Zn=4:2:3 [atomic ratio] or a composition in the vicinity thereof, a stacked-layer structure of Ga:Zn=2:5 [atomic ratio] or a composition in the vicinity thereof and In:Ga:Zn=4:2:3 [atomic ratio] or a composition in the vicinity thereof, and a stacked-layer structure of gallium oxide and In:Ga:Zn=4:2:3 [atomic ratio] or a composition in the vicinity thereof.

Note that an OS transistor included in the memory cell 42 and an OS transistor included in the transistor layer 30 which are described in Embodiment 1 may be different in structure from each other. For example, as the oxide 230c included in the OS transistor provided in the memory cell 42, a metal oxide having In:Ga:Zn=4:2:3 [atomic ratio] or a composition in the vicinity thereof may be used, and as the oxide 230c included in the OS transistor provided in the transistor layer 30, a metal oxide having In:Ga:Zn=5:1:3 [atomic ratio] or a composition in vicinity thereof, In:Ga:Zn=10:1:3 [atomic ratio] or a composition in the vicinity thereof, In:Zn=10:1 [atomic ratio] or a composition in the vicinity thereof, In:Zn=5:1 [atomic ratio] or a composition in the vicinity thereof, or In:Zn=2:1 [atomic ratio] or a composition in the vicinity thereof may be used.

In the oxide 230b and the oxide 230c, increasing the ratio of indium in the films is favorable to increase the on-state current, the field-effect mobility, or the like of the transistor. Moreover, the above-described composition in the vicinity includes ±30% of the intended atomic ratio.

The oxide 230b may have crystallinity. For example, a CAAC-OS (c-axis aligned crystalline oxide semiconductor) described later is preferably used. An oxide having crystallinity, such as a CAAC-OS, has a dense structure with small amounts of impurities and defects (e.g., oxygen vacancies) and high crystallinity. This can inhibit oxygen extraction from the oxide 230b by the source electrode or the drain electrode. This inhibits extraction of oxygen from the oxide 230b even when heat treatment is performed; hence, the transistor 200 is stable with respect to high temperatures in the manufacturing process (i.e., thermal budget).

The conductor 205 is positioned to overlap with the oxide 230 and the conductor 260. Furthermore, the conductor 205 is preferably embedded in the insulator 216.

In the case where the conductor 205 functions as a gate electrode, by changing a potential applied to the conductor 205 independently of a potential applied to the conductor 260, the threshold voltage (Vth) of the transistor 200 can be controlled. In particular, by applying a negative potential to the conductor 205, Vth of the transistor 200 can be further increased, and the off-state current can be reduced. Thus, a drain current at the time when a potential applied to the conductor 260 is 0 V can be lower in the case where a negative potential is applied to the conductor 205 than in the case where the negative potential is not applied to the conductor 205.

As shown in FIG. 22A, the conductor 205 is preferably larger than the region of the oxide 230 not overlapping with the conductor 242a or the conductor 242b. Although not illustrated, the conductor 205 preferably extends to a region beyond the oxide 230a and the oxide 230b in the channel width direction of the oxide 230. That is, the conductor 205 and the conductor 260 preferably overlap with each other with the insulators therebetween outside a side surface of the oxide 230 in the channel width direction. Forming the conductor 205 with a large area can reduce local charging (charge up) in a treatment using plasma of a manufacturing step after forming the conductor 205 in some cases. Note that one embodiment of the present invention is not limited thereto. The conductor 205 overlaps with at least the oxide 230 positioned between the conductor 242a and the conductor 242b.

When the bottom surface of the insulator 224 is used as a benchmark, the bottom surface of the conductor 260 in a region not overlapping with the oxide 230a or the oxide 230b is preferably positioned below the bottom surface of the oxide 230b.

As not illustrated, in the channel width direction, when the conductor 260 functioning as a gate covers a side surface and a top surface of the oxide 230b in the channel formation region with the oxide 230c and the insulator 250 therebetween, the electric field generated from the conductor 260 is likely to affect the entire channel formation region formed in the oxide 230b. Accordingly, the transistor 200 can have a higher on-state current and higher frequency characteristics. In this specification, such a transistor structure in which the channel formation region is electrically surrounded by the electric fields of the conductor 260 and the conductor 205 is referred to as surrounded channel (S-channel) structure.

The conductor 205a is preferably a conductor that inhibits penetration of oxygen and impurities such as water or hydrogen. For example, the conductor 205a can be formed using titanium, titanium nitride, tantalum, or tantalum nitride. Moreover, the conductor 205b is preferably formed using a conductive material containing tungsten, copper, or aluminum as its main component. The conductor 205 has a two-layer structure in the drawing but may have a multilayer structure of three or more layers.

Note that the oxide semiconductor, the insulator or conductor positioned below the oxide semiconductor, and the insulator or conductor positioned over the oxide semiconductor are preferably successively formed without exposure to the air, in which case a substantially highly purified intrinsic oxide semiconductor film with a reduced concentration of impurities (in particular, hydrogen and water) can be formed.

At least one of the insulator 222, the insulator 272, and the insulator 273 preferably functions as a barrier insulating film that inhibits entry of impurities such as water or hydrogen into the transistor 200 from the substrate side or from above the transistor 200. Therefore, at least one of the insulator 222, the insulator 272, and the insulator 273 is preferably formed using an insulating material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom, that is, an insulating material through which the above impurities are less likely to pass. Alternatively, it is preferable to use an insulating material having a function of inhibiting diffusion of oxygen (e.g., at least one of an oxygen atom, an oxygen molecule, and the like) (through which the above oxygen is less likely to pass).

For example, it is preferable that silicon nitride, silicon nitride oxide, or the like be used for the insulator 273 and that aluminum oxide, hafnium oxide, or the like be used for the insulator 222 and the insulator 272.

Accordingly, it is possible to inhibit diffusion of impurities such as water or hydrogen to the transistor 200 side from the substrate side through the insulator 222. It is also possible to inhibit diffusion of oxygen contained in the insulator 224 and the like to the substrate side through the insulator 222.

Impurities such as water or hydrogen can be inhibited from diffusing to the transistor 200 side from the insulator 280 and the like, which are positioned with the insulator 272 and the insulator 273 therebetween. In this manner, the transistor 200 is preferably surrounded by the insulator 272 and the insulator 273 that have a function of inhibiting diffusion of oxygen and impurities such as water or hydrogen.

Here, it is preferable that the insulator 224 in contact with the oxide 230 release oxygen by heating. In this specification, oxygen that is released by heating is referred to as excess oxygen in some cases. For example, silicon oxide, silicon oxynitride, or the like may be used for the insulator 224 as appropriate. When an insulator containing oxygen is provided in contact with the oxide 230, oxygen vacancies in the oxide 230 can be reduced and the reliability of the transistor 200 can be improved.

Specifically, the insulator 224 is preferably formed using an oxide material that releases part of oxygen by heating. An oxide that releases oxygen by heating is an oxide film in which the number of released oxygen molecules is greater than or equal to $1.0 \times 10^{18}$ molecules/$cm^3$, preferably greater than or equal to $1.0 \times 10^{19}$ molecules/$cm^3$, further preferably greater than or equal to $2.0 \times 10^{19}$ molecules/$cm^3$ or greater than or equal to $3.0 \times 10^{20}$ molecules/$cm^3$ in thermal desorption spectroscopy analysis (TDS analysis). Note that the temperature of the film surface in the TDS analysis is preferably within the range of from 100° C. to 700° C., or from 100° C. to 400° C.

The insulator 222 preferably functions as a barrier insulating film that inhibits entry of impurities such as water or hydrogen into the transistor 200 from the substrate side. For example, the insulator 222 preferably has a lower hydrogen permeability than the insulator 224. When the insulator 224, the oxide 230, and the like are surrounded by the insulator 222 and the insulator 283, entry of impurities such as water or hydrogen into the transistor 200 from the outside can be inhibited.

Furthermore, the insulator 222 preferably has a function of inhibiting diffusion of oxygen (e.g., at least one of oxygen atoms, oxygen molecules, and the like); that is, it is preferable that oxygen is less likely to pass through the insulator 222. For example, the insulator 222 preferably has a lower oxygen permeability than the insulator 224. The insulator 222 preferably has a function of inhibiting diffusion of oxygen or impurities, in which case diffusion of oxygen contained in the oxide 230 into a layer under the insulator 222 can be reduced. Moreover, the conductor 205 can be inhibited from reacting with oxygen contained in the insulator 224 and the oxide 230.

As the insulator 222, an insulator containing an oxide of one or both of aluminum and hafnium, which is an insulating material, is preferably used. As the insulator containing an oxide of one or both of aluminum and hafnium, aluminum oxide, hafnium oxide, an oxide containing aluminum and hafnium (hafnium aluminate), or the like is preferably used. The insulator 222 formed using such a material functions as a layer that inhibits release of oxygen from the oxide 230 and entry of impurities such as hydrogen from the periphery of the transistor 200 into the oxide 230.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

The insulator 222 may have a single-layer structure or a stacked-layer structure using an insulator containing what is called a high-k material such as aluminum oxide, hafnium oxide, tantalum oxide, zirconium oxide, lead zirconate titanate (PZT), strontium titanate ($SrTiO_3$), or $(Ba,Sr)TiO_3$ (BST). In the case where the insulator 222 has a stacked-layer structure, a three-layer structure with zirconium oxide, aluminum oxide, and zirconium oxide in this order, or a four-layer structure with zirconium oxide, aluminum oxide, zirconium oxide, and aluminum oxide in this order is employed, for example. For the insulator 222, a compound containing hafnium and zirconium may be used. When the semiconductor device is miniaturized and highly integrated, a dielectric used for a gate insulator and a capacitive element becomes thin, which might cause a problem of leakage current of a transistor and a capacitive element. When a high-k material is used as an insulator functioning as the dielectric used for the gate insulator and the capacitive element, a gate potential during operation of the transistor can be lowered and the capacitance of the capacitive element can be ensured while the physical thickness is kept.

Note that the insulator 222 and the insulator 224 may have a stacked-layer structure of two or more layers. In such cases, without limitation to a stacked-layer structure formed of the same material, a stacked-layer structure formed of different materials may be employed.

The oxide 243 (the oxide 243a and the oxide 243b) may be positioned between the oxide 230b and the conductor 242 (the conductor 242a and the conductor 242b) which functions as the source electrode or the drain electrode. This structure in which the conductor 242 and the oxide 230b are not in contact with each other can prevent the conductor 242 from absorbing oxygen in the oxide 230b. That is, preventing the oxidation of the conductor 242 can inhibit a decrease in the conductivity of the conductor 242. Accordingly, the oxide 243 preferably has a function of inhibiting the oxidation of the conductor 242.

The oxide 243 having a function of inhibiting the passage of oxygen is preferably provided between the oxide 230b and the conductor 242 functioning as the source electrode and the drain electrode, in which case the electric resistance between the conductor 242 and the oxide 230b can be reduced. Such a structure improves the electrical characteristics of the transistor 200 and reliability of the transistor 200.

As the oxide 243, for example, a metal oxide including an element M that is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like is preferably used. In particular, aluminum, gallium, yttrium, or tin is preferably used as the element M. The concentration of the element M in the oxide 243 is preferably higher than that in the oxide 230b. Furthermore, gallium oxide may be used as the oxide 243. A metal oxide such as an In-M-Zn oxide may be used as the oxide 243. Specifically, the atomic ratio of the element M to In in the metal oxide used as the oxide 243 is preferably greater than the atomic ratio of the element M to In in the metal oxide used as the oxide 230b. The thickness of the oxide 243 is preferably greater than or equal to 0.5 nm and less than or equal to 5 nm, further preferably greater than or equal to 1 nm and less than or equal to 3 nm. The oxide 243 preferably has crystallinity. In the case where the oxide 243 has crystallinity, release of oxygen from the oxide 230 can be favorably inhibited. When the oxide 243 has a hexagonal crystal structure, for example, release of oxygen from the oxide 230 can sometimes be inhibited.

Note that the oxide 243 is not necessarily provided. In that case, contact between the conductor 242 (the conductor 242a and the conductor 242b) and the oxide 230 may make oxygen in the oxide 230 diffuse into the conductor 242, resulting in oxidation of the conductor 242. It is highly possible that oxidation of the conductor 242 lowers the conductivity of the conductor 242. Note that the expression "oxygen in the oxide 230 diffuses into the conductor 242" can be replaced with the expression "the conductor 242 absorbs oxygen in the oxide 230".

When oxygen in the oxide 230 is diffused into the conductor 242 (the conductor 242a and the conductor 242b), another layer is sometimes formed between the conductor 242a and the oxide 230b, and between the conductor 242b and the oxide 230b. The another layer contains a larger amount of oxygen than the conductor 242 and thus presumably has an insulating property. In that case, a three-layer structure of the conductor 242, the another layer, and the oxide 230b can be regarded as a three-layer structure of a metal, an insulator, and a semiconductor and is sometimes referred to as an MIS (Metal-Insulator-Semiconductor) structure or a diode-connected structure mainly with an MIS structure.

The another layer is not necessarily formed between the conductor 242 and the oxide 230b; for example, the another layer may be formed between the conductor 242 and the oxide 230c or formed between the conductor 242 and the oxide 230b and between the conductor 242 and the oxide 230c.

The conductor 242 (the conductor 242a and the conductor 242b) functioning as the source electrode and the drain electrode is provided over the oxide 243. The thickness of the conductor 242 is greater than or equal to 1 nm and less than or equal to 50 nm, preferably greater than or equal to 2 nm and less than or equal to 25 nm, for example.

For the conductor 242, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

It is preferable that the insulator 272 be provided in contact with the top surface of the conductor 242 and function as a barrier layer. With this structure, absorption of excess oxygen contained in the insulator 280 by the conductor 242 can be inhibited. Furthermore, by inhibiting oxidation of the conductor 242, an increase in the contact resistance between the transistor 200 and a wiring can be inhibited. Consequently, the transistor 200 can have favorable electrical characteristics and reliability.

Thus, the insulator 272 preferably has a function of inhibiting oxygen diffusion. For example, the insulator 272 preferably has a function of further inhibiting diffusion of oxygen as compared to the insulator 280. For example, an insulator containing an oxide of one or both of aluminum and hafnium is preferably formed as the insulator 272. For another example, an insulator containing aluminum nitride may be used as the insulator 272.

As illustrated in FIG. 22A, the insulator 272 is in contact with part of the top surface of the conductor 242b and the side surface of the conductor 242b. In addition, although not illustrated, the insulator 272 is in contact with part of a top surface of the conductor 242a and a side surface the conductor 242a. The insulator 273 is provided over the insulator 272. Such a structure can inhibit the conductor 242 from absorbing oxygen added to the insulator 280, for example.

The insulator 250 functions as a gate insulator. The insulator 250 is preferably in contact with a top surface of the oxide 230c. The insulator 250 can be formed using silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. In particular, silicon oxide and silicon oxynitride, which have thermal stability, are preferable.

Like the insulator 224, the insulator 250 is preferably formed using an insulator from which oxygen is released by heating. When the insulator from which oxygen is released by heating is provided as the insulator 250 to be in contact with the top surface of the oxide 230c, oxygen can be effectively supplied to the channel formation region of the oxide 230b.

Furthermore, as in the insulator 224, the concentration of impurities such as water or hydrogen in the insulator 250 is preferably lowered. The thickness of the insulator 250 is preferably greater than or equal to 1 nm and less than or equal to 20 nm.

Furthermore, a metal oxide may be provided between the insulator 250 and the conductor 260. The metal oxide preferably prevents oxygen diffusion from the insulator 250 into the conductor 260. Providing the metal oxide that inhibits diffusion of oxygen inhibits diffusion of oxygen from the insulator 250 into the conductor 260. That is, the reduction in the amount of oxygen supplied to the oxide 230 can be inhibited. Moreover, oxidation of the conductor 260 due to oxygen in the insulator 250 can be inhibited.

The metal oxide functions as part of the gate insulator in some cases. For that reason, when silicon oxide, silicon oxynitride, or the like is used for the insulator 250, the metal oxide is preferably a high-k material with a high dielectric constant. The gate insulator having a stacked-layer structure of the insulator 250 and the metal oxide can be thermally stable and have a high dielectric constant. Thus, a gate potential that is applied during operation of the transistor can be reduced while the physical thickness of the gate insulator is maintained. Furthermore, the equivalent oxide thickness (EOT) of the insulator functioning as the gate insulator can be reduced.

Specifically, a metal oxide containing one or more of hafnium, aluminum, gallium, yttrium, zirconium, tungsten, titanium, tantalum, nickel, germanium, magnesium, and the like can be used. It is particularly preferable to use an insulator containing an oxide of one or both of aluminum and hafnium, for example, aluminum oxide, hafnium oxide, or an oxide containing aluminum and hafnium (hafnium aluminate).

The metal oxide functions as part of the gate in some cases. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate, a conductive material containing oxygen and a metal element contained in a metal oxide in which a channel is formed. Alternatively, a conductive material containing the above metal element and nitrogen may be used. Alternatively, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With use of such a material, hydrogen contained in the metal oxide where the channel is formed can be trapped in some cases. Alternatively, hydrogen entering from an external insulator or the like can be trapped in some cases.

Although the conductor 260 has a two-layer structure in FIG. 22A, the conductor 260 may have a single-layer structure or a stacked-layer structure of three or more layers.

The conductor 260a is preferably formed using a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Alternatively, it is preferable to use a conductive material having a function of inhibiting diffusion of oxygen (e.g., at least one of an oxygen atom, an oxygen molecule, and the like).

In addition, when the conductor 260a has a function of inhibiting diffusion of oxygen, the conductivity of the conductor 260b can be inhibited from being lowered because of oxidation due to oxygen contained in the insulator 250. As a conductive material having a function of inhibiting diffusion of oxygen, for example, tantalum, tantalum nitride, ruthenium, ruthenium oxide, or the like is preferably used.

Furthermore, the conductor 260b is preferably formed using a conductive material including tungsten, copper, or aluminum as its main component. The conductor 260 also functions as a wiring and thus is preferably formed using a conductor having high conductivity. For example, a conductive material containing tungsten, copper, or aluminum as its main component can be used. The conductor 260b may have a stacked-layer structure; for example, the conductor 260b may be a stack of titanium or titanium nitride and the above conductive material.

<<Metal Oxide>>

As the oxide 230, a metal oxide functioning as an oxide semiconductor is preferably used. A metal oxide that can be used as the oxide 230 of the present invention will be described below.

The metal oxide preferably contains at least indium or zinc. In particular, indium and zinc are preferably contained. In addition, gallium, yttrium, tin, or the like is preferably contained. Furthermore, one or more kinds selected from boron, titanium, iron, nickel, germanium, zirconium, molybdenum, lanthanum, cerium, neodymium, hafnium, tantalum, tungsten, magnesium, and the like may be contained.

Here the case where the metal oxide is an In-M-Zn oxide containing indium, an element M, and zinc (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is considered. In particular, aluminum, gallium, yttrium, or tin is preferably used as the element M.

Note that in this specification and the like, a metal oxide containing nitrogen is also collectively referred to as a metal oxide in some cases. A metal oxide containing nitrogen may be referred to as a metal oxynitride.

<Transistor 300>

The transistor 300 will be described with reference to FIG. 22B. The transistor 300 is provided on the semiconductor substrate 311 and includes a conductor 316 functioning as a gate, an insulator 315 functioning as a gate insulator, a semiconductor region 313 that is a part of the semiconductor substrate 311, and a low-resistance region 314a and a low-resistance region 314b functioning as a source region and a drain region. The transistor 300 may be a p-channel transistor or an n-channel transistor.

Figure 22B:
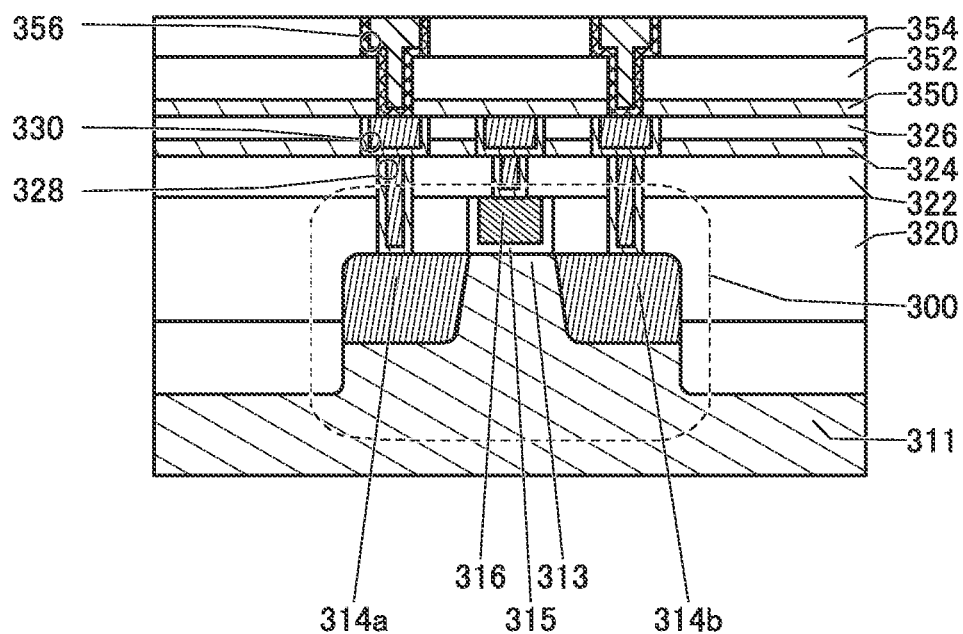

Here, in the transistor 300 illustrated in FIG. 22B, the semiconductor region 313 (part of the semiconductor substrate 311) where a channel is formed has a projecting shape. In addition, the conductor 316 is provided to cover a side surface and a top surface of the semiconductor region 313 with the insulator 315 therebetween. Note that a material adjusting the work function may be used for the conductor 316. The transistor 300 having such a structure is also referred to as a FIN transistor because the projecting portion of the semiconductor substrate 311 is utilized. Note that an insulator functioning as a mask for forming the convex portion may be included in contact with an upper portion of the convex portion. Although the case where the projecting portion is formed by processing part of the semiconductor substrate 311 is described here, a semiconductor film having a projecting shape may be formed by processing an SOI substrate.

Note that the transistor 300 illustrated in FIG. 22B is an example and the structure is not limited thereto; an appropriate transistor is used in accordance with a circuit structure or a driving method.

<Memory Device 420>

Next, the memory device 420 illustrated in FIG. 21 is described. Note that as for the description of the transistor 200M included in the memory device 420, the same description as that for the transistor 200 is omitted here.

In the memory device 420, the conductor 242a of the transistor 200M functions as one electrode of the capacitive element 292, and the insulator 272 and the insulator 273 function as a dielectric. A conductor 290 is provided to overlap with the conductor 242a with the insulator 272 and the insulator 273 sandwiched therebetween and functions as the other electrode of the capacitive element 292. The conductor 290 may be used as the other electrode of the capacitive element 292 included in an adjacent memory device 420. Alternatively, the conductor 290 may be electrically connected to the conductor 290 included in the adjacent memory device 420.

The conductor 290 is also provided on the top surface of the conductor 242a and the side surface of the conductor 242a with the insulator 272 and the insulator 273 sandwiched therebetween. This is preferable because the capacitive element 292 can have a larger capacitance than the capacitance obtained by the area where the conductor 242a and the conductor 290 overlap with each other.

The conductor 424 is electrically connected to the conductor 242b and is also electrically connected to another conductor 424 positioned in a lower layer with the conductor 205 positioned therebetween.

As a dielectric of the capacitive element 292, silicon nitride, silicon nitride oxide, aluminum oxide, hafnium oxide, or the like can be used. Alternatively, a stack of these materials can be used. In the case where the dielectric of the capacitive element 292 has a stacked-layer structure, stacked layers of aluminum oxide and silicon nitride or stacked layers of hafnium oxide and silicon oxide can be used. The stacking order is not limited. For example, silicon nitride may be stacked over aluminum oxide, or aluminum oxide may be stacked over silicon nitride.

As the dielectric of the capacitive element 292, zirconium oxide having a higher permittivity than the above-described materials may be used. As the dielectric of the capacitive element 292, a single layer of zirconium oxide may be used, or zirconium oxide may be used in part of stacked layers. For example, a stacked layer of zirconium oxide and aluminum oxide can be used. Furthermore, the dielectric of the capacitive element 292 may be three stacked layers; zirconium oxide may be used as the first layer and the third layer and aluminum oxide may be used as the second layer between the first layer and the third layer.

When zirconium oxide having a high permittivity is used as the dielectric of the capacitive element 292, the area occupied by the capacitive element 292 in the memory device 420 can be reduced. Thus, the area necessary for the memory device 420 can be reduced, which is preferable because the bit cost can be improved.

For the conductor 290, a material that can be used for the conductor 205, the conductor 242, the conductor 260, the conductor 424, or the like can be used.

This embodiment shows an example in which the transistors 200M and the capacitive elements 292 are symmetrically provided with the conductors 424 sandwiched therebetween. When a pair of transistors 200M and a pair of capacitive elements 292 are provided in this manner, the number of conductors 424 electrically connected to the transistor 200M can be reduced. Thus, the area necessary for the memory device 420 can be reduced, which is preferable because the bit cost can be improved.

In the case where the insulator 241 is provided on the side surface of the conductor 424, the conductor 424 is connected to at least part of a top surface of the conductor 242b.

With use of the conductor 424 and the conductor 205, the transistor 200T and the memory device 420 in the memory unit 470 can be electrically connected to each other.

<Modification example 1 of memory device 420>

Figure 23A:
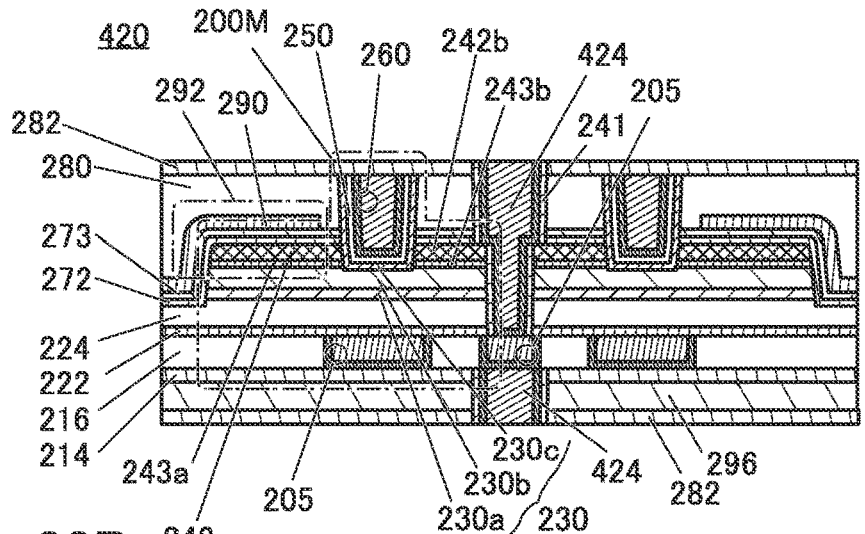
FIG. 23A, FIG. 23B, and FIG. 23C are schematic cross-sectional views illustrating structure examples of semiconductor devices.
Figure 23B:
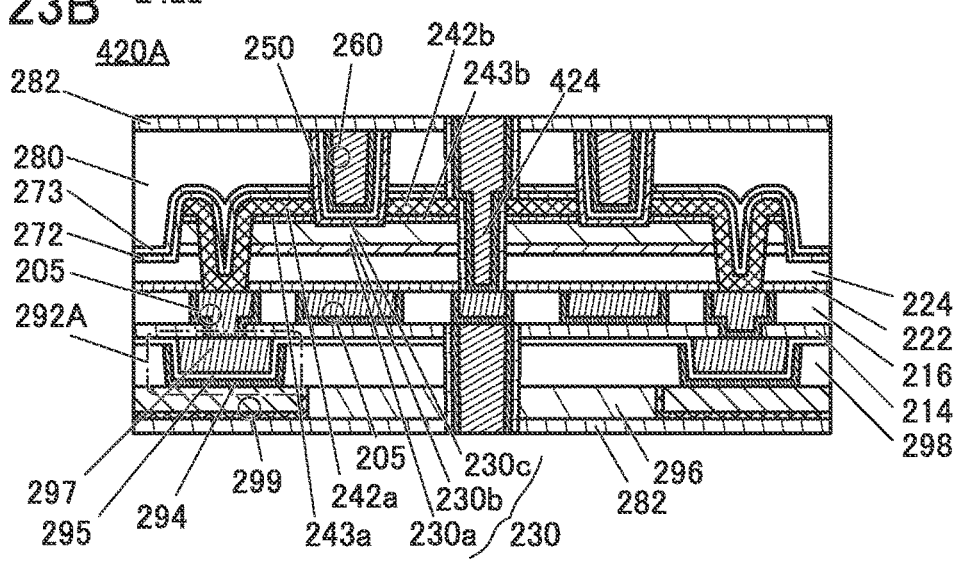

Next, as a modification example of the memory device 420, a memory device 420A will be described with reference to FIG. 23B. The memory device 420A includes the transistor 200M and a capacitive element 292A electrically connected to the transistor 200M. The capacitive element 292A is provided below the transistor 200M.

In the memory device 420A, the conductor 242a is positioned in an opening provided in the oxide 243a, the oxide 230b, the oxide 230a, the insulator 224, and the insulator 222 and is electrically connected to the conductor 205 at a bottom surface of the opening. The conductor 205 is electrically connected to the capacitive element 292A.

The capacitive element 292A includes a conductor 294 functioning as one electrode, an insulator 295 functioning as a dielectric, and a conductor 297 functioning as the other electrode. The conductor 297 overlaps with the conductor 294 with the insulator 295 positioned therebetween. The conductor 297 is electrically connected to the conductor 205.

The conductor 294 is provided on a bottom surface and a side surface of an opening formed in an insulator 298 over the insulator 296, and the insulator 295 is provided to cover the insulator 298 and the conductor 294. The conductor 297 is provided to be embedded in a depression portion in the insulator 295.

In addition, a conductor 299 is provided to be embedded in the insulator 296, and the conductor 299 is electrically connected to the conductor 294. The conductor 299 may be electrically connected to the conductor 294 in the adjacent memory device 420A.

The conductor 297 is also provided on a top surface of the conductor 294 and a side surface of the conductor 294 with the insulator 295 sandwiched therebetween. This is preferable because the capacitive element 292A can have a larger capacitance than the capacitance obtained by the area where the conductor 294 and the conductor 297 overlap with each other.

As the insulator 295 functioning as a dielectric of the capacitive element 292A, silicon nitride, silicon nitride oxide, aluminum oxide, hafnium oxide, or the like can be used. Alternatively, a stack of these materials can be used. In the case where the insulator 295 has a stacked-layer structure, a stack of aluminum oxide and silicon nitride, or a stack of hafnium oxide and silicon oxide can be used. The stacking order is not limited. For example, silicon nitride may be stacked over aluminum oxide, or aluminum oxide may be stacked over silicon nitride.

Alternatively, as the insulator 295, zirconium oxide having a higher dielectric constant than the above material may be used. As the insulator 295, zirconium oxide may be used as a single layer or part of a stacked layer. For example, a stacked layer of zirconium oxide and aluminum oxide can be used. The insulator 295 may have a stacked layer including three layers, in which zirconium oxide is used for the first layer and the third layer, and aluminum oxide is used for the second layer between the first layer and the third layer.

When zirconium oxide having a high permittivity is used as the insulator 295, the area occupied by the capacitive element 292A in the memory device 420A can be reduced. Thus, the area necessary for the memory device 420A can be downsized, which is preferable because the bit cost can be improved.

For the conductor 297, the conductor 294, and the conductor 299, a material that can be used for the conductor 205, the conductor 242, the conductor 260, the conductor 424, and the like can be used.

For the insulator 298, a material that can be used for the insulator 214, the insulator 216, the insulator 224, the insulator 280, and the like can be used.

Modification Example 2 of Memory Device 420

Figure 23C:
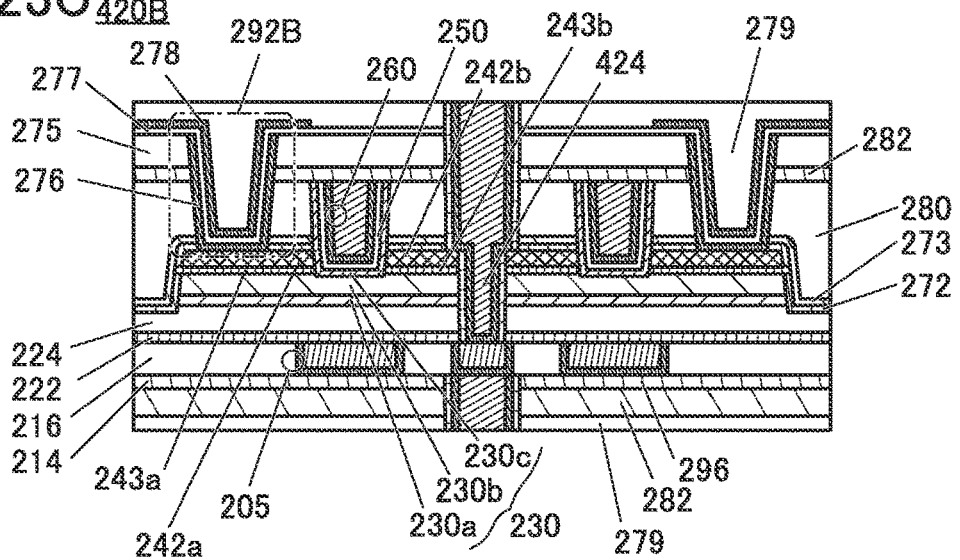

Next, as a modification example of the memory device 420, a memory device 420B will be described with reference to FIG. 23C. The memory device 420B includes the transistor 200M and a capacitive element 292B electrically connected to the transistor 200M. The capacitive element 292B is provided above the transistor 200M.

The capacitive element 292B includes a conductor 276 functioning as one electrode, an insulator 277 functioning as a dielectric, and a conductor 278 functioning as the other electrode. The conductor 278 overlaps with the conductor 276 with the insulator 277 positioned therebetween.

An insulator 275 is provided over the insulator 282, and the conductor 276 is provided on a bottom surface and a side surface of an opening formed in the insulator 275, the insulator 282, the insulator 280, the insulator 273, and the insulator 272. The insulator 277 is provided to cover the insulator 282 and the conductor 276. The conductor 278 is provided to overlap with the conductor 276 in a depression portion in the insulator 277, and at least part thereof is provided over the insulator 275 with the insulator 277 positioned therebetween. The conductor 278 may be used as the other of electrode of the capacitive element 292B included in an adjacent memory device 420B. Alternatively, the conductor 278 may be electrically connected to the conductor 278 included in the adjacent memory device 420B.

The conductor 278 is also provided on a top surface of the conductor 276 and a side surface of the conductor 276 with the insulator 277 sandwiched therebetween. This is preferable because the capacitive element 292B can have a larger capacitance than the capacitance obtained by the area where the conductor 276 and the conductor 278 overlap with each other.

In addition, an insulator 279 may be provided to embed a depression portion in the conductor 278.

As the insulator 277 functioning as a dielectric of the capacitive element 292B, silicon nitride, silicon nitride oxide, aluminum oxide, hafnium oxide, or the like can be used. Alternatively, a stack of these materials can be used. In the case where the insulator 277 has a stacked-layer structure, a stack of aluminum oxide and silicon nitride or a stack of hafnium oxide and silicon oxide can be used. The stacking order is not limited. For example, silicon nitride may be stacked over aluminum oxide, or aluminum oxide may be stacked over silicon nitride.

Alternatively, as the insulator 277, zirconium oxide having a higher dielectric constant than the above material may be used. As the insulator 277, zirconium oxide may be used as a single layer or part of a stacked layer. For example, a stacked layer of zirconium oxide and aluminum oxide can be used. Alternatively, the insulator 277 may have a stacked layer including three layers, in which zirconium oxide is used for the first layer and the third layer, and aluminum oxide is used for the second layer between the first layer and the third layer.

When zirconium oxide having a high permittivity is used as the insulator 277, the area occupied by the capacitive element 292B in the memory device 420B can be reduced. Thus, the area necessary for the memory device 420B can be reduced, which is preferable because the bit cost can be improved.

For the conductor 276 and the conductor 278, a material that can be used for the conductor 205, the conductor 242, the conductor 260, the conductor 424, or the like can be used.

For the insulator 275 and the insulator 279, a material that can be used for the insulator 214, the insulator 216, the insulator 224, the insulator 280, and the like can be used.

<Connection Between Memory Device 420 and Transistor 200T>

In a region 422 surrounded by a dashed-dotted line in FIG. 21, the memory device 420 is electrically connected to a gate of the transistor 200T via the conductor 424 and the conductor 205; however, this embodiment is not limited thereto.

Figure 24:
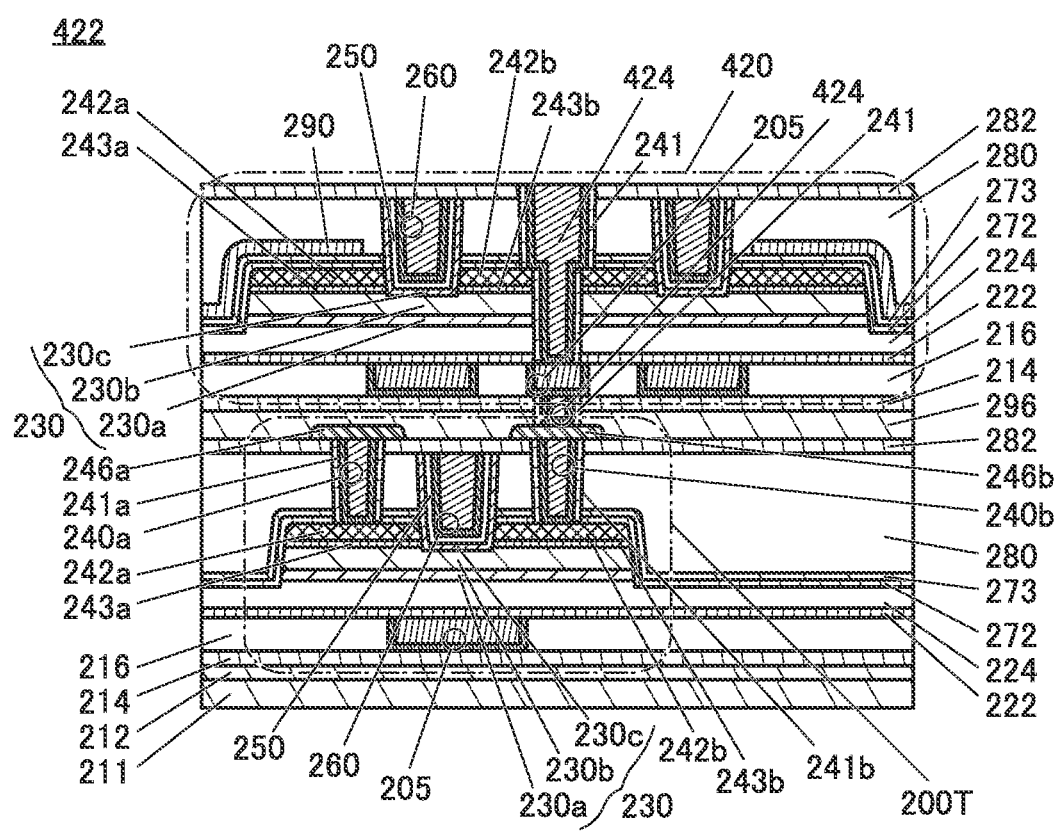
FIG. 24 is a schematic cross-sectional view illustrating a structure example of a semiconductor device.

FIG. 24 shows an example in which the memory device 420 is electrically connected to the conductor 242b functioning as one of a source and a drain of the transistor 200T via the conductor 424, the conductor 205, the conductor 246b, and the conductor 240b.

As described above, a method for connecting the memory device 420 and the transistor 200T can be determined depending on the function of a circuit included in the transistor layer 413.

Figure 25:
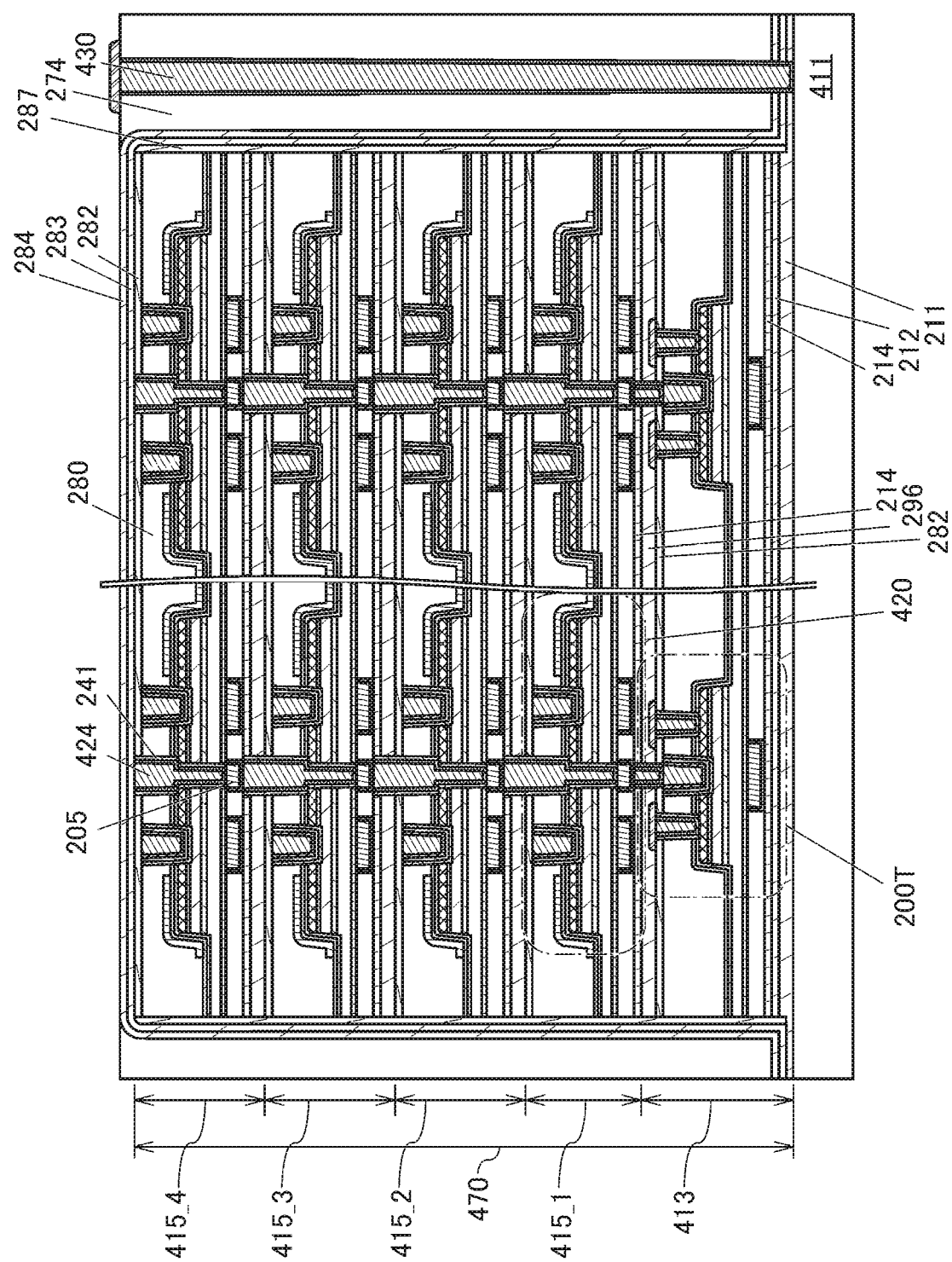
FIG. 25 is a schematic cross-sectional view illustrating a structure example of a semiconductor device.

FIG. 25 illustrates an example in which the memory unit 470 includes the transistor layer 413 including a transistor 200T and four memory device layers 415 (a memory device layer 415_1 to a memory device layer 415_4).

The memory device layer 415_1 to the memory device layer 415_4 each include a plurality of memory devices 420.

The memory device 420 is electrically connected to another memory device 420 included in a different memory device layer 415 and the transistor 200T included in the transistor layer 413 through a conductor 424 and the conductor 205.

The memory unit 470 is sealed with the insulator 211, the insulator 212, the insulator 214, the insulator 287, the insulator 282, the insulator 283, and the insulator 284. The insulator 274 is provided in the periphery of the insulator 284. The conductor 430 is provided in the insulator 274, the insulator 284, the insulator 283, and the insulator 211 and be electrically connected to the element layer 411.

The insulator 280 is provided in the sealing structure. The insulator 280 has a function of releasing oxygen by heating. Alternatively, the insulator 280 includes an excess oxygen region.

For the insulator 211, the insulator 283, and the insulator 284, a material having a high blocking property against hydrogen is suitable. For the insulator 214, the insulator 282, and the insulator 287, a material having a function of capturing or fixing hydrogen is suitable.

Examples of the material having a high blocking property against hydrogen include silicon nitride and silicon nitride oxide. Examples of the material having a function of trapping or fixing hydrogen include aluminum oxide, hafnium oxide, and an oxide containing aluminum and hafnium (hafnium aluminate).

A barrier property in this specification means a function of inhibiting diffusion of a targeted substance (also referred to as having lower permeability). Alternatively, a barrier property in this specification means a function of trapping or fixing (also referred to as gettering) a targeted substance.

For the crystal structure of materials used for the insulator 211, the insulator 212, the insulator 214, the insulator 287, the insulator 282, the insulator 283, and the insulator 284, an amorphous or crystal structure may be employed, although the crystal structure is not limited thereto. For example, it is preferable to use an amorphous aluminum oxide film for the material having a function of trapping or fixing hydrogen. Amorphous aluminum oxide may trap or fix hydrogen more than aluminum oxide with high crystallinity.

Here, the following model can be given, as the model of excess oxygen in the insulator 280 with respect to diffusion of hydrogen from an oxide semiconductor in contact with the insulator 280.

Hydrogen in the oxide semiconductor diffuses to other structure bodies through the insulator 280 in contact with the oxide semiconductor. The hydrogen in the oxide semiconductor react with the excess oxygen in the insulator 280, which yields the OH bonding; accordingly the hydrogen diffuses in the insulator 280. The hydrogen atom having the OH bonding reacts with the oxygen atom bonded to an atom (such as a metal atom) in the insulator 282 when reaching a material which has a function of capturing or fixing hydrogen (typically the insulator 282), and is trapped or fixed in the insulator 282. The oxygen atom which had the OH bond of the excess oxygen may remain as an excess oxygen in the insulator 280. That is, it is highly probable that the excess oxygen in the insulator 280 serves as a bridge in the diffusion of the hydrogen.

A manufacturing process of the semiconductor device is one of important factors for the model.

For example, the insulator 280 containing excess oxygen is formed over the oxide semiconductor, and then the insulator 282 is formed. After that, heat treatment is preferably performed. The heat treatment is performed at 350° C. or higher, preferably 400° C. or higher under an atmosphere containing oxygen, an atmosphere containing nitrogen, or a mixed atmosphere of oxygen and nitrogen. The heat treatment is performed for one hour or more, preferably four hours or more, further preferably eight hours or more.

The heat treatment enables diffusion of hydrogen from the oxide semiconductor to the outside through the insulator 280, the insulator 282, and the insulator 287. This can reduce the absolute amount of hydrogen existing in and in the vicinity of the oxide semiconductor.

The insulator 283 and the insulator 284 are formed after the heat treatment. The insulator 283 and the insulator 284 are materials having a high blocking property against hydrogen; thus, entry of hydrogen diffused to the outside or external hydrogen to the inside, specifically, the oxide semiconductor or the insulator 280 side can be inhibited.

An example where the heat treatment is performed after the insulator 282 is formed is shown; however, one embodiment of the present invention is not limited thereto. For example, the above-described heat treatment may be performed after formation of the transistor layer 413 or after formation of the memory device layer 415_1 to the memory device layer 415_3. When hydrogen is diffused outward by the heat treatment, hydrogen is diffused into an upper area of the transistor layer 413 or in a lateral direction of the transistor layer 413. Similarly, in the case where heat treatment is performed after the formation of each of the memory device layer 415_1 to the memory device layer 415_3, hydrogen is diffused into an upper area or in a lateral direction.

The above-described manufacturing process yields the above-described sealing structure by bonding the insulator 211 and the insulator 283.

The above-described structure and manufacturing process enable a semiconductor device using an oxide semiconductor with reduced hydrogen concentration. Accordingly, a semiconductor device with high reliability can be provided. According to another embodiment of the present invention, a semiconductor device with favorable electrical characteristics can be provided.

FIG. 26A to FIG. 26C are drawings showing an example that is different from FIG. 25 in the arrangement of the conductors 424. FIG. 26A is a layout diagram of the memory device 420 seen from the top, FIG. 26B is a cross-sectional view of a portion taken along dashed-dotted line A1-A2 in FIG. 26A, and FIG. 26C is a cross-sectional view of a portion taken along dashed-dotted line B1-B2 in FIG. 26A. Note that in FIG. 26A, the conductor 205 is not illustrated for easy understanding. In the case where the conductor 205 is provided, the conductor 205 includes a region overlapping with the conductor 260 and the conductor 424.

As illustrated in FIG. 26A, an opening where the conductor 424 is provided, that is, the conductor 424 is provided in not only a region overlapping with the oxide 230a and the oxide 230b but also the outside of the oxide 230a and the oxide 230b. Although in the example shown in FIG. 26A, the conductor 424 is provided to protrude from the oxide 230a and the oxide 230b on B2 side, this embodiment is not limited thereto. The conductor 424 may be provided to extend beyond the oxide 230a and the oxide 230b to the B1 side, or to both the B1 side and the B2 side.

FIG. 26B and FIG. 26C show an example in which the memory device layer 415_p (p is a natural number greater than or equal to 2 and less than or equal to n) is stacked over the memory device layer 415_p-1. The memory device 420 included in the memory device layer 415_p-1 is electrically connected to the memory device 420 included in the memory device layer 415_p via the conductor 424 and the conductor 205.

FIG. 26B shows an example where the conductor 424 in the memory device layer 415_p-1 is connected to the conductor 242 in the memory device layer 415_p-1 and the conductor 205 in the memory device layer 415_p. Here, the conductor 424 is also connected to the conductor 205 in the memory device layer 415_p-1 on an outer side that is on B2 side of the conductor 242, the oxide 243, the oxide 230b, and the oxide 230a.

According to FIG. 26C, the conductor 424 is formed along side surfaces of the conductor 242, the oxide 243, the oxide 230b, and the oxide 230a on B2 side, and is electrically connected to the conductor 205 through an opening formed in the insulator 280, the insulator 273, the insulator 272, the insulator 224, and the insulator 222. Here, an example in which the conductor 424 is provided along the side surfaces on the B2 side of the conductor 242, the oxide 243, the oxide 230b, and the oxide 230a is indicated by a dotted line in FIG. 26B. Moreover, the insulator 241 is formed, in some cases, between the conductor 424 and the side surfaces of the conductor 242, the oxide 243, the oxide 230b, the oxide 230a, the insulator 224, and the insulator 222 on B2 side.

The conductor 424 is provided also in a region not overlapping with the conductor 242 or the like, whereby the memory device 420 can be electrically connected to another memory device 420 provided in a different memory device layer 415. In addition, the memory device 420 can be electrically connected to the transistor 200T provided in the transistor layer 413.

When the conductor 424 serves as a bit line, the conductor 424 is provided in a region not overlapping with the conductor 242 or the like, so that the length of the bit line between the memory devices 420 adjacent to each other in B1-B2 direction can be increased. As illustrated in FIG. 26A, the distance between the conductors 424 over the conductors 242 is d1; the distance between the conductors 424 positioned below the oxide 230a, that is, in an opening formed in the insulator 224 and the insulator 222 is d2; and d2 is larger than d1. Compared to the case where the distance between the conductors 424 adjacent to each other in B1-B2 direction is d1, the parasitic capacitance of the conductor 424 can be reduced in the case where part of the distance is set to d2. The reduction of the parasitic capacitance of the conductors 424 is preferable to reduce the capacitance necessary for the capacitive element 292.

In the memory device 420, the conductor 424 functioning as a common bit line for two memory cells is provided. The cell size of each memory cell can be reduced by appropriately adjusting the permittivity of the dielectric used in the capacitor or the parasitic capacitance between bit lines. Here, the estimation of the cell size, the bit density, and the bit cost of the memory cell when the channel length is 30 nm (also referred to as 30 nm node) is described. In FIG. 27A to FIG. 27D described below, the conductor 205 is not illustrated to facilitate understanding of the drawings. In the case where the conductor 205 is provided, the conductor 205 includes a region overlapping with the conductor 260 and the conductor 424.

FIG. 27A shows an example in which a hafnium oxide with a thickness of 10 nm and a 1-nm thick silicon oxide are stacked in this order as the dielectric of the capacitor; a slit is provided in the conductor 242, the oxide 243, the oxide 230a, and the oxide 230b between the memory cells included in the memory device 420; and the conductor 424 functioning as the bit line is provided so as to overlap with the conductor 242 and the slit. A memory cell 432 obtained in this manner is referred to as a cell A.

The cell size of the cell A is 45.25 F².

FIG. 27B shows an example in which a first zirconium oxide, an aluminum oxide, and a second zirconium oxide are stacked in this order as the dielectric of the capacitor; a slit is provided in the conductor 242, the oxide 243, the oxide 230a, and the oxide 230b between the memory cells included in the memory device 420; and the conductor 424 functioning as the bit line is provided so as to overlap with the conductor 242 and the slit. A memory cell 433 obtained in this manner is referred to as a cell B.

The dielectric used for the capacitor of the cell B has a higher permittivity than that for the cell A; thus, the area of the capacitor can be reduced in the cell B. Therefore, the cell size of the cell B can be reduced compared with that of the cell A. The cell size of the cell B is 25.53 F².

The cell A and the cell B correspond to the memory cells included in the memory device 420, the memory device 420A, or the memory device 420B illustrated in FIG. 21, FIG. 23A to FIG. 23C, and FIG. 24.

FIG. 27C shows an example in which a first zirconium oxide, an aluminum oxide, and a second zirconium oxide are stacked as the dielectric of the capacitor; the conductor 242, the oxide 243, the oxide 230a, and the oxide 230b included in the memory device 420 are shared by the memory cells; and the conductor 424 functioning as the bit line is provided so as to overlap with a portion overlapping with the conductor 242 and a portion outside the conductor 242. A memory cell 434 obtained in this manner is referred to as a cell C.

The distance between the conductors 424 in the cell C is longer below the oxide 230a than above the conductor 242. Therefore, the parasitic capacitance of the conductors 424 can be reduced and the area of the capacitors can be reduced. Furthermore, the conductor 242, the oxide 243, the oxide 230a, and the oxide 230b are not provided with a slit. Thus, the cell size can be reduced in the cell C compared with the cell A and the cell B. The cell size of the cell C is 17.20 F².

FIG. 27D shows an example in which the conductor 205 and the insulator 216 are not provided in the cell C. Such a memory cell 435 is referred to as a cell D.

Since the conductor 205 and the insulator 216 are not provided in the cell D, the memory device 420 can be thinned. Therefore, the memory device layer 415 including the memory device 420 can be thinned, so that the height of the memory unit 470 in which a plurality of memory device layers 415 are stacked can be reduced. When the conductors 424 and the conductors 205 are regarded as a bit line, the bit line can be shortened in the memory unit 470. The shortened bit line can reduce the parasitic load in the bit line and further reduce the parasitic capacitance of the conductors 424; accordingly, the area of the capacitor can be reduced. Furthermore, the conductor 242, the oxide 243, the oxide 230a, and the oxide 230b are not provided with a slit. As described above, the cell size of the cell D can be reduced compared with the cell A, the cell B, and the cell C. The cell size of the cell D is 15.12 F².

The cell C and the cell D correspond to the memory cell included in the memory device 420 illustrated in FIG. 26A to FIG. 26C.

Here, the bit density and the bit cost $C_b$ of the cell A to the cell D and a cell E, which is the cell D capable of multi-level storage, were estimated. Moreover, the estimated bit density and bit cost were compared with expected values of bit density and bit cost of currently commercially available DRAMs.

The bit cost $C_b$ in the semiconductor device of one embodiment of the present invention was estimated using Formula 1.

[Formula 1]

$$C_b = \frac{(P_C + n \times P_S)}{n} \times \frac{D_d}{D_{3d}} \times \frac{1}{P_d} \qquad (1)$$

Here, n is the number of stacked memory device layers, $P_c$ is the number of patterning times mainly for the element layer 411 as a common portion, $P_s$ is the number of patterning times per memory device layer 415 and transistor layer 413, Da is the bit density of a DRAM, $D_{3d}$ is the bit density of one memory device layer 415, and Pa is the number of patterning times for a DRAM.

Note that Pa includes the number of times increased by scaling.

Table 1 shows expected values of bit density of commercially available DRAMs and estimated bit density of semiconductor devices of one embodiment of the present invention. Note that two types of commercially available DRAMs with process nodes of 18 nm and 1X nm were used. As for the semiconductor devices of one embodiment of the present invention, the process node was 30 nm and the number of stacked memory device layers in each of the cell A to the cell E was five layers, ten layers, and twenty layers; with such conditions, the bit density was estimated.

TABLE 1

| | DRAM | | Memory device of one embodiment of the present invention |  |  |
|---|---|---|---|---|---|
| | Manufacturer | | | | |
| | Company A | Company B | — | | |
| | Process node | | | | |
| | 18 nm | 1X nm | 30 nm | | |
| | Number of stacked layers | | | | |
| | — | — | 5 | 10 | 20 |
| Bit density [Gb/mm2] *: expected value | 0.19 (*) | 0.14 (*) | Cell A 0.05 | 0.10 | 0.20 |
| | | | Cell B 0.09 | 0.17 | 0.35 |
| | | | Cell C 0.13 | 0.26 | 0.52 |
| | | | Cell D 0.15 | 0.29 | 0.59 |
| | | | Cell E 0.30 | 0.59 | 1.18 |

Table 2 shows the results of estimation of the relative bit cost of the semiconductor devices of one embodiment of the present invention from the bit cost of the commercially available DRAM. For comparison of the bit costs, the DRAM with a process node of 1X nm was used. As for the semiconductor devices of one embodiment of the present invention, the process node was 30 nm and the number of stacked memory device layers in each of the cell A to the cell D was five layers, ten layers, and twenty layers; with such conditions, estimation was performed.

TABLE 2

| | DRAM | | Memory device of one embodiment of the present invention |  |  |
|---|---|---|---|---|---|
| | Manufacturer | | | | |
| | Company A | Company B | — | | |
| | Process node | | | | |
| | 18 nm | 1X nm | 30 nm | | |
| | Number of stacked layers | | | | |
| | — | — | 5 | 10 | 20 |
| Relative bit cost assuming that Company B's bit cost is 1 | — | 1 | Cell A 1.7 | 1.3 | 1.2 |
| | | | Cell B 0.9 | 0.7 | 0.7 |
| | | | Cell C 0.6 | 0.5 | 0.4 |
| | | | Cell D 0.5 | 0.4 | 0.3 |

Table 3 shows expected values of bit density of commercially available DRAMs and estimated bit density of semiconductor devices of one embodiment of the present invention, which is estimates different from those in Table 1. Note that the commercially available DRAMs with process node of 1x nm was used. As for the semiconductor devices of one embodiment of the present invention, the process node was 30 nm, and the number of stacked layers including memory device layers 415 and the transistor layer 413 in the cell C was five layers, ten layers, and ten layers processed for multi-level storage as 4 bit/cell; with such conditions, the bit density was estimated. Table 3 also shows the results of estimation of the relative bit cost of the semiconductor devices of one embodiment of the present invention from the bit cost of the commercially available DRAM. As for the semiconductor devices of one embodiment of the present invention, the process node was 30 nm, and the number of stacked layers including memory device layers 415 and the transistor layer 413 in the cell C was five layers, ten layers, and ten layers processed for multi-level storage as 4 bit/cell; with such conditions similar to those of the estimation of the bit density, estimation was performed.

TABLE 3

| | DRAM | Semiconductor device of one embodiment of the present invention |  |  |
|---|---|---|---|---|
| | Process node | | | |
| | 1X nm | 30 nm | | |
| | Number of stacked layers | | | |
| | — | 5 layers | 10 layers | 10 layers, multi-level storage |
| Bit density [Gb/mm 2] | 0.14 (*) | 0.13 | 0.26 | 1.04 |
| Relative bit cost assuming that the bit cost is 1 | 1 | 0.6 | 0.5 | 0.1 |

Although miniaturization in DRAMs has reached its limit, the semiconductor device of one embodiment of the present invention enables higher bit density, lower cost, and extremely lower power consumption than DRAMs, without reaching a limit of miniaturization, when multi-level storage which DRAMs cannot achieve in principle is conducted. In addition, in the semiconductor device of one embodiment of the present invention, the data refresh rate (once per hour) is 1/60,000 of that in DRAMs (once per 64 ms); thus, even when the memory capacitance greatly increases, a memory with low power consumption can be achieved.

The structures described in this embodiment can be used in an appropriate combination with the structures described in the other embodiments and the like.

Embodiment 3

In this embodiment, the compositions of a CAC-OS (Cloud-Aligned Composite Oxide Semiconductor) and a CAAC-OS (c-axis Aligned Crystal Oxide Semiconductor), which are metal oxides that can be used in the OS transistor described in the above embodiments, will be described.

<Composition of Metal Oxide>

A CAC-OS or a CAC-metal oxide has a conducting function in part of the material and has an insulating function in another part of the material; as a whole, the CAC-OS or the CAC-metal oxide has a function of a semiconductor. In the case where the CAC-OS or the CAC-metal oxide is used in an active layer of a transistor, the conducting function is a function of allowing electrons (or holes) serving as carriers to flow, and the insulating function is a function of not allowing electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

In addition, the CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, in some cases, the conductive regions are observed to be coupled in a cloud-like manner with their boundaries blurred.

Furthermore, in the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

Furthermore, the CAC-OS or the CAC-metal oxide includes components having different bandgaps. For example, the CAC-OS or the CAC-metal oxide includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used for a channel formation region of a transistor, the transistor in the on state can achieve high current driving capability, that is, a high on-state current and high field-effect mobility.

In other words, the CAC-OS or the CAC-metal oxide can also be referred to as a matrix composite or a metal matrix composite.

<Structure of Metal Oxide>

Oxide semiconductors can be classified into a single crystal oxide semiconductor and a non-single-crystal oxide semiconductor. Examples of the non-single-crystal oxide semiconductors include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

Oxide semiconductors might be classified in a manner different from the above-described one when classified in terms of the crystal structure. Here, the classification of the crystal structures of an oxide semiconductor is explained with FIG. 28A. FIG. 28A is a diagram showing the classification of crystal structures of an oxide semiconductor, typically IGZO (a metal oxide containing In, Ga, and Zn).

As shown in FIG. 28A, IGZO is roughly classified into Amorphous, Crystalline, and Crystal. Amorphous includes completely amorphous. Crystalline includes CAAC (c-axis-aligned crystalline), nc (nanocrystalline), and CAC (Cloud-Aligned Composite). Crystal includes single crystal and poly crystal.

Note that the structure shown in the thick frame in FIG. 28A is a structure that belongs to a new crystalline phase. This structure is positioned in a boundary region between Amorphous and Crystal. In other words, Amorphous, which is energetically unstable, and Crystalline are completely different structures.

A crystal structure of a film or a substrate can be analyzed with X-ray diffraction (XRD) images. Here, XRD spectra of quartz glass and IGZO, which has a crystal structure classified into Crystalline (also referred to as Crystalline IGZO), are shown in FIG. 28B and FIG. 28C. FIG. 28B shows an XRD spectrum of quartz glass and FIG. 28C shows an XRD spectrum of crystalline IGZO. Note that the crystalline IGZO shown in FIG. 28C has a composition In: Ga:Zn=4: 2:3 [atomic ratio]. Furthermore, the crystalline IGZO shown in FIG. 28C has a thickness of 500 nm.

As indicated by arrows in FIG. 28B, the XRD spectrum of the quartz glass shows a substantially symmetrical peak. In contrast, as indicated by arrows in FIG. 28C, the XRD spectrum of the crystalline IGZO shows an asymmetrical peak. The asymmetrical peak of the XRD spectrum clearly shows the existence of crystal. In other words, the structure cannot be regarded as Amorphous unless it has a bilaterally symmetrical peak in the XRD spectrum.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that a clear crystal grain boundary (also referred to as grain boundary) cannot be observed even in the vicinity of distortion in the CAAC-OS. That is, formation of a crystal grain boundary is inhibited by the distortion of lattice arrangement. This is because the CAAC-OS can tolerate distortion owing to a low density of arrangement of oxygen atoms in the a-b plane direction, an interatomic bond length changed by substitution of a metal element, and the like. Note that a crystal structure in which a clear grain boundary is observed is what is called polycrystal. It is highly probable that the grain boundary becomes a recombination center and traps carriers and thus decreases the on-state current and field-effect mobility of a transistor. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS tends to have a layered crystal structure (also referred to as a layered structure) in which a layer containing indium and oxygen (hereinafter, an In layer) and a layer containing the element M, zinc, and oxygen (hereinafter, an (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is an oxide semiconductor with high crystallinity. Meanwhile, in the CAAC-OS, a reduction in electron mobility due to a crystal grain boundary is less likely to occur because a clear crystal grain boundary cannot be observed. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods.

The a-like OS is an oxide semiconductor having a structure between those of the nc-OS and the amorphous oxide semiconductor. The a-like OS includes a void or a low-density region. That is, the a-like OS has low crystallinity as compared with the nc-OS and the CAAC-OS.

An oxide semiconductor has various structures with different properties. Two or more of the amorphous oxide semiconductor, the polycrystalline oxide semiconductor, the a-like OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor with a low carrier concentration is preferably used for the transistor. In the case where the carrier concentration of an oxide semiconductor film is lowered, the impurity concentration in the oxide semiconductor film is lowered to decrease the density of defect states. In this specification and the like, a state with a low impurity concentration and a low density of defect states is referred to as a highly purified intrinsic or substantially highly purified intrinsic state.

Moreover, a highly purified intrinsic or substantially highly purified intrinsic oxide semiconductor film has a low density of defect states and accordingly may have a low density of trap states.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Therefore, it is preferable to reduce the concentration of an alkali metal or an alkaline earth metal in the oxide semiconductor. Specifically, the concentration of an alkali metal or an alkaline earth metal in the oxide semiconductor obtained by SIMS is lower than or equal to $1\times10^{18}$ atoms/cm$^3$, preferably lower than or equal to $2\times10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. Hence, nitrogen in the oxide semiconductor is preferably reduced as much as possible; the nitrogen concentration in the oxide semiconductor that is obtained by SIMS is set, for example, lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor that is obtained by SIMS is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

Note that this embodiment can be combined with any of the other embodiments in this specification as appropriate.

Embodiment 4

In this embodiment, the control logic circuit 61, the row driver circuit 62, the column driver circuit 63, and the output circuit 64 that are provided on the silicon substrate 50 of the semiconductor device 10 described in Embodiment 1 will be described.

Figure 29:
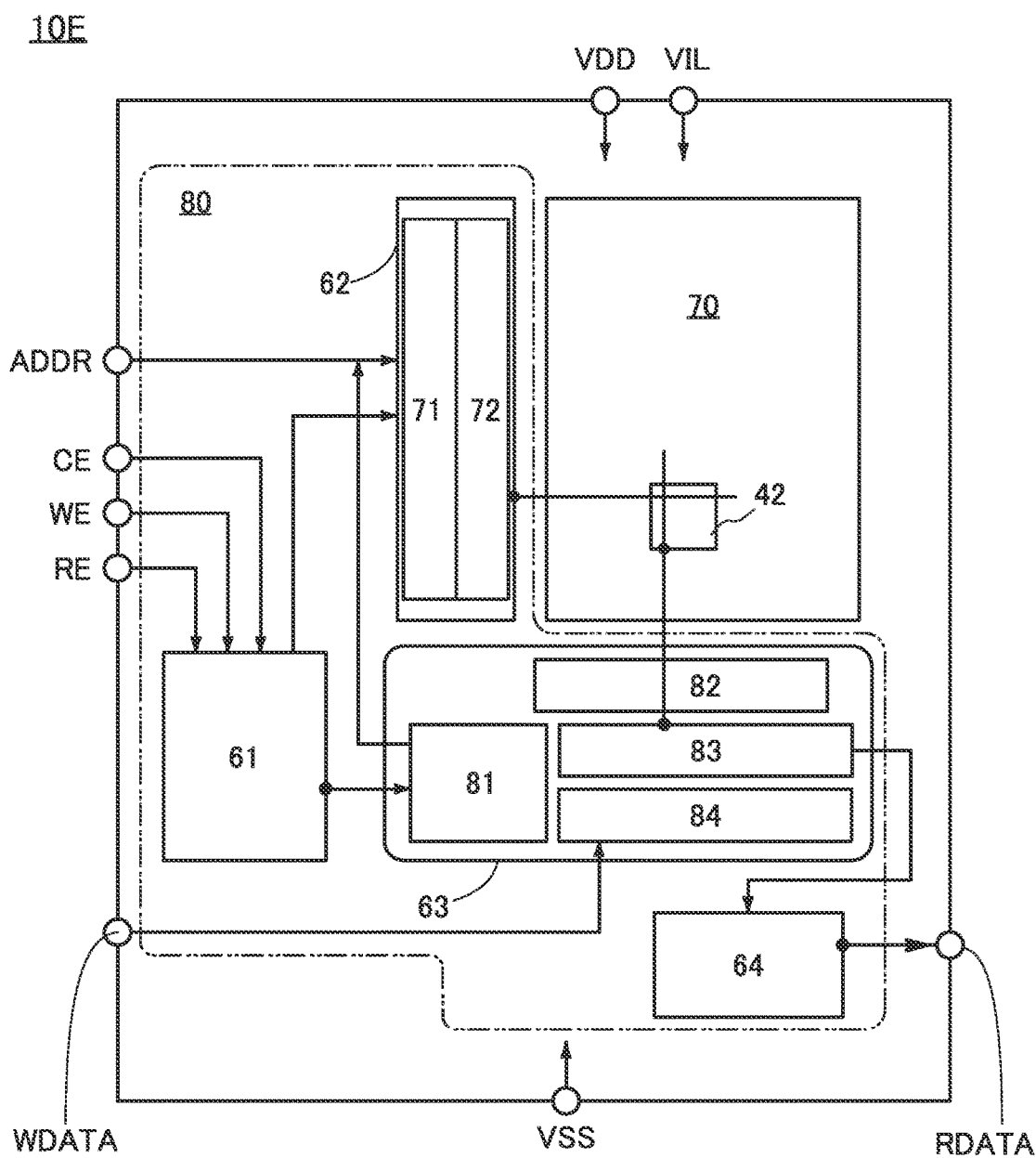
FIG. 29 is a block diagram illustrating a structure example of a semiconductor device.

FIG. 29 is a block diagram showing a structure example of a semiconductor device functioning as a memory device.

A memory device 10E includes a peripheral circuit 80 and a memory cell array 70. The peripheral circuit 80 includes the control logic circuit 61, the row driver circuit 62, the column driver circuit 63, and the output circuit 64.

The memory cell array 70 includes a plurality of memory cells 42. The row driver circuit 62 includes a row decoder 71 and a word line driver circuit 72. The column driver circuit 63 includes a column decoder 81, a precharge circuit 82, an amplifier circuit 83, and a write circuit 84. The precharge circuit 82 has a function of precharging the global bit line GBL, the local bit line LBL, or the like. The amplifier circuit 83 has a function of amplifying a data signal read from the global bit line GBL or the local bit line LBL. The amplified data signal is output to the outside of the semiconductor device 10E as a digital data signal RDATA through the output circuit 64.

As power supply voltages from the outside, a low power supply voltage (VSS), a high power supply voltage (VDD) for the peripheral circuit 80, and a high power supply voltage (VIL) for the memory cell array 70 are supplied to the semiconductor device 10E.

Control signals (CE, WE, and RE), an address signal ADDR, and a data signal WDATA are also input to the semiconductor device 10E from the outside. The address signal ADDR is input to the row decoder 71 and the column decoder 81, and WDATA is input to the write circuit 84.

The control logic circuit 61 processes the signals (CE, WE, and RE) input from the outside, and generates control signals for the row decoder 71 and the column decoder 81. CE is a chip enable signal, WE is a write enable signal, and RE is a read enable signal. The signals processed by the control logic circuit 61 are not limited thereto, and other control signals may be input as necessary. For example, a control signal for determining a defective bit may be input so that a defective bit may be identified with a data signal read from an address of a particular memory cell.

Note that whether each circuit or each signal described above is provided or not can be appropriately determined as needed.

Figure 30:
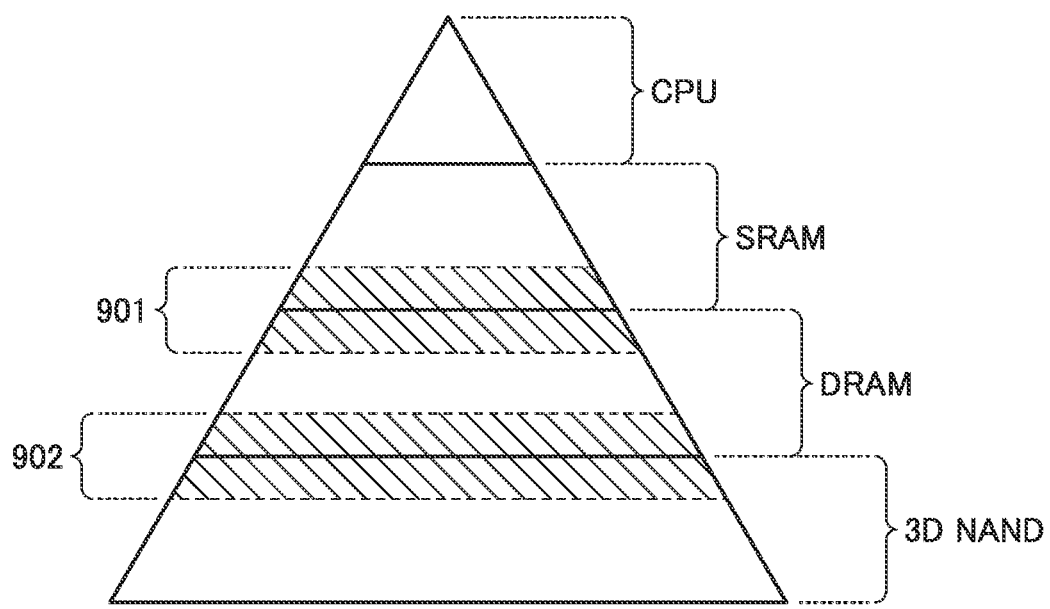
FIG. 30 is a conceptual view illustrating a structure example of a semiconductor device.

In general, a variety of memory devices (memory) are used in semiconductor devices such as a computer in accordance with the intended use. FIG. 30 shows a hierarchy of memory devices. The memory devices at the upper levels of the diagram require high access speeds, and the memory devices at the lower levels require large memory capacity and high record density. In FIG. 30, sequentially from the top level, a memory included as a register in an arithmetic processing device such as a CPU, an SRAM (Static Random Access Memory), a DRAM (Dynamic Random Access Memory), and a 3D NAND memory are shown.

A memory implemented as a register in an arithmetic processing device such as a CPU is used for temporary storage of arithmetic operation results, for example, and thus is very frequently accessed by the arithmetic processing device. Accordingly, rapid operation is more important than the memory capacity of the memory. The register also has a function of retaining setting information of the arithmetic processing device, for example.

An SRAM is used for a cache, for example. The cache has a function of retaining a copy of part of data retained in a main memory. By copying data which is frequently used and holding the copy of the data in the cache, the access speed to the data can be increased.

A DRAM is used for the main memory, for example. The main memory has a function of retaining a program or data which are read from a storage. The record density of a DRAM is approximately 0.1 to 0.3 $Gbit/mm^2$.

A 3D NAND memory is used for a storage, for example. The storage has a function of retaining data that needs to be retained for a long time and programs used in an arithmetic processing device, for example. Therefore, the storage needs to have a high memory capacity and a high record density rather than operating speed. The record density of a memory device used for a storage is approximately 0.6 to 6.0 $Gbit/mm^2$.

The semiconductor device functioning as the memory device of one embodiment of the present invention operates fast and can retain data for a long time. The semiconductor device of one embodiment of the present invention can be favorably used as a semiconductor device positioned in a boundary region 901 including both the level in which a cache is positioned and a level in which a main memory is positioned. The semiconductor device of one embodiment of the present invention can be favorably used as a semiconductor device positioned in a boundary region 902 including both the level in which a main memory is positioned and the level in which a storage is positioned.

Embodiment 5

In this embodiment, examples of electronic components and electronic devices in which the semiconductor device or the like described in the above embodiment is incorporated will be described.

<Electronic Component>

First, examples of electronic components in which the semiconductor device 10 or the like is incorporated will be described with reference to FIG. 31A and FIG. 31B.

Figure 31A:
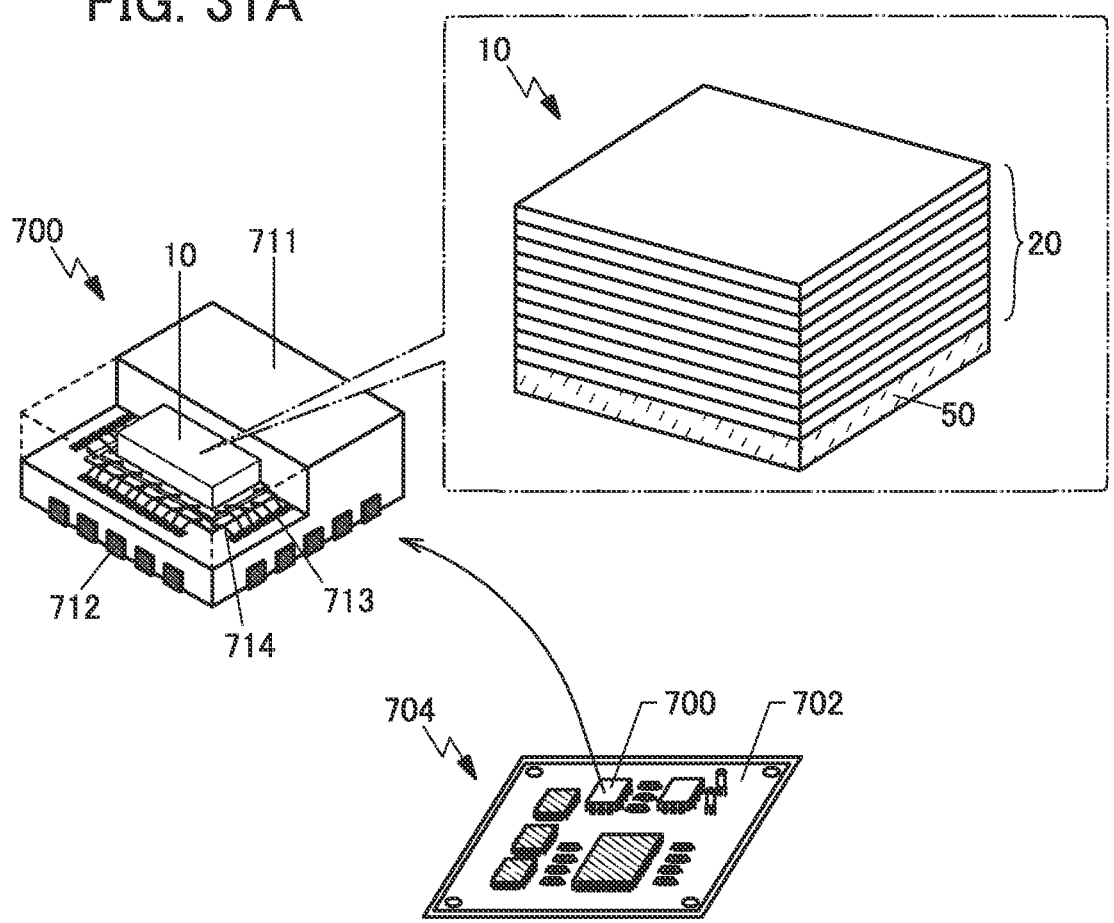
FIG. 31A and FIG. 31B are schematic diagrams each illustrating an example of an electronic device.

FIG. 31A is a perspective view of an electronic component 700 and a substrate (circuit board 704) on which the electronic component 700 is mounted. The electronic component 700 illustrated in FIG. 31A includes the semiconductor device 10 in which the element layer 20 is stacked over the silicon substrate 50 in a mold 711. FIG. 31A omits part of the electronic component to show the inside of the electronic component 700. The electronic component 700 includes a land 712 outside the mold 711. The land 712 is electrically connected to an electrode pad 713, and the electrode pad 713 is electrically connected to the semiconductor device 10 via a wire 714. The electronic component 700 is mounted on a printed circuit board 702, for example. A plurality of such electronic components are combined and electrically connected to each other on the printed circuit board 702, which forms the circuit substrate 704.

Figure 31B:
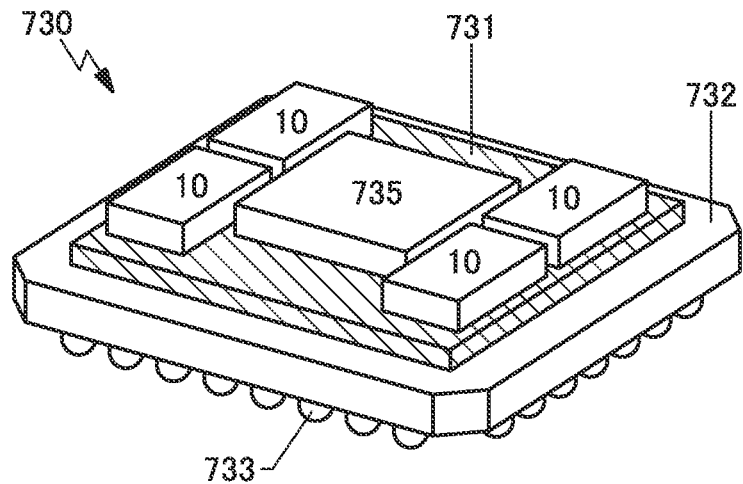

FIG. 31B is a perspective view of an electronic component 730. The electronic component 730 is an example of an SiP (System in package) or a MCM (Multi Chip Module). In the electronic component 730, an interposer 731 is provided on a package substrate 732 (a printed circuit board), and a semiconductor device 735 and a plurality of semiconductor devices 10 are provided on the interposer 731.

The electronic component 730 using the semiconductor devices 10 as HBM (High Bandwidth Memory) is illustrated as an example. An integrated circuit (a semiconductor device) such as a CPU, a GPU, or an FPGA can be used as the semiconductor device 735.

As the package substrate 732, a ceramic substrate, a plastic substrate, a glass epoxy substrate, or the like can be used. As the interposer 731, a silicon interposer, a resin interposer, or the like can be used.

The interposer 731 includes a plurality of wirings and has a function of electrically connecting a plurality of integrated circuits with different terminal pitches. The plurality of wirings have a single-layer structure or a layered structure.

The interposer 731 has a function of electrically connecting an integrated circuit provided on the interposer 731 to an electrode provided on the package substrate 732. Accordingly, the interposer is sometimes referred to as a redistribution substrate or an intermediate substrate. A through electrode may be provided in the interposer 731 to be used for electrically connecting the integrated circuit and the package substrate 732. In the case of using a silicon interposer, a TSV (Through Silicon Via) can also be used as the through electrode.

A silicon interposer is preferably used as the interposer 731. The silicon interposer can be manufactured at lower cost than an integrated circuit because the silicon interposer is not necessarily provided with an active element. Moreover, since wirings of the silicon interposer can be formed through a semiconductor process, the formation of minute wirings, which is difficult for a resin interposer, is easily achieved.

An HBM needs to be connected to many wirings to achieve a wide memory bandwidth. Therefore, an interposer on which an HBM is mounted requires minute and densely formed wirings. For this reason, a silicon interposer is preferably used as the interposer on which an HBM is mounted.

In an SiP, an MCM, or the like using a silicon interposer, a decrease in reliability due to a difference in expansion coefficient between an integrated circuit and the interposer is less likely to occur. Furthermore, a surface of a silicon interposer has high planarity, and a poor connection between the silicon interposer and an integrated circuit provided thereon less likely occurs. It is particularly preferable to use a silicon interposer for a 2.5D package (2.5D mounting) in which a plurality of integrated circuits are arranged side by side on the interposer.

A heat sink (radiator plate) may be provided to overlap with the electronic component 730. In this case, the heights of integrated circuits provided on the interposer 731 are preferably equal to each other. For example, in the electronic component 730 described in this embodiment, the heights of the semiconductor devices 10 and the semiconductor device 735 are preferably equal to each other.

An electrode 733 may be provided on the bottom portion of the package substrate 732 to mount the electronic component 730 on another substrate. FIG. 31B shows an example in which the electrode 733 is formed of a solder ball. Solder balls are provided in a matrix on the bottom portion of the package substrate 732, whereby a BGA (Ball Grid Array) can be achieved. Alternatively, the electrode 733 may be formed of a conductive pin. When conductive pins are provided in a matrix on the bottom portion of the package substrate 732, a PGA (Pin Grid Array) can be achieved.

The electronic component 730 can be mounted on another substrate in various manners, not limited to the BGA and the PGA. For example, a SPGA (Staggered Pin Grid Array), a LGA (Land Grid Array), a QFP (Quad Flat Package), a QFJ (Quad Flat J-leaded package), or a QFN (Quad Flat Non-leaded package) can be employed.

<Electronic Device>

Figure 32:
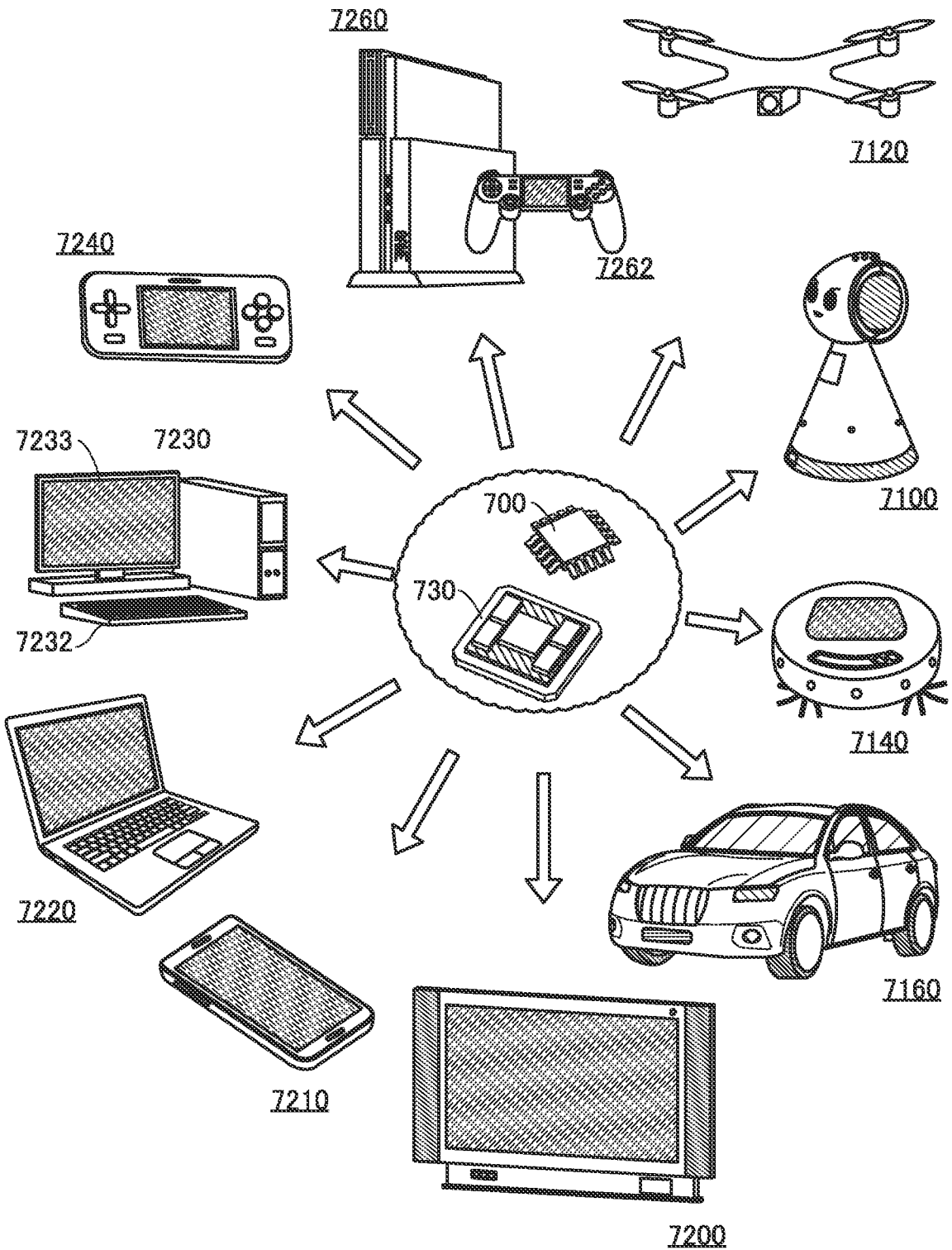
FIG. 32 is a diagram illustrating examples of electronic devices.

Next, examples of electronic devices including the above electronic component will be described with reference to FIG. 32.

A robot 7100 includes an illuminance sensor, a microphone, a camera, a speaker, a display, various kinds of sensors (e.g., an infrared ray sensor, an ultrasonic wave sensor, an acceleration sensor, a piezoelectric sensor, an optical sensor, and a gyro sensor), a moving mechanism, and the like. The electronic component 730 includes a processor or the like and has a function of controlling these peripheral devices. For example, the electronic component 700 has a function of storing data obtained by the sensors.

The microphone has a function of detecting acoustic signals of a speaking voice of a user, an environmental sound, and the like. The speaker has a function of outputting audio signals such as a voice and a warning beep. The robot 7100 can analyze an audio signal input via the microphone and can output a necessary audio signal from the speaker. The robot 7100 can communicate with the user with use of the microphone and the speaker.

The camera has a function of taking images of the surroundings of the robot 7100. The robot 7100 has a function of moving with use of the moving mechanism. The robot 7100 can take images of the surroundings with use of the camera and analyze the images to sense whether there is an obstacle in the way of the movement.

A flying object 7120 includes propellers, a camera, a battery, and the like and has a function of flying autonomously. The electronic component 730 has a function of controlling these peripheral devices.

For example, image data taken by the camera is stored in the electronic component 700. The electronic component 730 can analyze the image data to sense whether there is an obstacle in the way of the movement. Moreover, the electronic component 730 can estimate the remaining battery level from a change in the power storage capacity of the battery.

A cleaning robot 7140 includes a display provided on the top surface, a plurality of cameras provided on the side surface, a brush, an operation button, various kinds of sensors, and the like. Although not illustrated, a cleaning robot 7300 is provided with a tire, an inlet, and the like. The cleaning robot 7300 can run autonomously, detect dust, and vacuum the dust through the inlet provided on a bottom surface.

For example, the electronic component 730 can analyze images taken by the cameras to judge whether there is an obstacle such as a wall, furniture, or a step. In the case where an object that is likely to be caught in the brush, such as a wire, is detected by image analysis, the rotation of the brush can be stopped.

An automobile 7160 includes an engine, tires, a brake, a steering gear, a camera, and the like. For example, the electronic component 730 performs control for optimizing the running state of the automobile 7160 on the basis of navigation information, the speed, the state of the engine, the gearshift state, the use frequency of the brake, and other data. For example, image data taken by the camera is stored in the electronic component 700.

The electronic component 700 and/or the electronic component 730 can be incorporated in a TV device 7200 (a television receiver), a smartphone 7210, PCs (personal computers) 7220 and 7230, a game machine 7240, a game machine 7260, and the like.

For example, the electronic component 730 incorporated in the TV device 7200 can function as an image processing engine. The electronic component 730 performs, for example, image processing such as noise removal and resolution up-conversion.

The smartphone 7210 is an example of a portable information terminal. The smartphone 7210 includes a microphone, a camera, a speaker, various kinds of sensors, and a display portion. These peripheral devices are controlled by the electronic component 730.

The PC 7220 and the PC 7230 are examples of a laptop PC and a desktop PC. To the PC 7230, a keyboard 7232 and a monitor device 7233 can be connected with or without a wire. The game machine 7240 is an example of a portable game machine. The game machine 7260 is an example of a stationary game machine. To the game machine 7260, a controller 7262 is connected with or without a wire. The electronic component 700 and/or the electronic component 730 can be incorporated in the controller 7262.

This embodiment can be implemented in combination with any of the structures described in the other embodiments and the like, as appropriate.

(Notes on Description of this Specification and the Like)

The description of the above embodiments and each structure in the embodiments are noted below.

One embodiment of the present invention can be constituted by combining, as appropriate, the structure described in each embodiment with any of the structures described in the other embodiments or Example. In addition, in the case where a plurality of structure examples are described in one embodiment, the structure examples can be combined as appropriate.

Note that content (or may be part of the content) described in one embodiment can be applied to, combined with, or replaced with another content (or may be part of the content) described in the embodiment and/or content (or may be part of the content) described in another embodiment or other embodiments.

Note that in each embodiment, content described in the embodiment is content described using a variety of drawings or content described with text disclosed in the specification.

Note that by combining a drawing (or may be part thereof) described in one embodiment with another part of the diagram, a different diagram (or may be part thereof) described in the embodiment, and/or a drawing (or may be part thereof) described in another embodiment or other embodiments, much more drawings can be formed.

In addition, in this specification and the like, components are classified on the basis of the functions, and shown as blocks independent of one another in block diagrams. However, in an actual circuit or the like, it is difficult to separate components on the basis of the functions, and there are such a case where one circuit is associated with a plurality of functions and a case where a plurality of circuits are associated with one function. Therefore, blocks in the block diagrams are not limited by the components described in the specification, and the description can be changed appropriately depending on the situation.

Furthermore, in the drawings, the size, the layer thickness, or the region is shown with given magnitude for description convenience. Therefore, they are not limited to the illustrated scale. Note that the drawings are schematically shown for clarity, and embodiments of the present invention are not limited to shapes, values or the like shown in the drawings. For example, fluctuation in signal, voltage, or current due to noise, fluctuation in signal, voltage, or current due to difference in timing, or the like can be included.

Furthermore, the positional relation between components illustrated in the drawings and the like is relative. Therefore, when the components are described with reference to drawings, terms for describing the positional relation, such as "over" and "under", may be used for convenience. The positional relation of the components is not limited to that described in this specification and can be explained with other terms as appropriate depending on the situation.

In this specification and the like, expressions "one of a source and a drain" (or a first electrode or a first terminal) and "the other of the source and the drain" (or a second electrode or a second terminal) are used in the description of the connection relationship of a transistor. This is because the source and the drain of the transistor change depending on the structure, operating conditions, or the like of the transistor. Note that the source or the drain of the transistor can also be referred to as a source (drain) terminal, a source (drain) electrode, or the like as appropriate depending on the situation.

In addition, in this specification and the like, the terms "electrode" and "wiring" do not functionally limit these components. For example, an "electrode" is used as part of a "wiring" in some cases, and vice versa. Furthermore, the term "electrode" or "wiring" also includes the case where a plurality of "electrodes" or "wirings" are formed in an integrated manner, for example.

Furthermore, in this specification and the like, "voltage" and "potential" can be interchanged with each other as appropriate. The voltage refers to a potential difference from a reference potential, and when the reference potential is a ground voltage, for example, the voltage can be rephrased into the potential. The ground potential does not necessarily mean 0 V. Note that potentials are relative values, and a potential applied to a wiring or the like is sometimes changed depending on the reference potential.

In this specification and the like, a node can be referred to as a terminal, a wiring, an electrode, a conductive layer, a conductor, an impurity region, or the like depending on the circuit structure, the device structure, or the like. Furthermore, a terminal, a wiring, or the like can be referred to as a node.

In this specification and the like, the expression "A and B are connected" means the case where A and B are electrically connected. Here, the expression "A and B are electrically connected" means connection that enables electric signal transmission between A and B in the case where an object (that refers to an element such as a switch, a transistor element, or a diode, a circuit including the element and a wiring, or the like) exists between A and B. Note that the case where A and B are electrically connected includes the case where A and B are directly connected. Here, the expression "A and B are directly connected" means connection that enables electric signal transmission between A and B through a wiring (or an electrode) or the like, not through the above object. In other words, direct connection refers to connection that can be regarded as the same circuit diagram when indicated as an equivalent circuit.

In this specification and the like, a switch has a function of controlling whether current flows or not by being in a conduction state (an on state) or a non-conduction state (an off state). Alternatively, a switch has a function of selecting and changing a current path.

In this specification and the like, channel length refers to, for example, the distance between a source and a drain in a region where a semiconductor (or a portion where current flows in a semiconductor when a transistor is in an on state) and a gate overlap with each other or a region where a channel is formed in a top view of the transistor.

In this specification and the like, channel width refers to, for example, the length of a portion where a source and a drain face each other in a region where a semiconductor (or a portion where current flows in a semiconductor when a transistor is in an on state) and a gate electrode overlap with each other or a region where a channel is formed.

Note that in this specification and the like, the terms such as "film" and "layer" can be interchanged with each other depending on the case or according to circumstances. For example, the term "conductive layer" can be changed into the term "conductive film" in some cases. As another example, the term "insulating film" can be changed into the term "insulating layer" in some cases.

REFERENCE NUMERALS

:BL2: wiring, SL2: wiring, SW0: signal, SW1: signal, SW2: signal, T11: Time, T12: Time, T13: Time, T14: Time, T15: Time, T16: Time, T17: Time, T18: Time, T19: Time, 10: semiconductor device, 10A: semiconductor device, 10B: semiconductor device, 10C: semiconductor device, 10E: semiconductor device, 20: element layer, 20_M: element layer, 20_1: element layer, 30: transistor layer, 30A: transistor layer, 30B: transistor layer, 31: transistor, 32: transistor, 33: transistor, 34: transistor, 35: correction circuit, 36: circuit, 36_pre: circuit, 40: transistor layer, 41_k: transistor layer, 41_1: transistor layer, 41_2: transistor layer, 42: memory cell, 43: transistor, 44: capacitor, 49: transistor layer, 49_k: transistor layer, 49_1: transistor layer, 50: silicon substrate, 51: control circuit, 52: switch circuit, 52_1: transistor, 52_2: transistor, 53: precharge circuit, 53_1: transistor, 53_3: transistor, 54: precharge circuit, 54_1: transistor, 54_3: transistor, 55: sense amplifier, 55_1: transistor, 55_2: transistor, 55_3: transistor, 55_4: transistor, 61: control logic circuit, 62: row driver circuit, 63: column driver circuit, 64: output circuit, 70: memory cell array, 71: row decoder, 72: word line driver circuit, 80: peripheral circuit, 81: column decoder, 82: precharge circuit, 83: amplifier circuit, 84: circuit, 90: transistor layer, 91: memory cell, 92: transistor, 93: transistor, 94: capacitor, 97: transistor, 98: transistor, 99: transistor, 100: memory device, 110: period, 111: operation, 112: operation, 113: operation, 114: operation, 115: operation, 120: period, 120_1: period, 120_2: period, 121: operation, 121A: operation, 122: operation, 123: operation, 123A: operation, 124: operation, 125: operation, 125A: operation, 130: period, 131: operation, 132: operation, 133: operation, 134: operation, 135: operation, 140: period, 141: operation, 142: operation, 144: capacitor, 200: transistor, 200M: transistor, 200T: transistor, 205: conductor, 205a: conductor, 205b: conductor, 211: insulator, 212: insulator, 214: insulator, 216: insulator, 222: insulator, 224: insulator, 230: oxide, 230a: oxide, 230b: oxide, 230c: oxide, 240: conductor, 240a: conductor, 240b: conductor, 241: insulator, 241a: insulator, 241b: insulator, 242: conductor, 242a: conductor, 242b: conductor, 243: oxide, 243a: oxide, 243b: oxide, 246: conductor, 246a: conductor, 246b: conductor, 250: insulator, 260: conductor, 260a: conductor, 260b: conductor, 272: insulator, 273: insulator, 274: insulator, 275: insulator, 276: conductor, 277: insulator, 278: conductor, 279: insulator, 280: insulator, 282: insulator, 283: insulator, 284: insulator, 287: insulator, 290: conductor, 292: capacitive element, 292A: capacitive element, 292B: capacitive element, 294: conductor, 295: insulator, 296: insulator, 297: conductor, 298: insulator, 299: conductor, 300: transistor, 311: semiconductor substrate, 313: semiconductor region, 314a: low-resistance region, 314b: low-resistance region, 315: insulator, 316: conductor, 411: element layer, 413: transistor layer, 413_m: transistor layer, 413_1: transistor layer, 415: memory device layer, 415_n: memory device layer, 415_p: memory device layer, 415_p-1: memory device layer, 415_1: memory device layer, 415_3: memory device layer, 415_4: memory device layer, 420: memory device, 420A: memory device, 420B: memory device, 422: region, 424: conductor, 426: conductor, 428: conductor, 430: conductor, 432: memory cell, 433: memory cell, 434: memory cell, 435: memory cell, 470: memory unit, 470_m: memory unit, 470_1: memory unit, 700: electronic component, 702: printed circuit board, 704: circuit substrate, 711: mold, 712: land, 713: electrode pad, 714: wire, 730: electronic component, 731: interposer, 732: package substrate, 733: electrode, 735: semiconductor device, 820: peripheral circuit, 901: boundary region, 902: boundary region, 7100: robot, 7120: flying object, 7140: cleaning robot, 7160: automobile, 7200: TV device, 7210: smartphone, 7220: PC, 7230: PC, 7232: keyboard, 7233: monitor device, 7240: game machine, 7260: game machine, 7262: controller, 7300: cleaning robot

The invention claimed is:

1. A semiconductor device comprising:
a driver circuit comprising a plurality of transistors using a silicon substrate for channels; and
a first transistor layer and a second transistor layer comprising a plurality of transistors using a metal oxide for channels,
wherein the first transistor layer and the second transistor layer are over the silicon substrate,
wherein the first transistor layer comprises a first memory cell comprising a first transistor and a first capacitor,
wherein the first transistor is electrically connected to a first local bit line,
wherein the second transistor layer comprises a second transistor whose gate is electrically connected to the first local bit line and a first correction circuit electrically connected to the second transistor,
wherein the first correction circuit is electrically connected to a first global bit line, and
wherein the first correction circuit is configured to hold a voltage corresponding to a threshold voltage of the second transistor in the gate of the second transistor.

2. The semiconductor device according to claim 1, wherein an arrangement angle between a direction of the first local bit line and a plane direction of the silicon substrate is greater than or equal to 85° and less than or equal to 95°.

3. The semiconductor device according to claim 1, wherein the first global bit line is configured to electrically connect the first correction circuit and the driver circuit.

4. The semiconductor device according to claim 3, wherein an arrangement angle between a direction of the first global bit line and a plane direction of the silicon substrate is greater than or equal to 85° and less than or equal to 95°.

5. The semiconductor device according to claim 1, wherein the metal oxide comprises In, Ga, and Zn.

6. The semiconductor device according to claim 1,
wherein the first correction circuit comprises a third transistor to a fifth transistor,
wherein the third transistor is configured to control a conduction state between the gate of the second transistor and one of a source and a drain of the second transistor,
wherein the fourth transistor is configured to control a conduction state between the other of the source and the drain of the second transistor and a wiring supplied with a potential for making a current flow in the second transistor, and
wherein the fifth transistor is configured to control a conduction state between the one of the source and the drain of the second transistor and the first global bit line.

7. The semiconductor device according to claim 6, wherein the first transistor is set into a non-conduction state during a period in which correction operation is performed.

8. The semiconductor device according to claim 1, further comprising a second memory cell, a second local bit line, a second correction circuit, a second global bit line, a fifth transistor, a sixth transistor, and a seventh transistor,
- wherein the driver circuit comprises a sense amplifier electrically connected to a first bit line and a second bit line which are configured to be a bit line pair,
- wherein the second memory cell is electrically connected to the second local bit line,
- wherein the second local bit line is electrically connected to the second correction circuit,
- wherein the second correction circuit is electrically connected to the second global bit line,
- wherein the fifth transistor is configured to control a conduction state between the first bit line and the first global bit line,
- wherein the sixth transistor is configured to control a conduction state between the second bit line and the second global bit line, and
- wherein the seventh transistor is configured to control a conduction state between the first global bit line and the second global bit line.

9. The semiconductor device according to claim 8, wherein the fifth transistor to the seventh transistor are each a transistor using a metal oxide in a channel.

10. A semiconductor device comprising:
- a driver circuit comprising a plurality of transistors using a silicon substrate for channels; and
- an element layer provided by stacking a plurality of transistor layers,
- wherein the element layer comprises a first transistor layer and a second transistor layer comprising a plurality of transistors using a metal oxide for channels,
- wherein the first transistor layer and the second transistor layer are over the silicon substrate,
- wherein the first transistor layer comprises a first memory cell comprising a first transistor and a first capacitor,
- wherein the first transistor is electrically connected to a first local bit line,
- wherein the second transistor layer comprises a second transistor whose gate is electrically connected to the first local bit line and a first correction circuit electrically connected to the second transistor,
- wherein the first correction circuit is electrically connected to a first global bit line, and
- wherein the first correction circuit is configured to hold a voltage corresponding to a threshold voltage of the second transistor in the gate of the second transistor.

11. The semiconductor device according to claim 10, wherein an arrangement angle between a direction of the first local bit line and a plane direction of the silicon substrate is greater than or equal to 85° and less than or equal to 95°.

12. The semiconductor device according to claim 10, wherein the first global bit line is configured to electrically connect the first correction circuit and the driver circuit.

13. The semiconductor device according to claim 12, wherein an arrangement angle between a direction of the first global bit line and a plane direction of the silicon substrate is greater than or equal to 85° and less than or equal to 95°.

14. The semiconductor device according to claim 10, wherein the metal oxide comprises In, Ga, and Zn.

15. The semiconductor device according to claim 10,
- wherein the first correction circuit comprises a third transistor to a fifth transistor,
- wherein the third transistor is configured to control a conduction state between the gate of the second transistor and one of a source and a drain of the second transistor,
- wherein the fourth transistor is configured to control a conduction state between the other of the source and the drain of the second transistor and a wiring supplied with a potential for making a current flow in the second transistor, and
- wherein the fifth transistor is configured to control a conduction state between the one of the source and the drain of the second transistor and the first global bit line.

16. The semiconductor device according to claim 15, wherein the first transistor is set into a non-conduction state during a period in which correction operation is performed.

17. The semiconductor device according to claim 10, further comprising a second memory cell, a second local bit line, a second correction circuit, a second global bit line, a fifth transistor, a sixth transistor, and a seventh transistor,
- wherein the driver circuit comprises a sense amplifier electrically connected to a first bit line and a second bit line which are configured to be a bit line pair,
- wherein the second memory cell is electrically connected to the second local bit line,
- wherein the second local bit line is electrically connected to the second correction circuit,
- wherein the second correction circuit is electrically connected to the second global bit line,
- wherein the fifth transistor is configured to control a conduction state between the first bit line and the first global bit line,
- wherein the sixth transistor is configured to control a conduction state between the second bit line and the second global bit line, and
- wherein the seventh transistor is configured to control a conduction state between the first global bit line and the second global bit line.

18. The semiconductor device according to claim 17, wherein the fifth transistor to the seventh transistor are each a transistor using a metal oxide in a channel.

* * * * *